United States Patent
Jain et al.

(10) Patent No.: US 11,929,110 B2
(45) Date of Patent: Mar. 12, 2024

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Sanjeev Kumar Jain, Hsinchu (TW); Ishan Khera, Hsinchu (TW); Atul Katoch, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 81 days.

(21) Appl. No.: 17/746,124

(22) Filed: May 17, 2022

(65) Prior Publication Data

US 2023/0170010 A1    Jun. 1, 2023

Related U.S. Application Data

(60) Provisional application No. 63/283,408, filed on Nov. 26, 2021.

(51) Int. Cl.
   *G11C 11/00* (2006.01)
   *G11C 11/4076* (2006.01)
   (Continued)

(52) U.S. Cl.
   CPC ...... *G11C 11/4087* (2013.01); *G11C 11/4076* (2013.01); *G11C 11/4085* (2013.01); *G11C 11/4093* (2013.01); *H03K 19/20* (2013.01)

(58) Field of Classification Search
   CPC ..... G11C 11/419; G11C 11/418; G11C 5/063; G11C 7/227; G11C 5/025; G11C 7/18; G11C 7/12; G11C 7/222; G11C 8/08; G11C 11/4076; G11C 11/4085; G11C 11/4087; G11C 11/417; G11C 8/10; G11C 8/18; G11C 11/4093; G11C 2207/2227; G11C 5/148; G11C 7/08; G11C 7/1042;
   (Continued)

(56) References Cited

U.S. PATENT DOCUMENTS

| | | | |
|---|---|---|---|
| 5,341,341 A | 8/1994 | Fukuzo | |
| 7,826,301 B2 | 11/2010 | Dudeck et al. | |
| 9,418,717 B2 * | 8/2016 | Hsu | ........ G11C 11/419 |

FOREIGN PATENT DOCUMENTS

| | | |
|---|---|---|
| EP | 562605 | 9/1993 |
| TW | 201110139 | 3/2011 |

* cited by examiner

*Primary Examiner* — Thong Q Le
(74) *Attorney, Agent, or Firm* — Hauptman Ham, LLP

(57) ABSTRACT

A memory circuit includes a global control circuit, a first local control circuit, and a first set of word line post-decoder circuits coupled to a first set of memory cells that is configured to store a first set of data. The global control circuit is configured to generate a first and second set of global pre-decoder signals, and a first set of local address signals. The first local control circuit includes a first set of repeater circuits and a first clock pre-decoder circuit. The first set of repeater circuits is configured to generate a first and second set of local pre-decoder signals in response to the corresponding first and second set of global pre-decoder signals. The first clock pre-decoder circuit is configured to generate a first and second set of clock signals in response to the first set of local address signals and the first clock signal.

20 Claims, 16 Drawing Sheets

(51) Int. Cl.
*G11C 11/408* (2006.01)
*G11C 11/4093* (2006.01)
*H03K 19/20* (2006.01)

(58) Field of Classification Search
CPC .... G11C 7/22; G11C 8/04; G11C 8/14; G11C 2207/005; G11C 2207/2254; G11C 7/06; G11C 8/16; G11C 16/24; G11C 8/12; H03K 19/20; H01L 21/768; H01L 21/8234; H01L 23/528
See application file for complete search history.

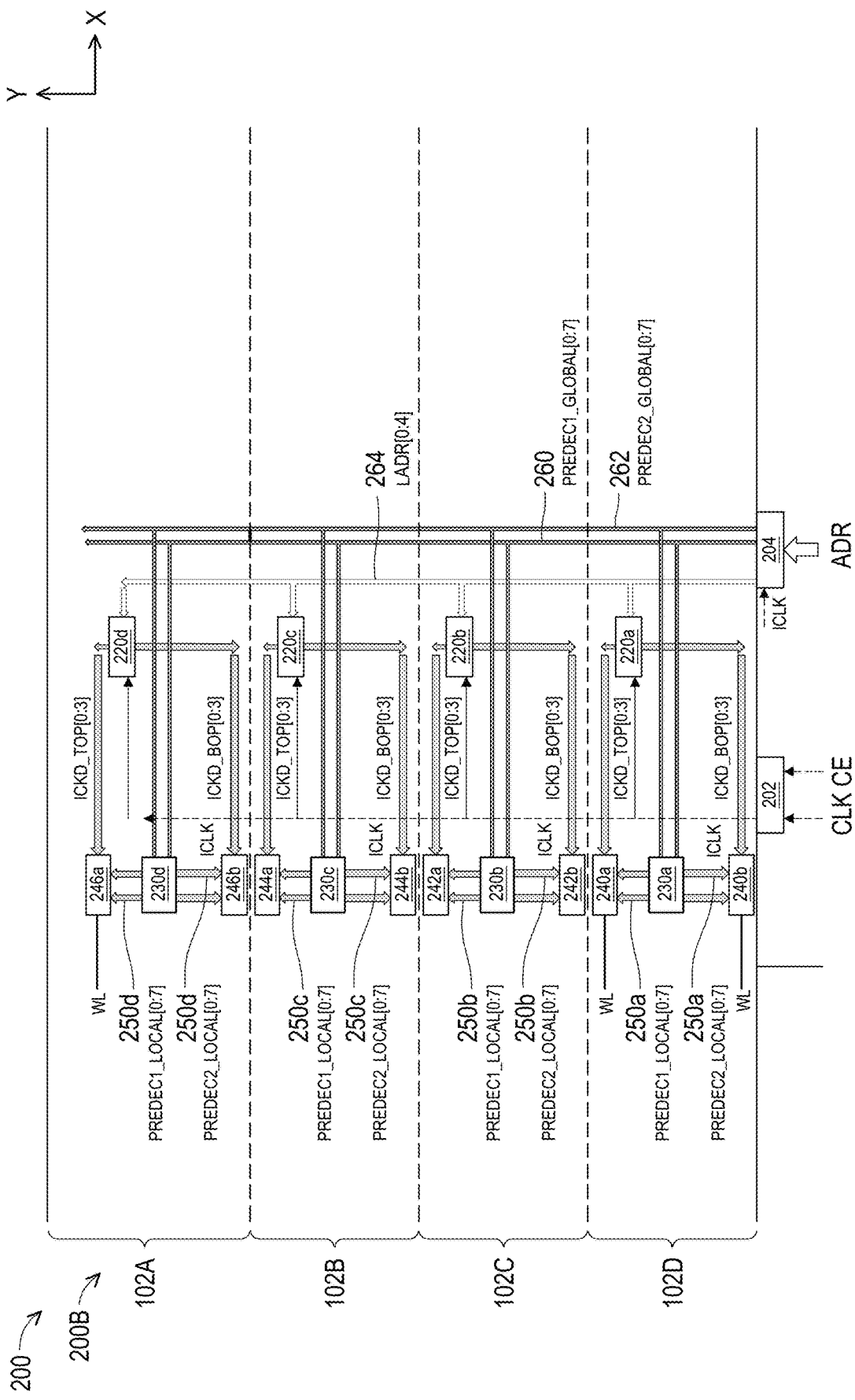

MEMORY CIRCUIT AND METHOD OF OPERATING SAME

PRIORITY CLAIM

This application claims the benefit of U.S. Provisional Application No. 63/283,408, filed Nov. 26, 2021, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a circuit diagram of a portion of the memory circuit of FIG. 2A, simplified for ease of illustration.

DETAILED DESCRIPTION

Figure 1:
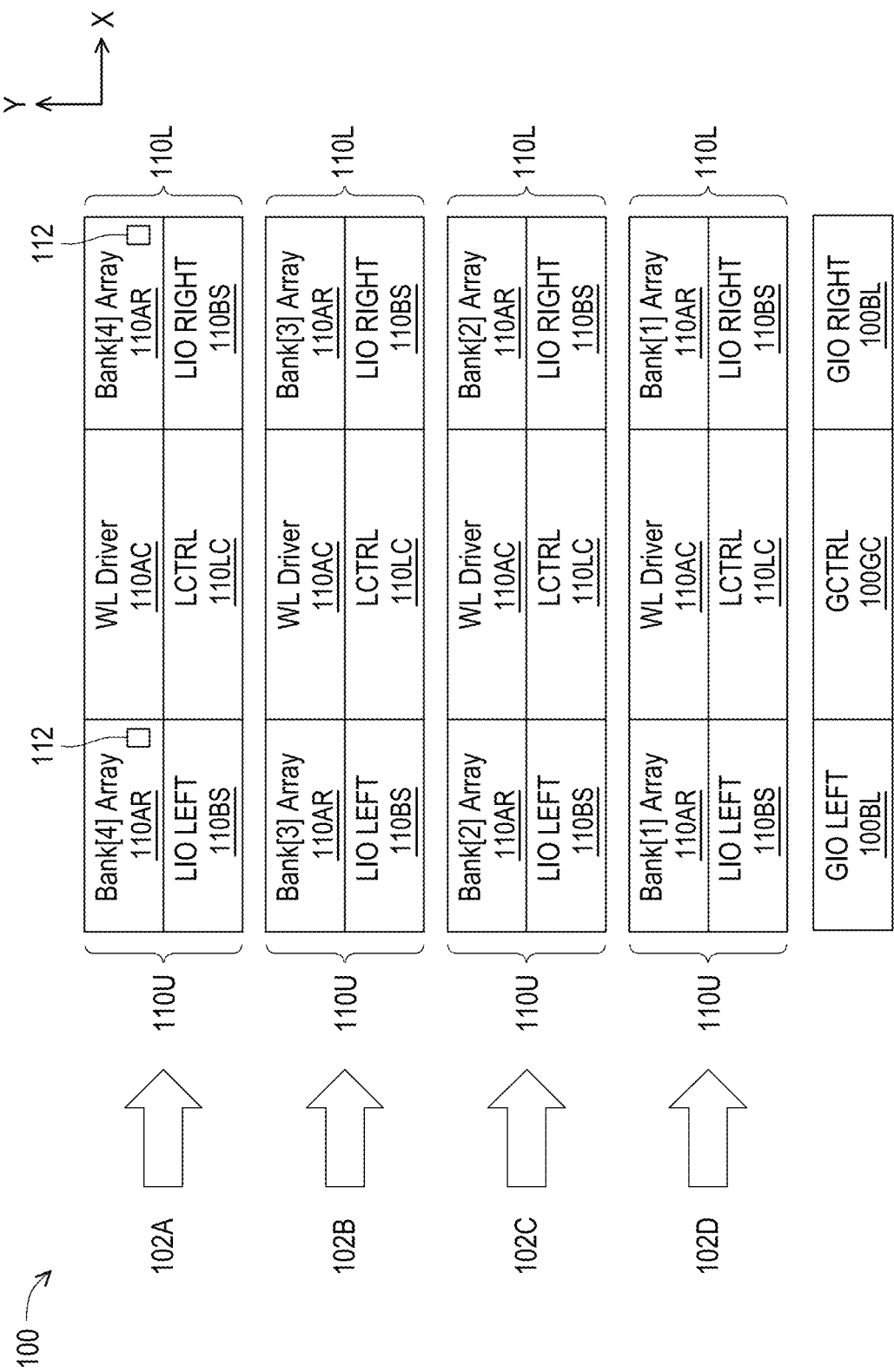
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a global control circuit configured to generate a first set of global pre-decoder signals, a second set of global pre-decoder signals and a first set of local address signals in response to a memory address signal and a first clock signal.

In some embodiments, the memory circuit further includes a first local control circuit coupled to the global control circuit. In some embodiments, the first local control circuit includes a first set of repeater circuits configured to generate a first set of local pre-decoder signals in response to the first set of global pre-decoder signals, and to generate a second set of local pre-decoder signals in response to the second set of global pre-decoder signals.

In some embodiments, by repeating or creating a local version of the first set of global pre-decoder signals or the second set of global pre-decoder signals thereby generating the corresponding first set of local pre-decoder signals or the second set of local pre-decoder signals, a driving strength of the first set of local pre-decoder signals or the second set of local pre-decoder signals from each of the set of repeater circuits is increased compared to other approaches, thereby resulting in timing improvements of an address setup time of the memory circuit of the present disclosure compared to other approaches.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged so as to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the embodiment depicted in FIG. 1, memory circuit 100 includes a total of four partitions. In some embodiments, memory circuit 100 includes a total number of partitions greater or fewer than four.

GIO circuit 100BL is a circuit configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is a circuit configured to control some or all of program and read operations on each memory partition 102A-102D, e.g., by generating and/or outputting one or more control and/or enable signals. In some embodiments, circuit 100F includes a clock generating/gating circuit (shown in FIG. 2A) and an address latch and pre-decoder circuit (shown in FIG. 2A).

Figure 2A:
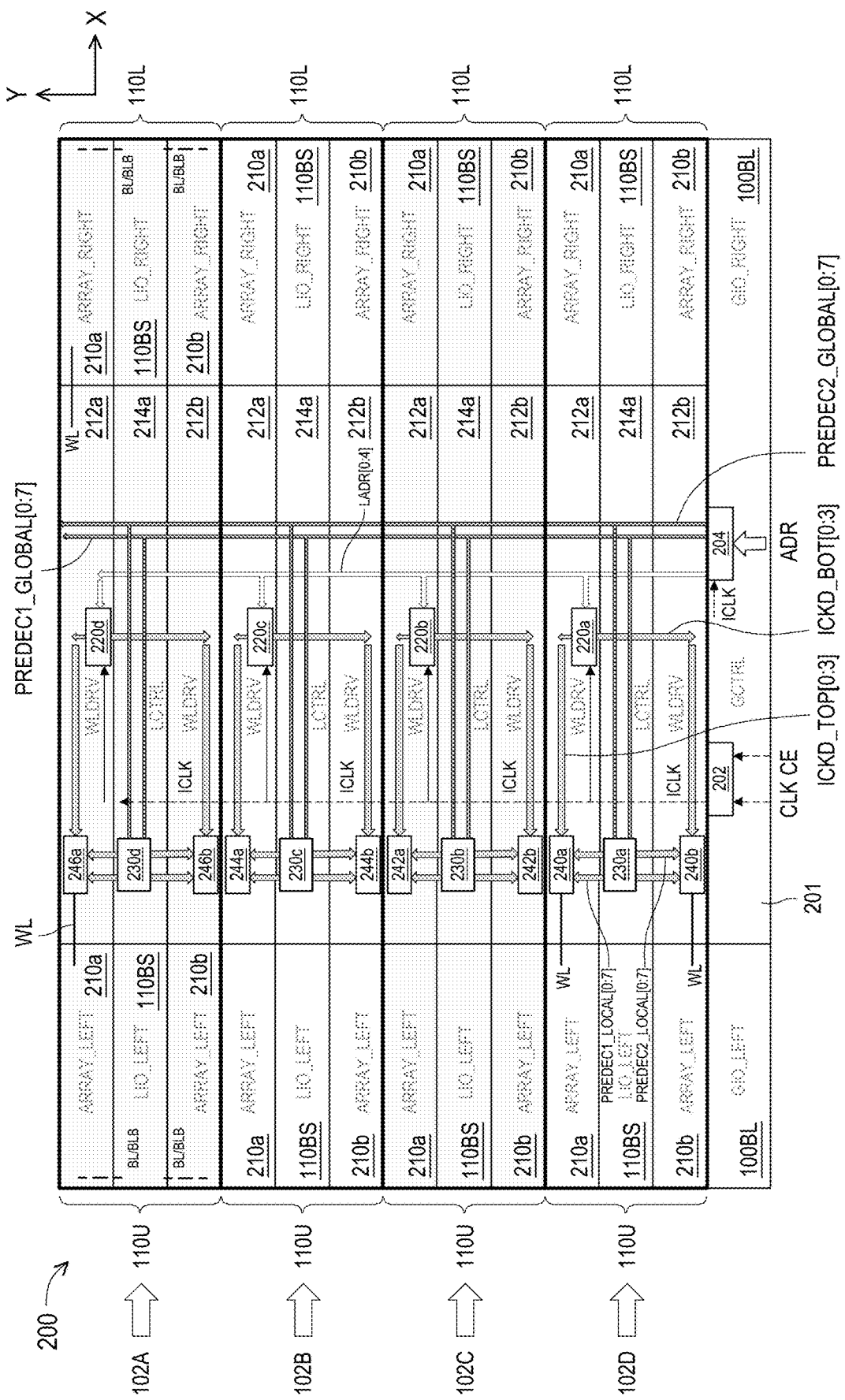
FIG. 2A is a circuit diagram of a memory circuit, in accordance with some embodiments.

In some embodiments, the clock generating/gating circuit is configured to generate an internal clock signal (e.g., ICLK in FIG. 2A) within memory circuit 100 in response to an external clock signal (e.g., CLK in FIG. 2A) and a chip enable signal (e.g., CE in FIG. 2A). In some embodiments, the address latch and pre-decoder circuit is configured to generate a set of address signals (e.g., LADR[0:10] in FIG. 2A), a first set of global pre-decoder signals PREDEC1_GLOBAL (shown in FIG. 2A) and a second set of global pre-decoder signals PREDEC2_GLOBAL (shown in FIG. 2A) in response to an address signal (e.g., memory address signal ADR in FIG. 2A).

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decode or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110DC includes a bank decoder circuit.

Each LIO circuit 110BS is configured to selectively access one or more bit lines (shown in FIG. 2A) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (shown in FIG. 2A).

Memory device 112 is shown in memory bank 110U and 110L of memory partition 102A. For ease of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

FIG. 2A is a circuit diagram of a memory circuit 200, in accordance with some embodiments.

FIG. 2B is a circuit diagram of a portion 200B of the memory circuit 200 of FIG. 2A, simplified for ease of illustration. For example, portion 200B of memory circuit 200 shows a clock gating circuit 202, an address latch and pre-decoder circuit 204, a set of clock pre-decoder circuits 220, a set of repeater circuits 230, a set of word line post-decoder circuits 240, 242, 244 and 246, conductive lines 260, 262 and 264, and a set of conductive lines 250 and 252.

Memory circuit 200 is an embodiment of memory circuit 100 of FIG. 1, and similar detailed description is therefore omitted. For example, WL driver circuits 212a and 212b of memory circuit 200 are an embodiment of word line driver circuit 110AC, and local control circuit 214a of memory circuit 200 is an embodiment of local control circuit 110LC.

Memory circuit 200 includes memory partitions 102A-102D, a global control circuit 201 and GIO circuits 100BL.

Each memory partition 102A-102D includes memory banks 110U and 110L adjacent to a WL driver circuit 212 and a local control circuit 214a. Each memory bank 110U and 110L includes a memory cell array 210 and a LIO circuit 110BS.

In comparison with memory circuit 100 of FIG. 1, global control circuit 201 is an embodiment of global control circuit 100GC, each memory cell array 210 is an embodiment of memory cell array 110AR, each local control circuit 214a is an embodiment of local control circuit 110LC, and each of WL driver circuit 212 is an embodiment of WL driver circuit 110AC, and similar detailed description is therefore omitted.

In comparison with each memory cell array 110AR of FIG. 1, each memory cell array 210 is divided into an upper region of memory cells 210a and a lower region of memory cells 210b, and similar detailed description is therefore omitted.

In comparison with each WL driver circuit 110AC of FIG. 1, each WL driver circuit 212 is divided into WL driver circuit 212a and WL driver circuit 212b, and similar detailed description is therefore omitted.

Global control circuit 201 includes clock gating circuit 202 and address latch and pre-decoder circuit 204.

The clock gating circuit 202 is configured to generate a clock signal ICLK in response to a clock signal CLK and a chip enable signal CE. In some embodiments, clock signal ICLK is referred to as "an internal clock signal" since clock signal ICLK is generated within or internal of memory circuit 200. In some embodiments, clock signal CLK is referred to as "an external clock signal" since clock signal CLK is generated outside of or external of memory circuit 200.

In some embodiments, if the chip enable signal CE is a logic "1", then the clock gating circuit 202 is enabled and configured to pass the clock signal CLK, and the clock signal ICLK is equal to the clock signal CLK. In some embodiments, if the chip enable signal CE is a logic "0", then the clock gating circuit 202 is disabled and configured to not pass the clock signal CLK, and the clock signal ICLK is equal to a logic "0". Other logic values for the chip enable signal CE of the clock gating circuit 202 are within the scope of the present disclosure.

The clock gating circuit 202 is coupled to clock pre-decoder circuits 220a, 220b, 220c and 220d (collectively referred to as "a set of clock pre-decoder circuits 220") and the address latch and pre-decoder circuit 204. The clock gating circuit 202 is configured to output the clock signal ICLK to the set of clock pre-decoder circuits 220 and the address latch and pre-decoder circuit 204.

The address latch and pre-decoder circuit 204 is configured to generate a set of address signals LADR[0:10], a set of global pre-decoder signals PREDEC1_GLOBAL and a set of global pre-decoder signals PREDEC2_GLOBAL in response to a memory address signal ADR.

In some embodiments, the memory address signal ADR and the set of address signals LADR[0:10] includes 11 bits (e.g., written as [0:10]). In some embodiments, the set of address signals LADR[0:10] is divided into a first set of address signals LADR[0:4], a second set of address signals LADR[5:7] and a third set of address signals LADR[8:10].

In some embodiments, the first set of address signals LADR[0:4] includes 5 bits, and the 5 bits are located at bit positions 0:4 in the set of address signals LADR[0:10]. In some embodiments, the second set of address signals LADR[5:7] includes 3 bits, and the 3 bits are located at bit positions 5:7 in the set of address signals LADR[0:10]. In some embodiments, the third set of address signals LADR[8:10] includes 3 bits, and the 3 bits are located at bit positions 8:10 in the set of address signals LADR[0:10].

In some embodiments, at least one of the set of global pre-decoder signals PREDEC1_GLOBAL or the set of global pre-decoder signals PREDEC2_GLOBAL includes 8 bits, and the 8 bits are located at bit positions 0:7 in the corresponding set of global pre-decoder signals PREDEC1_GLOBAL[0:7] or the set of global pre-decoder signals PREDEC2_GLOBAL[0:7].

Other numbers of bits or bit locations for at least one of the memory address signal ADR, the set of address signals LADR[0:10], the first set of address signals LADR[0:4], the second set of address signals LADR[5:7], the third set of address signals LADR[8:10], the set of global pre-decoder signals PREDEC1_GLOBAL or the set of global pre-decoder signals PREDEC2_GLOBAL is within the scope of the present disclosure.

The address latch and pre-decoder circuit 204 is coupled to the set of clock pre-decoder circuits 220 by a conductive line 244. The address latch and pre-decoder circuit 204 is configured to output the first set of address signals LADR[0:4] to the set of clock pre-decoder circuits 220 by conductive line 244.

The address latch and pre-decoder circuit 204 is coupled to the set of repeater circuits 230a, 230b, 230c and 230d by conductive lines 260 and 262. The address latch and pre-decoder circuit 204 is configured to output the set of global pre-decoder signals PREDEC1_GLOBAL to the set of repeater circuits 230a, 230b, 230c and 230d by conductive line 260. The address latch and pre-decoder circuit 204 is configured to output the set of global pre-decoder signals PREDEC2_GLOBAL to the set of repeater circuits 230a, 230b, 230c and 230d by conductive line 262.

In some embodiments, conductive line 260 is referred to as a first global pre-decoder line, and conductive line 262 is referred to as a second global pre-decoder line. In some embodiments, at least one of conductive line 260 or 262 extends in the second direction Y across each of the memory partitions 102A-102D of memory circuit 200.

Local control circuit 214a in memory partition 102A includes a clock pre-decoder circuit 220d and a set of repeater circuits 230d. Local control circuit 214a in memory partition 102B includes a clock pre-decoder circuit 220c and a set of repeater circuits 230c. Local control circuit 214a in memory partition 102C includes a clock pre-decoder circuit 220b and a set of repeater circuits 230b. Local control circuit 214a in memory partition 102D includes a clock pre-decoder circuit 220a and a set of repeater circuits 230a.

Each clock pre-decoder circuit 220a, 220b, 220c or 220d of the set of clock pre-decoder circuits 220 is configured to receive the first set of address signals LADR[0:4] and the clock signal ICLK. Each clock pre-decoder circuit 220a, 220b, 220c or 220d of the set of clock pre-decoder circuits 220 is configured to generate a set of clock signals ICKD_TOP[0:3] and a set of clock signals ICKD_BOT[0:3] in response to the first set of address signals LADR[0:4] and the clock signal ICLK.

In some embodiments, at least one of the set of clock signals ICKD_TOP[0:3] or the set of clock signals ICKD_BOT[0:3] includes 4 bits, and the 4 bits are located at bit positions 0:3 in the corresponding set of clock signals ICKD_TOP[0:3] or the set of clock signals ICKD_BOT[0:3].

Other numbers of bits or bit locations for at least one of the set of clock signals ICKD_TOP[0:3] or the set of clock signals ICKD_BOT[0:3] is within the scope of the present disclosure.

Clock pre-decoder circuit 220a is further coupled to the set of word line post-decoder circuits 240a and 240b. Clock pre-decoder circuit 220a is configured to output the set of clock signals ICKD_TOP[0:3] to the set of word line post-decoder circuit 240a, and to output the set of clock signals ICKD_BOT to the set of word line post-decoder circuit 240b.

Clock pre-decoder circuit 220b is further coupled to the set of word line post-decoder circuits 242a and 242b. Clock pre-decoder circuit 220b is configured to output the set of clock signals ICKD_TOP[0:3] to the set of word line post-decoder circuit 242a, and to output the set of clock signals ICKD_BOT to the set of word line post-decoder circuit 242b.

Clock pre-decoder circuit 220c is further coupled to the set of word line post-decoder circuits 244a and 244b. Clock pre-decoder circuit 220c is configured to output the set of clock signals ICKD_TOP[0:3] to the set of word line post-decoder circuit 244a, and to output the set of clock signals ICKD_BOT to the set of word line post-decoder circuit 244b.

Clock pre-decoder circuit 220d is further coupled to the set of word line post-decoder circuits 246a and 246b. Clock pre-decoder circuit 220d is configured to output the set of clock signals ICKD_TOP[0:3] to the set of word line post-decoder circuit 246a, and to output the set of clock signals ICKD_BOT to the set of word line post-decoder circuit 246b.

Each of the set of repeater circuits 230a, 230b, 230c or 230d is configured to generate a set of local pre-decoder signals PREDEC1_LOCAL in response to the set of global pre-decoder signals PREDEC1_GLOBAL, and to generate a set of local pre-decoder signals PREDEC2_LOCAL in response to the set of global pre-decoder signals PREDEC2_GLOBAL.

Figure 3:
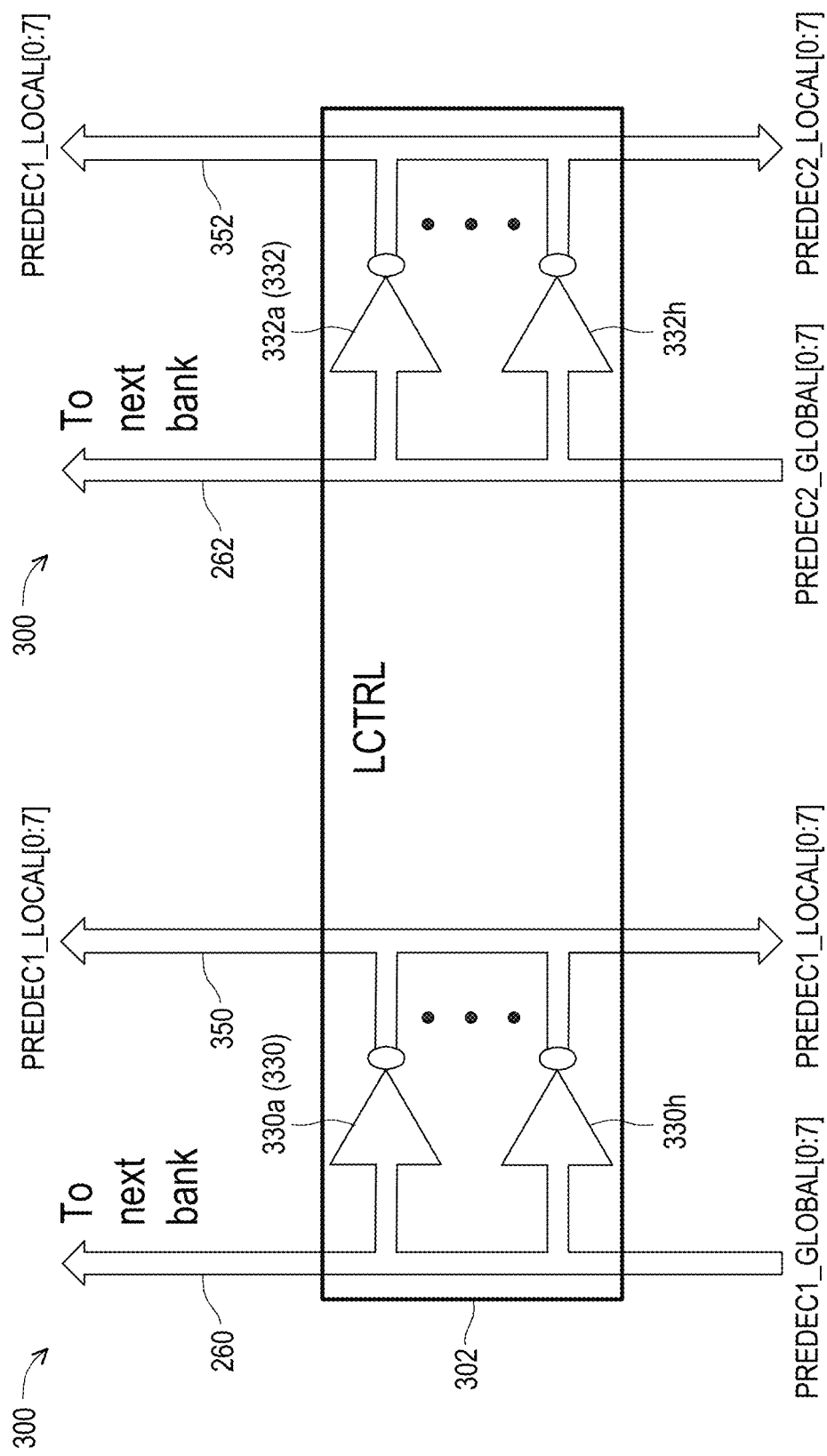
FIG. 3 is a circuit diagram of a memory circuit, in accordance with some embodiments.

In some embodiments, at least one of the set of repeater circuits 230a, 230b, 230c or 230d is a corresponding set of buffers or a corresponding set of inverters (shown in FIG. 3).

In some embodiments, at least one of the set of local pre-decoder signals PREDEC1_LOCAL or the set of local pre-decoder signals PREDEC2_LOCAL includes 8 bits, and the 8 bits are located at bit positions 0:7 in the corresponding set of local pre-decoder signals PREDEC1_LOCAL[0:7] or set of local pre-decoder signals PREDEC2_LOCAL[0:7].

Other numbers of bits or bit locations for at least one of the set of local pre-decoder signals PREDEC1_LOCAL or the set of local pre-decoder signals PREDEC2_LOCAL is within the scope of the present disclosure.

The set of repeater circuits 230a is further coupled to the set of word line post-decoder circuits 240a and 240b by conductive lines 250a and 252a. The set of repeater circuits 230a is configured to output the set of local pre-decoder signals PREDEC1_LOCAL and the set of local pre-decoder signals PREDEC2_LOCAL to each of the set of word line post-decoder circuits 240a and 240b by corresponding conductive lines 250a and 252a.

The set of repeater circuits 230b is further coupled to the set of word line post-decoder circuits 242a and 242b by conductive lines 250b and 252b. The set of repeater circuits 230b is configured to output the set of local pre-decoder signals PREDEC1_LOCAL and the set of local pre-decoder signals PREDEC2_LOCAL to each of the set of word line post-decoder circuits 242a and 242b by corresponding conductive lines 250b and 252b.

The set of repeater circuits 230c is further coupled to the set of word line post-decoder circuits 244a and 244b by conductive lines 250c and 252c. The set of repeater circuits 230c is configured to output the set of local pre-decoder signals PREDEC1_LOCAL and the set of local pre-decoder signals PREDEC2_LOCAL to each of the set of word line post-decoder circuits 244a and 244b by corresponding conductive lines 250c and 252c.

The set of repeater circuits 230d is further coupled to the set of word line post-decoder circuits 246a and 246b by conductive lines 250d and 252d. The set of repeater circuits 230d is configured to output the set of local pre-decoder signals PREDEC1_LOCAL and the set of local pre-decoder signals PREDEC2_LOCAL to each of the set of word line post-decoder circuits 246a and 246b by corresponding conductive lines 250d and 252d.

In some embodiments, at least one of conductive line 250a, 250b, 250c or 250d of a set of conductive lines 250 is referred to as a first local pre-decoder line, and at least one of conductive line 252a, 252b, 252c or 252d of a set of conductive lines 252 is referred to as a second local pre-decoder line. In some embodiments, at least one of conductive line 250a, 250b, 250c or 250d extends in the second direction Y within corresponding memory partition 102A, 102B, 102C or 102D of memory circuit 200. In some embodiments, at least one of conductive line 252a, 252b, 252c or 252d extends in the second direction Y within corresponding memory partition 102A, 102B, 102C or 102D of memory circuit 200.

In some embodiments, each of the set of repeater circuits 230a, 230b, 230c or 230d is configured to repeat or create a local version (e.g., set of local pre-decoder signals PREDEC1_LOCAL or set of local pre-decoder signals PREDEC2_LOCAL) of the set of global pre-decoder signals PREDEC1_GLOBAL or the set of global pre-decoder signals PREDEC2_GLOBAL.

In some embodiments, by repeating or creating a local version of the set of global pre-decoder signals PREDEC1_GLOBAL or the set of global pre-decoder signals PREDEC2_GLOBAL thereby generating the corresponding set of local pre-decoder signals PREDEC1_LOCAL or set of local pre-decoder signals PREDEC2_LOCAL, the driving strength of the set of local pre-decoder signals PREDEC1_LOCAL or set of local pre-decoder signals PREDEC2_LOCAL from each of the set of repeater circuits 230a, 230b, 230c or 230d is increased compared to other approaches, resulting in timing improvements of at least address setup time of memory circuit 200.

WL driver circuit 212a in memory partition 102A includes a set of word line post-decoder circuits 246a. WL driver circuit 212b in memory partition 102A includes a set of word line post-decoder circuits 246b. WL driver circuit 212a in memory partition 102B includes a set of word line post-decoder circuits 244a. WL driver circuit 212b in memory partition 102B includes a set of word line post-decoder circuits 244b. WL driver circuit 212a in memory partition 102C includes a set of word line post-decoder circuits 242a. WL driver circuit 212b in memory partition 102C includes a set of word line post-decoder circuits 242b. WL driver circuit 212a in memory partition 102D includes a set of word line post-decoder circuits 240a. WL driver circuit 212b in memory partition 102D includes a set of word line post-decoder circuits 240b.

The set of word line post-decoder circuits 240a or 240b is configured to receive the set of local pre-decoder signals PREDEC1_LOCAL, the set of local pre-decoder signals PREDEC2_LOCAL and one of the corresponding set of clock signals ICKD_TOP[0:3] or ICKD_BOT[0:3]. The set of word line post-decoder circuits 240a or 240b is configured to generate a set of word line signals WL' in response to the set of local pre-decoder signals PREDEC1_LOCAL, the set of local pre-decoder signals PREDEC2_LOCAL and one of the corresponding set of clock signals ICKD_TOP[0:3] or ICKD_BOT[0:3].

The set of word line post-decoder circuits 240a and 240b is configured to output the set of word line signals WL' on corresponding word lines WL. The set of word line post-decoder circuits 240a and 240b is further coupled to corresponding memory cell array 210a or 210b by the word lines WL. At least one of memory cell array 210a or 210b is configured to store a corresponding first set of data or a second set of data in response to at least the set of word line signals WL'.

The set of word line post-decoder circuits 242a or 242b is configured to receive the set of local pre-decoder signals PREDEC1_LOCAL, the set of local pre-decoder signals PREDEC2_LOCAL and one of the corresponding set of clock signals ICKD_TOP[0:3] or ICKD_BOT[0:3]. The set of word line post-decoder circuits 242a or 242b is configured to generate the set of word line signals WL' in response to the set of local pre-decoder signals PREDEC1_LOCAL, the set of local pre-decoder signals PREDEC2_LOCAL and one of the corresponding set of clock signals ICKD_TOP[0:3] or ICKD_BOT[0:3].

The set of word line post-decoder circuits 242a and 242b is configured to output the set of word line signals WL' on corresponding word lines WL. The set of word line post-decoder circuits 242a and 242b is further coupled to corresponding memory cell array 210a or 210b by the word lines WL. At least one of memory cell array 210a or 210b is configured to store the corresponding first set of data or second set of data in response to at least the set of word line signals WL'.

The set of word line post-decoder circuits 244a or 244b is configured to receive the set of local pre-decoder signals PREDEC1_LOCAL, the set of local pre-decoder signals PREDEC2_LOCAL and one of the corresponding set of clock signals ICKD_TOP[0:3] or ICKD_BOT[0:3]. The set of word line post-decoder circuits 244a or 244b is configured to generate the set of word line signals WL' in response to the set of local pre-decoder signals PREDEC1_LOCAL, the set of local pre-decoder signals PREDEC2_LOCAL and one of the corresponding set of clock signals ICKD_TOP[0:3] or ICKD_BOT[0:3].

The set of word line post-decoder circuits 244a and 244b is configured to output the set of word line signals WL' on corresponding word lines WL. The set of word line post-decoder circuits 244a and 244b is further coupled to corresponding memory cell array 210a or 210b by the word lines WL. At least one of memory cell array 210a or 210b is configured to store the corresponding first set of data or second set of data in response to at least the set of word line signals WL'.

The set of word line post-decoder circuits 246a or 246b is configured to receive the set of local pre-decoder signals PREDEC1_LOCAL, the set of local pre-decoder signals PREDEC2_LOCAL and one of the corresponding set of clock signals ICKD_TOP[0:3] or ICKD_BOT[0:3]. The set of word line post-decoder circuits 246a or 246b is configured to generate the set of word line signals WL' in response to the set of local pre-decoder signals PREDEC1_LOCAL, the set of local pre-decoder signals PREDEC2_LOCAL and one of the corresponding set of clock signals ICKD_TOP[0:3] or ICKD_BOT[0:3].

The set of word line post-decoder circuits 246a and 246b is configured to output the set of word line signals WL' on corresponding word lines WL. The set of word line post-decoder circuits 246a and 246b is further coupled to corresponding memory cell array 210a or 210b by the word lines WL. At least one of memory cell array 210a or 210b is configured to store the corresponding first set of data or second set of data in response to at least the set of word line signals WL'.

In some embodiments, the set of clock pre-decoder circuits 220, the set of repeater circuits 230, the set of word line post-decoder circuits 240, 242, 244 and 246, conductive lines 260, 262 and 264, and the set of conductive lines 250 and 252 are shown as being configured for the left-side portion of memory circuit 200 for ease of illustration. However, in some embodiments, memory circuit 200 is configured such that circuits similar to the corresponding set of clock pre-decoder circuits 220, set of repeater circuits 230, set of word line post-decoder circuits 240, 242, 244 and 246, conductive lines 260, 262 and 264, and set of conductive lines 250 and 252 are included in the right-side portion of memory circuit 200, are not shown for ease of illustration, and similar detailed description is therefore omitted.

In some embodiments, memory circuit 200 is configured such that the set of clock pre-decoder circuits 220, set of repeater circuits 230, set of word line post-decoder circuits 240, 242, 244 and 246, conductive lines 260, 262 and 264, and set of conductive lines 250 and 252 are configured for the left-side portion of memory circuit 200, and similar detailed description is therefore omitted.

In some embodiments, by configuring each of the set of repeater circuits 230a, 230b, 230c or 230d in the corresponding local control circuit 214a, the set of word line post-decoder circuits 240, 242, 244 and 246 are configured to receive local pre-decoder signals (e.g., the set of local pre-decoder signals PREDEC1_LOCAL and PREDEC2_LOCAL) compared to other approaches that receive global pre-decoder signals. In some embodiments, by configuring the set of word line post-decoder circuits 240, 242, 244 and 246 to receive local pre-decoder signals (e.g., the set of local pre-decoder signals PREDEC1_LOCAL and PREDEC2_LOCAL), the driving strength of the set of local pre-decoder signals PREDEC1_LOCAL or set of local pre-decoder signals PREDEC2_LOCAL from each of the set of repeater circuits 230a, 230b, 230c or 230d is increased compared to other approaches, resulting in timing improvements of at least address setup time of memory circuit 200.

Other configurations of memory circuit 200 are within the scope of the present disclosure.

FIG. 3 is a circuit diagram of a memory circuit 300, in accordance with some embodiments.

Memory circuit 300 is an embodiment of memory circuit 100 of FIG. 1 or memory circuit 200 of FIGS. 2A-2B, and similar detailed description is therefore omitted. For example, memory circuit 300 illustrates a non-limiting example where a set of inverters 330 and 332 of FIG. 3 are an embodiment of the set of repeaters 230a, 230b, 230c or 230d of FIGS. 2A-2B, and similar detailed description is therefore omitted. Stated differently, memory circuit 300 illustrates a non-limiting example where at least one of the set of repeaters 230a, 230b, 230c or 230d of FIGS. 2A-2B includes the set of inverters 330 and 332.

Memory circuit 300 includes a local control circuit 302, set of inverters 330 and 332, conductive lines 260, 262, 350 and 352. The local control circuit 302 includes the set of inverters 330 332.

In comparison with memory circuit 200 of FIGS. 2A-2B, local control circuit 302 is an embodiment of local control circuit 214a, the set of inverters 330 and 332 are an embodiment of at least one of the set of repeaters 230a, 230b, 230c or 230d, conductive lines 350 are an embodiment of conductive lines 250, and conductive lines 352 are an embodiment of conductive lines 252, and similar detailed description is therefore omitted.

In comparison with memory circuit 200 of FIGS. 2A-2B, the set of inverters 330 and 332 are useable as at least one of the set of repeater circuits 230a, 230b, 230c or 230d, and similar detailed description is therefore omitted.

The set of inverters 330 is configured to receive the set of global pre-decoder signals PREDEC1_GLOBAL[0:7]. The set of inverters 330 is configured to generate the set of local pre-decoder signals PREDEC1_LOCAL[0:7] in response to the set of global pre-decoder signals PREDEC1_GLOBAL[0:7]. In some embodiments, the set of local pre-decoder signals PREDEC1_LOCAL[0:7] is inverted from the set of global pre-decoder signals PREDEC1_GLOBAL[0:7]. The set of inverters 330 are positioned between conductive lines 260 and conductive lines 350.

The set of inverters 330 includes at least one of inverter 330a, 330b, . . . , 330g or 330h. Each inverter 330a, 330b, . . . , 330g or 330h of the set of inverters 330 is configured to receive a corresponding global pre-decoder signal of the set of global pre-decoder signals PREDEC1_GLOBAL[0:7] from conductive lines 260.

Each inverter 330a, 330b, . . . , 330g or 330h of the set of inverters 330 is configured to generate a corresponding local pre-decoder signal of the set of local pre-decoder signals PREDEC1_LOCAL[0:7] in response to the corresponding global pre-decoder signal of the set of global pre-decoder signals PREDEC1_GLOBAL[0:7]. In some embodiments, each local pre-decoder signal of the set of local pre-decoder signals PREDEC1_LOCAL[0:7] is inverted from the corresponding global pre-decoder signal of the set of global pre-decoder signals PREDEC1_GLOBAL[0:7].

Each inverter 330a, 330b, . . . , 330g or 330h of the set of inverters 330 is configured to output the corresponding local pre-decoder signal of the set of local pre-decoder signals PREDEC1_LOCAL[0:7] on conductive lines 350.

The set of inverters 332 is configured to receive the set of global pre-decoder signals PREDEC2_GLOBAL[0:7]. The set of inverters 332 is configured to generate the set of local pre-decoder signals PREDEC2_LOCAL[0:7] in response to the set of global pre-decoder signals PREDEC2_GLOBAL[0:7]. In some embodiments, the set of local pre-decoder signals PREDEC2_LOCAL[0:7] is inverted from the set of global pre-decoder signals PREDEC2_GLOBAL[0:7]. The set of inverters 332 are positioned between conductive lines 262 and conductive lines 352.

The set of inverters 332 includes at least one of inverter 332a, 332b, . . . , 332g or 332h. Each inverter 332a, 332b, . . . , 332g or 332h of the set of inverters 332 is configured to receive a corresponding global pre-decoder signal of the set of global pre-decoder signals PREDEC2_GLOBAL[0:7] from conductive lines 262.

Each inverter 332a, 332b, . . . , 332g or 332h of the set of inverters 332 is configured to generate a corresponding local pre-decoder signal of the set of local pre-decoder signals PREDEC2_LOCAL[0:7] in response to the corresponding global pre-decoder signal of the set of global pre-decoder signals PREDEC2_GLOBAL[0:7]. In some embodiments, each local pre-decoder signal of the set of local pre-decoder signals PREDEC2_LOCAL[0:7] is inverted from the corresponding global pre-decoder signal of the set of global pre-decoder signals PREDEC2_GLOBAL[0:7].

Each inverter 332a, 332b, . . . , 332g or 332h of the set of inverters 332 is configured to output the corresponding local pre-decoder signal of the set of local pre-decoder signals PREDEC2_LOCAL[0:7] on conductive lines 352.

In some embodiments, the set of inverters 330 and 332 are replaced with a corresponding set of buffer circuits. In these embodiments, the set of local pre-decoder signals PREDEC1_LOCAL[0:7] are not inverted from the set of global pre-decoder signals PREDEC1_GLOBAL[0:7], and the set of local pre-decoder signals PREDEC2_LOCAL[0:7] are not inverted from the set of global pre-decoder signals PREDEC2_GLOBAL[0:7].

In some embodiments, memory circuit 300 operates to achieve one or more benefits described herein including the details discussed above with respect to memory circuit 200.

Other configurations of memory circuit 300 are within the scope of the present disclosure.

Figure 4:
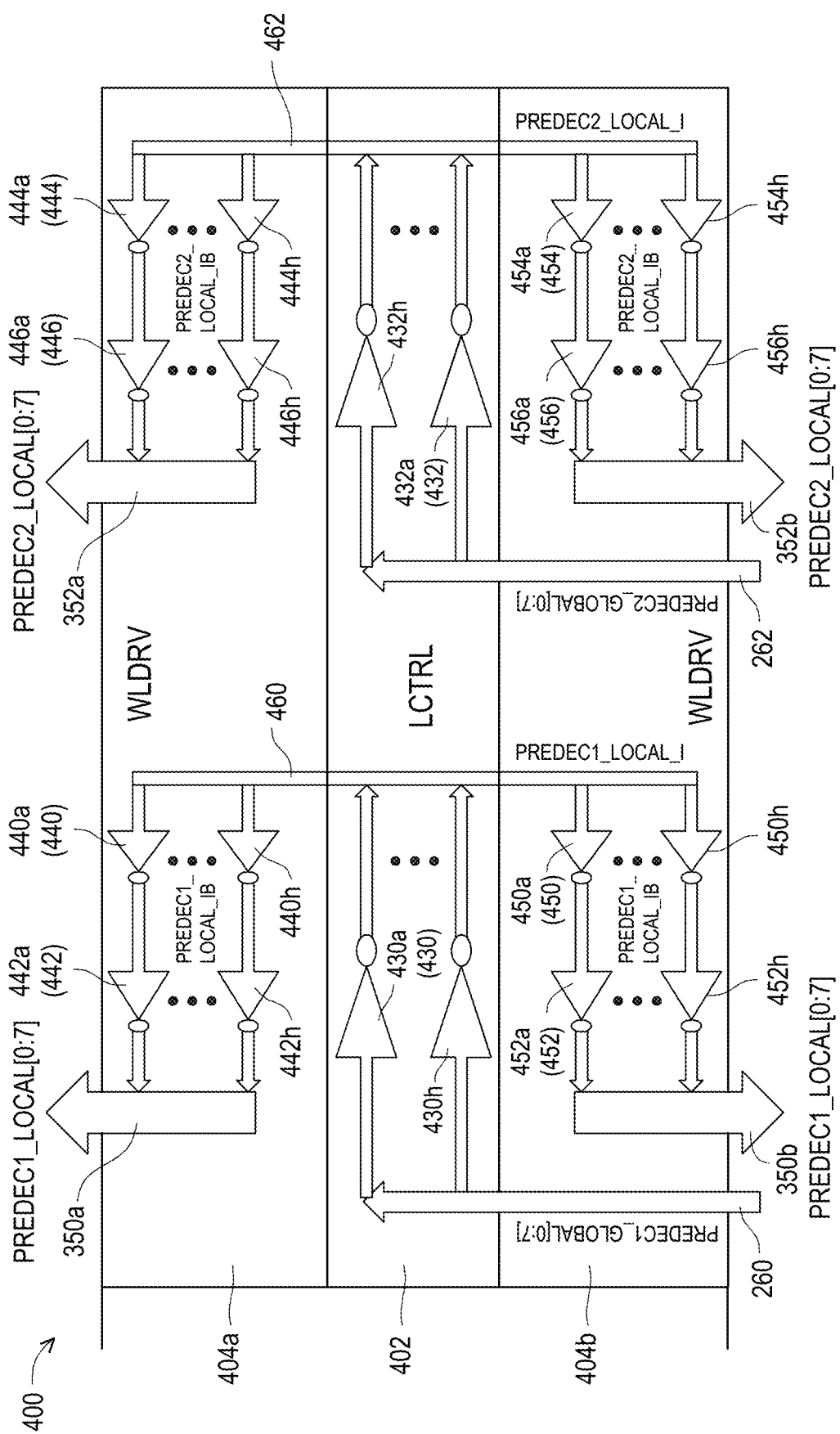
FIG. 4 is a circuit diagram of a memory circuit, in accordance with some embodiments.

FIG. 4 is a circuit diagram of a memory circuit 400, in accordance with some embodiments.

Memory circuit 400 is a variation of memory circuit 300 of FIG. 3, and similar detailed description is therefore omitted. For example, memory circuit 300 illustrates a non-limiting example where WL driver circuit 404a includes four sets of inverters (e.g., set of inverters 440, 442, 444, 446) and WL driver circuit 404b includes four sets of inverters (e.g., set of inverters 450, 452, 454, 456) within each corresponding path between the global pre-decoder lines and the local pre-decoder lines. In some embodiments, by WL driver circuit 404a including four sets of inverters (e.g., set of inverters 440, 442, 444, 446) within a corresponding first path between the global pre-decoder lines and the local pre-decoder lines, and by WL driver circuit 404b including four sets of inverters (e.g., set of inverters 450, 452, 454, 456) within a corresponding second path between the global pre-decoder lines and the local pre-decoder lines, the driving strength of the set of local pre-decoder signals PREDEC1_LOCAL or set of local pre-decoder signals PREDEC2_LOCAL from each of the set of inverters 442, 446, 452 and 456 is increased compared to other approaches, resulting in timing improvements of at least address setup time of memory circuit 400.

Memory circuit 400 is an embodiment of memory circuit 100 of FIG. 1 or memory circuit 200 of FIGS. 2A-2B, and similar detailed description is therefore omitted.

Memory circuit 400 includes a local control circuit 402, WL driver circuit 404a, WL driver circuit 404b, and conductive lines 260, 262, 350a, 350b, 352a, 352b, 460 and 462.

In some embodiments, conductive lines 350a and 350b are similar to conductive lines 350 of FIG. 3, and conductive lines 352a and 352b are similar to conductive lines 352 of FIG. 3, and similar detailed description is therefore omitted.

In comparison with memory circuit 200 of FIGS. 2A-2B, local control circuit 402 is an embodiment of local control circuit 214*a*, the set of inverters 430 and 432 are an embodiment of at least one of the set of repeaters 230*a*, 230*b*, 230*c* or 230*d*, WL driver circuit 404*a* is an embodiment of WL driver circuit 212*a*, WL driver circuit 404*b* is an embodiment of WL driver circuit 212*b*, conductive lines 350*a*-350*b* are an embodiment of conductive lines 250, and conductive lines 352*a*-352*b* are an embodiment of conductive lines 252, and similar detailed description is therefore omitted.

The set of local control circuits 402 includes the set of inverters 430 and 432. In comparison with memory circuit 200 of FIGS. 2A-2B, the set of inverters 430 and 432 are useable as at least one of the set of repeater circuits 230*a*, 230*b*, 230*c* or 230*d*, and similar detailed description is therefore omitted.

The set of inverters 430 and 432 are a variation of the corresponding set of inverters 330 and 332 of FIG. 3, and similar detailed description is therefore omitted. In comparison with the set of inverters 330 of FIG. 3, the set of inverters 430 are configured to generate an intermediate signal (e.g., a set of local intermediate pre-decoder signals PREDEC1_LOCAL_I[0:7]), and are not directly coupled to conductive lines 350*a*-350*b*. In comparison with the set of inverters 332 of FIG. 3, the set of inverters 432 are configured to generate an intermediate signal (e.g., a set of local intermediate pre-decoder signals PREDEC2_LOCAL_I[0:7]), and are not directly coupled to conductive lines 352*a*-352*b*.

The set of inverters 430 is configured to receive the set of global pre-decoder signals PREDEC1_GLOBAL[0:7]. The set of inverters 430 is configured to generate the set of local intermediate pre-decoder signals PREDEC1_LOCAL_I[0:7] in response to the set of global pre-decoder signals PREDEC1_GLOBAL[0:7]. In some embodiments, the set of local intermediate pre-decoder signals PREDEC1_LOCAL_I[0:7] is inverted from the set of global pre-decoder signals PREDEC1_GLOBAL[0:7]. The set of inverters 430 are positioned between conductive lines 260 and conductive lines 460.

The set of inverters 430 includes at least one of inverter 430*a*, 430*b*, . . . , 430*g* or 430*h*. Each inverter 430*a*, 430*b*, . . . , 430*g* or 430*h* of the set of inverters 430 is configured to receive a corresponding global pre-decoder signal of the set of global pre-decoder signals PREDEC1_GLOBAL[0:7] from conductive lines 260.

Each inverter 430*a*, 430*b*, . . . , 430*g* or 430*h* of the set of inverters 430 is configured to generate a corresponding local intermediate pre-decoder signal of the set of local intermediate pre-decoder signals PREDEC1_LOCAL_I[0:7] in response to the corresponding global pre-decoder signal of the set of global pre-decoder signals PREDEC1_GLOBAL[0:7]. In some embodiments, each local intermediate pre-decoder signal of the set of local intermediate pre-decoder signals PREDEC1_LOCAL_I[0:7] is inverted from the corresponding global pre-decoder signal of the set of global pre-decoder signals PREDEC1_GLOBAL[0:7].

Each inverter 430*a*, 430*b*, . . . , 430*g* or 430*h* of the set of inverters 430 is configured to output the corresponding local intermediate pre-decoder signal of the set of local intermediate pre-decoder signals PREDEC1_LOCAL_I[0:7] to a corresponding inverter 440*a*, 440*b*, . . . , 440*g* or 440*h* of a set of inverters 440 and to a corresponding inverter 450*a*, 450*b*, . . . , 450*g* or 450*h* of a set of inverters 450 by conductive lines 460.

The set of inverters 432 is configured to receive the set of global pre-decoder signals PREDEC2_GLOBAL[0:7]. The set of inverters 432 is configured to generate the set of local intermediate pre-decoder signals PREDEC2_LOCAL_I[0:7] in response to the set of global pre-decoder signals PREDEC2_GLOBAL[0:7]. In some embodiments, the set of local intermediate pre-decoder signals PREDEC2_LOCAL_I[0:7] is inverted from the set of global pre-decoder signals PREDEC2_GLOBAL[0:7]. The set of inverters 432 are positioned between conductive lines 260 and conductive lines 462.

The set of inverters 432 includes at least one of inverter 432*a*, 432*b*, . . . , 432*g* or 432*h*. Each inverter 432*a*, 432*b*, . . . , 432*g* or 432*h* of the set of inverters 432 is configured to receive a corresponding global pre-decoder signal of the set of global pre-decoder signals PREDEC2_GLOBAL[0:7] from conductive lines 262.

Each inverter 432*a*, 432*b*, . . . , 432*g* or 432*h* of the set of inverters 432 is configured to generate a corresponding local intermediate pre-decoder signal of the set of local intermediate pre-decoder signals PREDEC2_LOCAL_I[0:7] in response to the corresponding global pre-decoder signal of the set of global pre-decoder signals PREDEC2_GLOBAL[0:7]. In some embodiments, each local intermediate pre-decoder signal of the set of local intermediate pre-decoder signals PREDEC2_LOCAL_I[0:7] is inverted from the corresponding global pre-decoder signal of the set of global pre-decoder signals PREDEC2_GLOBAL[0:7].

Each inverter 432*a*, 432*b*, . . . , 432*g* or 432*h* of the set of inverters 432 is configured to output the corresponding local intermediate pre-decoder signal of the set of local intermediate pre-decoder signals PREDEC2_LOCAL_I[0:7] to a corresponding inverter 444*a*, 444*b*, . . . , 444*g* or 444*h* of a set of inverters 444 and to a corresponding inverter 454*a*, 454*b*, . . . , 454*g* or 454*h* of a set of inverters 454 by conductive lines 462.

The set of WL circuits 404*a* includes the set of inverters 440, 442, 444 and 446.

The set of inverters 440 is configured to receive the set of intermediate local pre-decoder signals PREDEC1_LOCAL_I[0:7]. The set of inverters 440 is configured to generate the set of local intermediate pre-decoder signals PREDEC1_LOCAL_IB[0:7] in response to the set of intermediate local pre-decoder signals PREDEC1_LOCAL_I[0:7]. In some embodiments, the set of local intermediate pre-decoder signals PREDEC1_LOCAL_IB[0:7] is inverted from the set of intermediate local pre-decoder signals PREDEC1_LOCAL_I[0:7]. The set of inverters 440 are positioned between conductive lines 460 and the set of inverters 442.

The set of inverters 440 includes at least one of inverter 440*a*, 440*b*, . . . , 440*g* or 440*h*. Each inverter 440*a*, 440*b*, . . . , 440*g* or 440*h* of the set of inverters 440 is configured to receive a corresponding intermediate local pre-decoder signal of the set of intermediate local pre-decoder signals PREDEC1_LOCAL_I[0:7] from conductive lines 460.

Each inverter 440*a*, 440*b*, . . . , 440*g* or 440*h* of the set of inverters 440 is configured to generate a corresponding local intermediate pre-decoder signal of the set of local intermediate pre-decoder signals PREDEC1_LOCAL_IB[0:7] in response to the corresponding intermediate local pre-decoder signal of the set of intermediate local pre-decoder signals PREDEC1_LOCAL_I[0:7]. In some embodiments, each local intermediate pre-decoder signal of the set of local intermediate pre-decoder signals PREDEC1_LOCAL_IB[0:7] is inverted from the corresponding intermediate local pre-decoder signal of the set of intermediate local pre-decoder signals PREDEC1_LOCAL_I[0:7].

Each inverter 440a, 440b, . . . , 440g or 440h of the set of inverters 440 is configured to output the corresponding local intermediate pre-decoder signal of the set of local intermediate pre-decoder signals PREDEC1_LOCAL_IB[0:7] to a corresponding inverter 442a, 442b, . . . , 442g or 442h of the set of inverters 442.

The set of inverters 442 is configured to receive the set of intermediate local pre-decoder signals PREDEC1_LOCAL_IB[0:7]. The set of inverters 442 is configured to generate the set of local pre-decoder signals PREDEC1_LOCAL_[0:7] in response to the set of intermediate local pre-decoder signals PREDEC1_LOCAL_IB[0:7]. In some embodiments, the set of local intermediate pre-decoder signals PREDEC1_LOCAL_IB[0:7] is inverted from the set of local pre-decoder signals PREDEC1_LOCAL[0:7]. The set of inverters 442 are positioned between the set of inverters 440 and conductive lines 350a.

The set of inverters 442 includes at least one of inverter 442a, 442b, . . . , 442g or 442h. Each inverter 442a, 442b, . . . , 442g or 442h of the set of inverters 442 is configured to receive a corresponding intermediate local pre-decoder signal of the set of intermediate local pre-decoder signals PREDEC1_LOCAL_IB[0:7] from a corresponding inverter 440a, 440b, . . . , 440g or 440h of the set of inverters 440.

Each inverter 442a, 442b, . . . , 442g or 442h of the set of inverters 442 is configured to generate a corresponding local pre-decoder signal of the set of local pre-decoder signals PREDEC1_LOCAL[0:7] in response to the corresponding intermediate local pre-decoder signal of the set of intermediate local pre-decoder signals PREDEC1_LOCAL_IB[0:7]. In some embodiments, each local intermediate pre-decoder signal of the set of local intermediate pre-decoder signals PREDEC1_LOCAL_IB[0:7] is inverted from the corresponding local pre-decoder signal of the set of local pre-decoder signals PREDEC1_LOCAL[0:7].

Each inverter 442a, 442b, . . . , 442g or 442h of the set of inverters 442 is configured to output the corresponding local pre-decoder signal of the set of local pre-decoder signals PREDEC1_LOCAL[0:7] to conductive lines 350a.

The set of inverters 444 is configured to receive the set of intermediate local pre-decoder signals PREDEC2_LOCAL_I[0:7]. The set of inverters 444 is configured to generate the set of local intermediate pre-decoder signals PREDEC2_LOCAL_IB[0:7] in response to the set of intermediate local pre-decoder signals PREDEC2_LOCAL_I[0:7]. In some embodiments, the set of local intermediate pre-decoder signals PREDEC2_LOCAL_IB[0:7] is inverted from the set of intermediate local pre-decoder signals PREDEC2_LOCAL_I[0:7]. The set of inverters 444 are positioned between conductive lines 462 and the set of inverters 446.

The set of inverters 444 includes at least one of inverter 444a, 444b, . . . , 444g or 444h. Each inverter 444a, 444b, . . . , 444g or 444h of the set of inverters 444 is configured to receive a corresponding intermediate local pre-decoder signal of the set of intermediate local pre-decoder signals PREDEC2_LOCAL_I[0:7] from conductive lines 462.

Each inverter 444a, 444b, . . . , 444g or 444h of the set of inverters 444 is configured to generate a corresponding local intermediate pre-decoder signal of the set of local intermediate pre-decoder signals PREDEC2_LOCAL_IB[0:7] in response to the corresponding intermediate local pre-decoder signal of the set of intermediate local pre-decoder signals PREDEC2_LOCAL_I[0:7]. In some embodiments, each local intermediate pre-decoder signal of the set of local intermediate pre-decoder signals PREDEC2_LOCAL_IB[0:7] is inverted from the corresponding intermediate local pre-decoder signal of the set of intermediate local pre-decoder signals PREDEC2_LOCAL_I[0:7].

Each inverter 444a, 444b, . . . , 444g or 444h of the set of inverters 444 is configured to output the corresponding local intermediate pre-decoder signal of the set of local intermediate pre-decoder signals PREDEC2_LOCAL_IB[0:7] to a corresponding inverter 446a, 446b, . . . , 446g or 446h of the set of inverters 446.

The set of inverters 446 is configured to receive the set of intermediate local pre-decoder signals PREDEC2_LOCAL_IB[0:7]. The set of inverters 446 is configured to generate the set of local pre-decoder signals PREDEC2_LOCAL_[0:7] in response to the set of intermediate local pre-decoder signals PREDEC2_LOCAL_IB[0:7]. In some embodiments, the set of local intermediate pre-decoder signals PREDEC2_LOCAL_IB[0:7] is inverted from the set of local pre-decoder signals PREDEC2_LOCAL[0:7]. The set of inverters 446 are positioned between the set of inverters 444 and conductive lines 352b.

The set of inverters 446 includes at least one of inverter 446a, 446b, . . . , 446g or 446h. Each inverter 446a, 446b, . . . , 446g or 446h of the set of inverters 446 is configured to receive a corresponding intermediate local pre-decoder signal of the set of intermediate local pre-decoder signals PREDEC2_LOCAL_IB[0:7] from a corresponding inverter 444a, 444b, . . . , 444g or 444h of the set of inverters 444.

Each inverter 446a, 446b, . . . , 446g or 446h of the set of inverters 446 is configured to generate a corresponding local pre-decoder signal of the set of local pre-decoder signals PREDEC2_LOCAL[0:7] in response to the corresponding intermediate local pre-decoder signal of the set of intermediate local pre-decoder signals PREDEC2_LOCAL_IB[0:7]. In some embodiments, each local intermediate pre-decoder signal of the set of local intermediate pre-decoder signals PREDEC2_LOCAL_IB[0:7] is inverted from the corresponding local pre-decoder signal of the set of local pre-decoder signals PREDEC2_LOCAL[0:7].

Each inverter 446a, 446b, . . . , 446g or 446h of the set of inverters 446 is configured to output the corresponding local pre-decoder signal of the set of local pre-decoder signals PREDEC2_LOCAL[0:7] to conductive lines 352b.

The set of inverters 450 is configured to receive the set of intermediate local pre-decoder signals PREDEC1_LOCAL_I[0:7]. The set of inverters 450 is configured to generate the set of local intermediate pre-decoder signals PREDEC1_LOCAL_IB[0:7] in response to the set of intermediate local pre-decoder signals PREDEC1_LOCAL_I[0:7]. In some embodiments, the set of local intermediate pre-decoder signals PREDEC1_LOCAL_IB[0:7] is inverted from the set of intermediate local pre-decoder signals PREDEC1_LOCAL_I[0:7]. The set of inverters 450 are positioned between conductive lines 460 and the set of inverters 452.

The set of WL circuits 404b includes the set of inverters 450, 452, 454 and 456.

The set of inverters 450 includes at least one of inverter 450a, 450b, . . . , 450g or 450h. Each inverter 450a, 450b, . . . , 450g or 450h of the set of inverters 450 is configured to receive a corresponding intermediate local pre-decoder signal of the set of intermediate local pre-decoder signals PREDEC1_LOCAL_I[0:7] from conductive lines 460.

Each inverter 450a, 450b, . . . , 450g or 450h of the set of inverters 450 is configured to generate a corresponding local intermediate pre-decoder signal of the set of local intermediate pre-decoder signals PREDEC1_LOCAL_IB[0:7] in response to the corresponding intermediate local pre-decoder signal of the set of intermediate local pre-decoder signals PREDEC1_LOCAL_I[0:7]. In some embodiments, each local intermediate pre-decoder signal of the set of local intermediate pre-decoder signals PREDEC1_LOCAL_IB[0:7] is inverted from the corresponding intermediate local pre-decoder signal of the set of intermediate local pre-decoder signals PREDEC1_LOCAL_I[0:7].

Each inverter 450a, 450b, . . . , 450g or 450h of the set of inverters 450 is configured to output the corresponding local intermediate pre-decoder signal of the set of local intermediate pre-decoder signals PREDEC1_LOCAL_IB[0:7] to a corresponding inverter 452a, 452b, . . . , 452g or 452h of the set of inverters 452.

The set of inverters 452 is configured to receive the set of intermediate local pre-decoder signals PREDEC1_LOCAL_IB[0:7]. The set of inverters 452 is configured to generate the set of local pre-decoder signals PREDEC1_LOCAL[0:7] in response to the set of intermediate local pre-decoder signals PREDEC1_LOCAL_IB[0:7]. In some embodiments, the set of local intermediate pre-decoder signals PREDEC1_LOCAL_IB[0:7] is inverted from the set of local pre-decoder signals PREDEC1_LOCAL[0:7]. The set of inverters 452 are positioned between the set of inverters 450 and conductive lines 350b.

The set of inverters 452 includes at least one of inverter 452a, 452b, . . . , 452g or 452h. Each inverter 452a, 452b, . . . , 452g or 452h of the set of inverters 452 is configured to receive a corresponding intermediate local pre-decoder signal of the set of intermediate local pre-decoder signals PREDEC1_LOCAL_IB[0:7] from a corresponding inverter 450a, 450b, . . . , 450g or 450h of the set of inverters 450.

Each inverter 452a, 452b, . . . , 452g or 452h of the set of inverters 452 is configured to generate a corresponding local pre-decoder signal of the set of local pre-decoder signals PREDEC1_LOCAL[0:7] in response to the corresponding intermediate local pre-decoder signal of the set of intermediate local pre-decoder signals PREDEC1_LOCAL_IB[0:7]. In some embodiments, each local intermediate pre-decoder signal of the set of local intermediate pre-decoder signals PREDEC1_LOCAL_IB[0:7] is inverted from the corresponding local pre-decoder signal of the set of local pre-decoder signals PREDEC1_LOCAL[0:7].

Each inverter 452a, 452b, . . . , 452g or 452h of the set of inverters 452 is configured to output the corresponding local pre-decoder signal of the set of local pre-decoder signals PREDEC1_LOCAL[0:7] to conductive lines 350b.

The set of inverters 454 is configured to receive the set of intermediate local pre-decoder signals PREDEC2_LOCAL_I[0:7]. The set of inverters 454 is configured to generate the set of local intermediate pre-decoder signals PREDEC2_LOCAL_IB[0:7] in response to the set of intermediate local pre-decoder signals PREDEC2_LOCAL_I[0:7]. In some embodiments, the set of local intermediate pre-decoder signals PREDEC2_LOCAL_IB[0:7] is inverted from the set of intermediate local pre-decoder signals PREDEC2_LOCAL_I[0:7]. The set of inverters 454 are positioned between conductive lines 462 and the set of inverters 456.

The set of inverters 454 includes at least one of inverter 454a, 454b, . . . , 454g or 454h. Each inverter 454a, 454b, . . . , 454g or 454h of the set of inverters 454 is configured to receive a corresponding intermediate local pre-decoder signal of the set of intermediate local pre-decoder signals PREDEC2_LOCAL_I[0:7] from conductive lines 462.

Each inverter 454a, 454b, . . . , 454g or 454h of the set of inverters 454 is configured to generate a corresponding local intermediate pre-decoder signal of the set of local intermediate pre-decoder signals PREDEC2_LOCAL_IB[0:7] in response to the corresponding intermediate local pre-decoder signal of the set of intermediate local pre-decoder signals PREDEC2_LOCAL_I[0:7]. In some embodiments, each local intermediate pre-decoder signal of the set of local intermediate pre-decoder signals PREDEC2_LOCAL_IB[0:7] is inverted from the corresponding intermediate local pre-decoder signal of the set of intermediate local pre-decoder signals PREDEC2_LOCAL_I[0:7].

Each inverter 454a, 454b, . . . , 454g or 454h of the set of inverters 454 is configured to output the corresponding local intermediate pre-decoder signal of the set of local intermediate pre-decoder signals PREDEC2_LOCAL_IB[0:7] to a corresponding inverter 456a, 456b, . . . , 456g or 456h of the set of inverters 456.

The set of inverters 456 is configured to receive the set of intermediate local pre-decoder signals PREDEC2_LOCAL_IB[0:7]. The set of inverters 456 is configured to generate the set of local pre-decoder signals PREDEC2_LOCAL[0:7] in response to the set of intermediate local pre-decoder signals PREDEC2_LOCAL_IB[0:7]. In some embodiments, the set of local intermediate pre-decoder signals PREDEC2_LOCAL_IB[0:7] is inverted from the set of local pre-decoder signals PREDEC2_LOCAL[0:7]. The set of inverters 456 are positioned between the set of inverters 454 and conductive lines 352b.

The set of inverters 456 includes at least one of inverter 456a, 456b, . . . , 456g or 456h. Each inverter 456a, 456b, . . . , 456g or 456h of the set of inverters 456 is configured to receive a corresponding intermediate local pre-decoder signal of the set of intermediate local pre-decoder signals PREDEC2_LOCAL_IB[0:7] from a corresponding inverter 454a, 454b, . . . , 454g or 454h of the set of inverters 454.

Each inverter 456a, 456b, . . . , 456g or 456h of the set of inverters 456 is configured to generate a corresponding local pre-decoder signal of the set of local pre-decoder signals PREDEC2_LOCAL[0:7] in response to the corresponding intermediate local pre-decoder signal of the set of intermediate local pre-decoder signals PREDEC2_LOCAL_IB[0:7]. In some embodiments, each local pre-decoder signal of the set of local intermediate pre-decoder signals PREDEC2_LOCAL_IB[0:7] is inverted from the corresponding local pre-decoder signal of the set of local pre-decoder signals PREDEC2_LOCAL[0:7].

Each inverter 456a, 456b, . . . , 456g or 456h of the set of inverters 456 is configured to output the corresponding local pre-decoder signal of the set of local pre-decoder signals PREDEC2_LOCAL[0:7] to conductive lines 352b.

In some embodiments, other number of sets of inverters for at least one of the set of inverters 430, 432, 440, 442, 444, 446, 450, 452, 454 or 456 are within the scope of the present disclosure. In some embodiments, other number of inverters within at least one or more of the set of inverters 430, 432, 440, 442, 444, 446, 450, 452, 454 or 456 are within the scope of the present disclosure.

In some embodiments, the set of inverters 430, 432, 440, 442, 444, 446, 450, 452, 454 or 456 are replaced with a corresponding set of buffer circuits. In these embodiments, the set of local pre-decoder signals PREDEC1_LOCAL[0:7] are not inverted from the set of global pre-decoder signals PREDEC1_GLOBAL[0:7], and the set of local pre-decoder signals PREDEC2_LOCAL[0:7] are not inverted from the set of global pre-decoder signals PREDEC2_GLOBAL[0:7].

In some embodiments, by WL driver circuit 404a including an additional two sets of inverters (e.g., set of inverters 440 and 442) within a path between conductive lines 260 (e.g., the global pre-decoder lines) and conductive lines 350a (e.g., the local pre-decoder lines), and by WL driver circuit 404b including an additional two sets of inverters (e.g., set of inverters 450 and 452) within a path between conductive lines 260 (e.g., the global pre-decoder lines) and conductive lines 350b (e.g., the local pre-decoder lines), the driving strength of the set of local pre-decoder signals PREDEC1_LOCAL from each of the set of inverters 442 is increased compared to other approaches, resulting in timing improvements of at least the address setup time of memory circuit 400.

In some embodiments, by WL driver circuit 404a including an additional two sets of inverters (e.g., set of inverters 444 and 446) within a path between conductive lines 260 (e.g., the global pre-decoder lines) and conductive lines 352a (e.g., the local pre-decoder lines), and by WL driver circuit 404b including an additional two sets of inverters (e.g., set of inverters 454 and 456) within a path between conductive lines 262 (e.g., the global pre-decoder lines) and conductive lines 352b (e.g., the local pre-decoder lines), the driving strength of the set of local pre-decoder signals PREDEC2_LOCAL from each of the set of inverters 456 is increased compared to other approaches, resulting in timing improvements of at least the address setup time of memory circuit 400.

Other configurations of memory circuit 400 are within the scope of the present disclosure.

Figure 5:
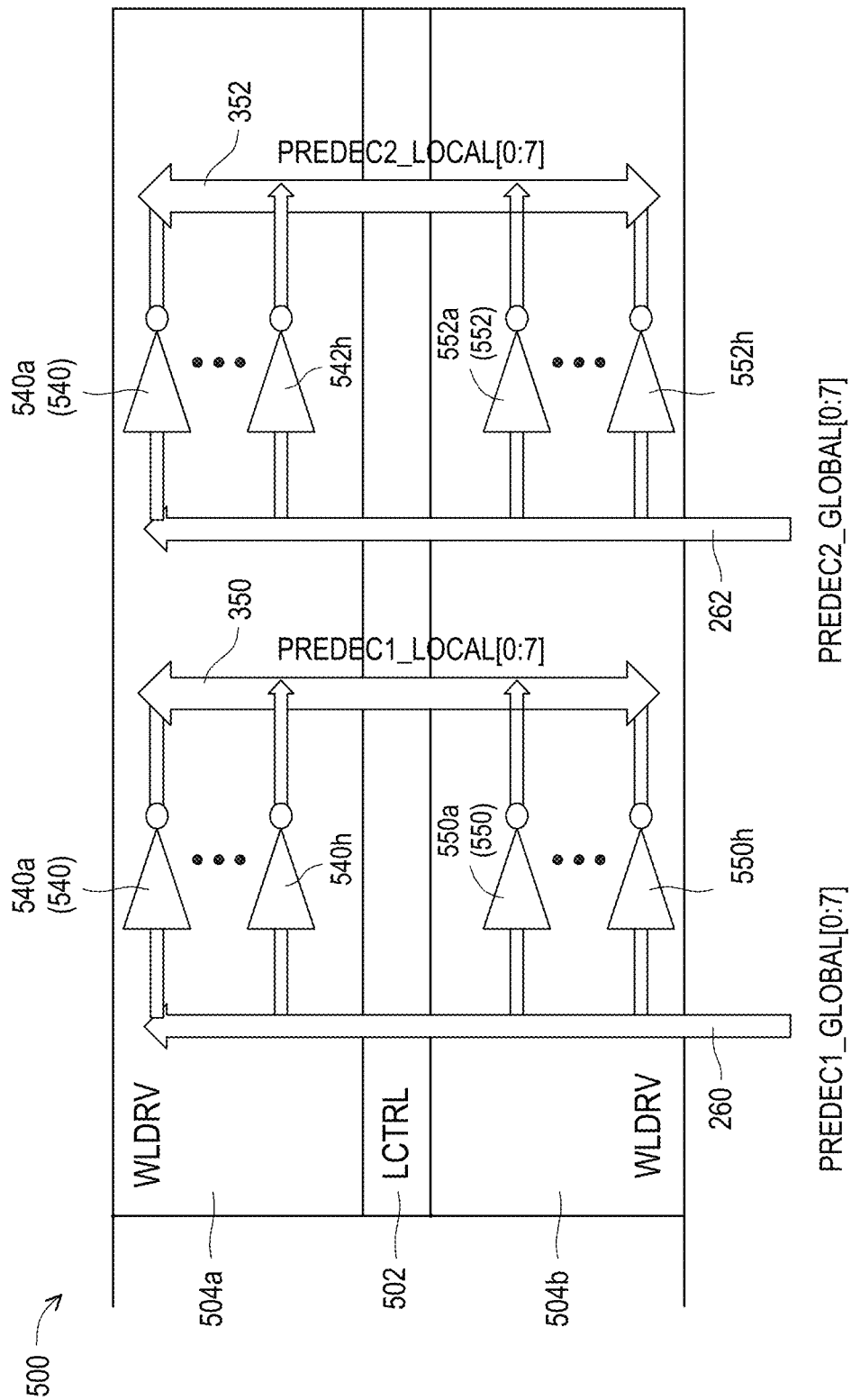
FIG. 5 is a circuit diagram of a memory circuit, in accordance with some embodiments.

FIG. 5 is a circuit diagram of a memory circuit 500, in accordance with some embodiments.

Memory circuit 500 is a variation of memory circuit 400 of FIG. 4, and similar detailed description is therefore omitted. For example, memory circuit 400 illustrates a non-limiting example where the local control circuit 502 does not include a set of repeater circuits or inverters between each corresponding path between the global pre-decoder lines and the local pre-decoder lines, but WL driver circuit 504a includes two set of inverters (e.g., set of inverters 540 and 542) and WL driver circuit 504b includes two sets of inverters (e.g., set of inverters 550 and 552) within each corresponding path between the global pre-decoder lines and the local pre-decoder lines.

In some embodiments, by memory circuit 500 including two sets of inverters (e.g., set of inverters 540 and 550) within a corresponding first path between the global pre-decoder lines and the local pre-decoder lines, and by memory circuit 500 including two sets of inverters (e.g., set of inverters 542 and 552) within a corresponding second path between the global pre-decoder lines and the local pre-decoder lines, the driving strength of the set of local pre-decoder signals PREDEC1_LOCAL or set of local pre-decoder signals PREDEC2_LOCAL from each of the set of inverters 540, 542, 550 and 552 is increased compared to other approaches, resulting in timing improvements of at least address setup time of memory circuit 500.

Memory circuit 500 is an embodiment of memory circuit 100 of FIG. 1 or memory circuit 200 of FIGS. 2A-2B, and similar detailed description is therefore omitted.

Memory circuit 500 includes a local control circuit 502, WL driver circuit 504a, WL driver circuit 504b, and conductive lines 260, 262, 350 and 352.

In comparison with memory circuit 400 of FIG. 4, local control circuit 502 replaces local control circuit 402 of FIG. 4, WL driver circuit 504a replaces WL driver circuit 404a of FIG. 4, WL driver circuit 504b replaces WL driver circuit 404b of FIG. 4, conductive lines 350 replace conductive lines 350a and 350b of FIG. 4, conductive lines 352 replace conductive lines 352a and 352b of FIG. 4, and similar detailed description is therefore omitted.

The set of WL circuits 504a includes the set of inverters 540 and 542.

The set of inverters 540 is configured to receive the set of global pre-decoder signals PREDEC1_GLOBAL[0:7]. The set of inverters 540 is configured to generate the set of local pre-decoder signals PREDEC1_LOCAL[0:7] in response to the set of global pre-decoder signals PREDEC1_GLOBAL[0:7]. In some embodiments, the set of local pre-decoder signals PREDEC1_LOCAL[0:7] is inverted from the set of global pre-decoder signals PREDEC1_GLOBAL[0:7]. The set of inverters 540 are positioned between conductive lines 260 and conductive lines 350.

The set of inverters 540 includes at least one of inverter 540a, 540b, . . . , 540g or 540h. Each inverter 540a, 540b, . . . , 540g or 540h of the set of inverters 540 is configured to receive a corresponding global pre-decoder signal of the set of global pre-decoder signals PREDEC1_GLOBAL[0:7] from conductive lines 260.

Each inverter 540a, 540b, . . . , 540g or 540h of the set of inverters 540 is configured to generate a corresponding local pre-decoder signal of the set of local pre-decoder signals PREDEC1_LOCAL[0:7] in response to the corresponding global pre-decoder signal of the set of global pre-decoder signals PREDEC1_GLOBAL[0:7]. In some embodiments, each local pre-decoder signal of the set of local pre-decoder signals PREDEC1_LOCAL[0:7] is inverted from the corresponding global pre-decoder signal of the set of global pre-decoder signals PREDEC1_GLOBAL[0:7].

Each inverter 540a, 540b, . . . , 540g or 540h of the set of inverters 540 is configured to output the corresponding local pre-decoder signal of the set of local pre-decoder signals PREDEC1_LOCAL[0:7] on conductive lines 350.

The set of inverters 542 is configured to receive the set of global pre-decoder signals PREDEC2_GLOBAL[0:7]. The set of inverters 542 is configured to generate the set of local pre-decoder signals PREDEC2_LOCAL[0:7] in response to the set of global pre-decoder signals PREDEC2_GLOBAL[0:7]. In some embodiments, the set of local pre-decoder signals PREDEC2_LOCAL[0:7] is inverted from the set of global pre-decoder signals PREDEC2_GLOBAL[0:7]. The set of inverters 542 are positioned between conductive lines 262 and conductive lines 352.

The set of inverters 542 includes at least one of inverter 542a, 542b, . . . , 542g or 542h. Each inverter 542a, 542b, . . . , 542g or 542h of the set of inverters 542 is configured to receive a corresponding global pre-decoder signal of the set of global pre-decoder signals PREDEC2_GLOBAL[0:7] from conductive lines 262.

Each inverter 542a, 542b, . . . , 542g or 542h of the set of inverters 542 is configured to generate a corresponding local pre-decoder signal of the set of local pre-decoder signals PREDEC2_LOCAL[0:7] in response to the corresponding global pre-decoder signal of the set of global pre-decoder signals PREDEC2_GLOBAL[0:7]. In some embodiments, each local pre-decoder signal of the set of local pre-decoder signals PREDEC2_LOCAL[0:7] is inverted from the corresponding global pre-decoder signal of the set of global pre-decoder signals PREDEC2_GLOBAL[0:7].

Each inverter 542a, 542b, . . . , 542g or 542h of the set of inverters 542 is configured to output the corresponding local pre-decoder signal of the set of local pre-decoder signals PREDEC2_LOCAL[0:7] on conductive lines 352.

The set of WL circuits 504b includes the set of inverters 550 and 552.

The set of inverters 550 is configured to receive the set of global pre-decoder signals PREDEC1_GLOBAL[0:7]. The set of inverters 550 is configured to generate the set of local pre-decoder signals PREDEC1_LOCAL[0:7] in response to the set of global pre-decoder signals PREDEC1_GLOBAL[0:7]. In some embodiments, the set of local pre-decoder signals PREDEC1_LOCAL[0:7] is inverted from the set of global pre-decoder signals PREDEC1_GLOBAL[0:7]. The set of inverters 550 are positioned between conductive lines 260 and conductive lines 350.

The set of inverters 550 includes at least one of inverter 550a, 550b, . . . , 550g or 550h. Each inverter 550a, 550b, . . . , 550g or 550h of the set of inverters 550 is configured to receive a corresponding global pre-decoder signal of the set of global pre-decoder signals PREDEC1_GLOBAL[0:7] from conductive lines 260.

Each inverter 550a, 550b, . . . , 550g or 550h of the set of inverters 550 is configured to generate a corresponding local pre-decoder signal of the set of local pre-decoder signals PREDEC1_LOCAL[0:7] in response to the corresponding global pre-decoder signal of the set of global pre-decoder signals PREDEC1_GLOBAL[0:7]. In some embodiments, each local pre-decoder signal of the set of local pre-decoder signals PREDEC1_LOCAL[0:7] is inverted from the corresponding global pre-decoder signal of the set of global pre-decoder signals PREDEC1_GLOBAL[0:7].

Each inverter 550a, 550b, . . . , 550g or 550h of the set of inverters 550 is configured to output the corresponding local pre-decoder signal of the set of local pre-decoder signals PREDEC1_LOCAL[0:7] on conductive lines 350.

The set of inverters 552 is configured to receive the set of global pre-decoder signals PREDEC2_GLOBAL[0:7]. The set of inverters 552 is configured to generate the set of local pre-decoder signals PREDEC2_LOCAL[0:7] in response to the set of global pre-decoder signals PREDEC2_GLOBAL[0:7]. In some embodiments, the set of local pre-decoder signals PREDEC2_LOCAL[0:7] is inverted from the set of global pre-decoder signals PREDEC2_GLOBAL[0:7]. The set of inverters 552 are positioned between conductive lines 262 and conductive lines 352.

The set of inverters 552 includes at least one of inverter 552a, 552b, . . . , 552g or 552h. Each inverter 552a, 552b, . . . , 552g or 552h of the set of inverters 552 is configured to receive a corresponding global pre-decoder signal of the set of global pre-decoder signals PREDEC2_GLOBAL[0:7] from conductive lines 262.

Each inverter 552a, 552b, . . . , 552g or 552h of the set of inverters 552 is configured to generate a corresponding local pre-decoder signal of the set of local pre-decoder signals PREDEC2_LOCAL[0:7] in response to the corresponding global pre-decoder signal of the set of global pre-decoder signals PREDEC2_GLOBAL[0:7]. In some embodiments, each local pre-decoder signal of the set of local pre-decoder signals PREDEC2_LOCAL[0:7] is inverted from the corresponding global pre-decoder signal of the set of global pre-decoder signals PREDEC2_GLOBAL[0:7].

Each inverter 552a, 552b, . . . , 552g or 552h of the set of inverters 552 is configured to output the corresponding local pre-decoder signal of the set of local pre-decoder signals PREDEC2_LOCAL[0:7] on conductive lines 352.

In some embodiments, conductive lines 350 are replaced with conductive lines 350a and 350b as shown in FIG. 4, and conductive lines 352 are replaced with conductive lines 352a and 352b as shown in FIG. 4, and similar detailed description is therefore omitted.

In some embodiments, other number of sets of inverters for at least one of the set of inverters 540, 542, 550 or 552 are within the scope of the present disclosure. In some embodiments, other number of inverters within at least one or more of the set of inverters 540, 542, 550 or 552 are within the scope of the present disclosure.

In some embodiments, the set of inverters 540, 542, 550 or 552 are replaced with a corresponding set of buffer circuits. In these embodiments, the set of local pre-decoder signals PREDEC1_LOCAL[0:7] are not inverted from the set of global pre-decoder signals PREDEC1_GLOBAL[0:7], and the set of local pre-decoder signals PREDEC2_LOCAL[0:7] are not inverted from the set of global pre-decoder signals PREDEC2_GLOBAL[0:7].

In some embodiments, memory circuit 500 operates to achieve one or more benefits described herein including the details discussed above with respect to at least one of memory circuit 300, 400 or 600.

Other configurations of memory circuit 500 are within the scope of the present disclosure.

Figure 6:
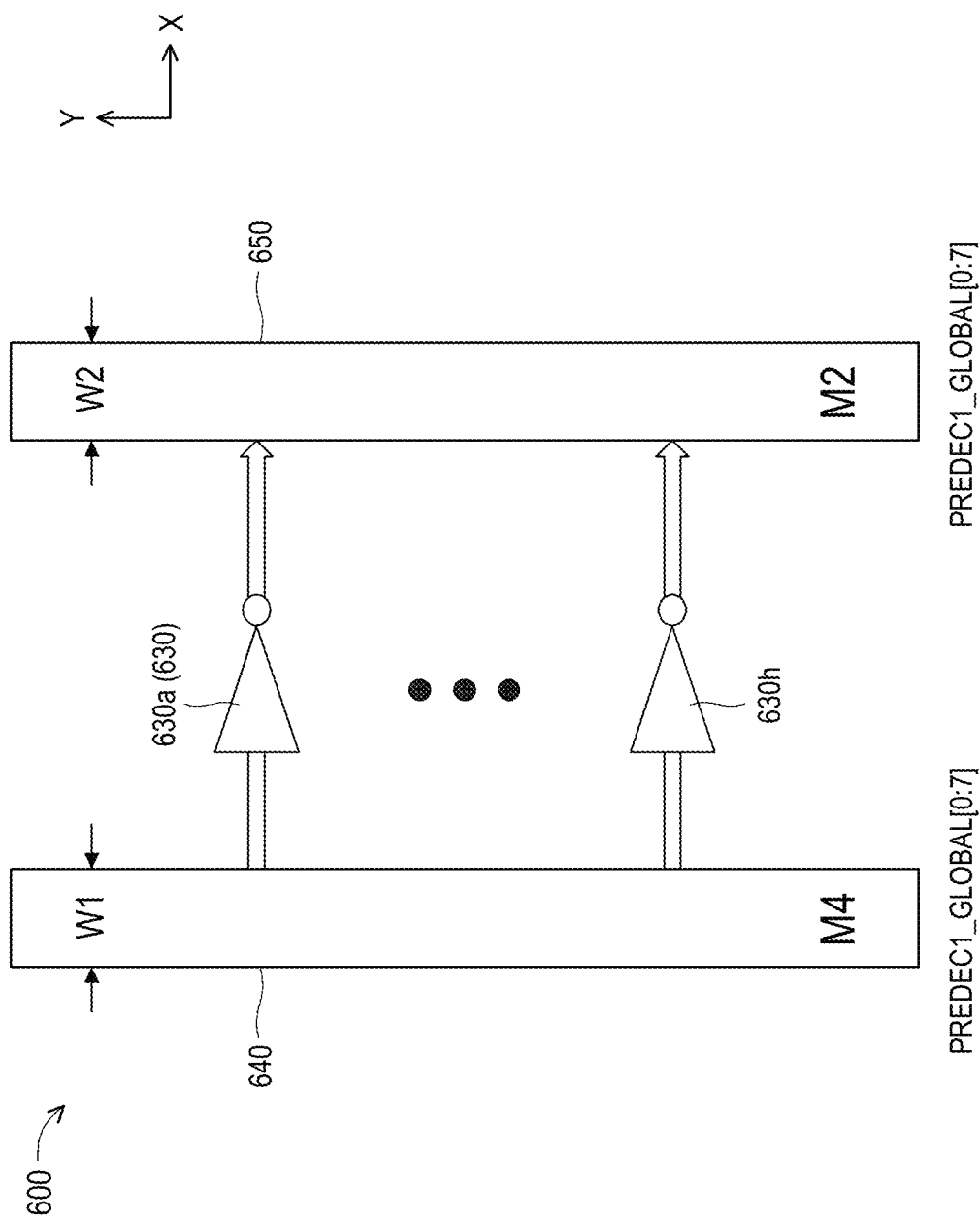
FIG. 6 is a circuit diagram of a memory circuit, in accordance with some embodiments.

FIG. 6 is a circuit diagram of a memory circuit 600, in accordance with some embodiments.

Memory circuit 600 is a variation of memory circuit 200 of FIGS. 2A-2B, memory circuit 300 of FIG. 3, memory circuit 400 of FIG. 4, and memory circuit 500 of FIG. 5, and similar detailed description is therefore omitted.

For example, memory circuit 600 illustrates a non-limiting example where a width W1 of conductive lines 640, and a width W2 of conductive lines 650 are shown.

In some embodiments, conductive lines 640 are useable as at least one of conductive lines 260 or 262, and conductive lines 650 are useable as at least one of conductive lines 250a and 252a, conductive lines 250b and 252b, conductive lines 250c and 252c, conductive lines 250d and 252d, conductive lines 350, conductive lines 352, conductive lines 350a and 350b or conductive lines 352a and 352b, and similar detailed description is therefore omitted.

Memory circuit 600 is an embodiment of memory circuit 200 of FIGS. 2A-2B, memory circuit 300 of FIG. 3, memory circuit 400 of FIG. 4, and memory circuit 500 of FIG. 5, and similar detailed description is therefore omitted.

Memory circuit 600 includes conductive lines 640 and 650 and a set of inverters 630.

In some embodiments, conductive lines 640 are an embodiment of at least one of conductive lines 260 or 262, conductive lines 650 are an embodiment of at least one of conductive lines 250a and 252a, conductive lines 250b and 252b, conductive lines 250c and 252c, conductive lines 250d and 252d, conductive lines 350, conductive lines 352, conductive lines 350a and 350b or conductive lines 352a and 352b, and set of inverters 630 is an embodiment of at least one of set of inverters 330, 332, 430, 432, 440, 442, 444, 446, 450, 452, 454, 456, 540, 542, 550 or 552, and similar detailed description is therefore omitted.

Each of conductive lines 640 and 650 extend in the second direction Y. Conductive lines 640 and 650 are separated from each other in the first direction X. Conductive lines 640 have a width W1 extending in the first direction. Conductive lines 650 have a width W2 extending in the first direction. In some embodiments, the width W1 is greater than the width W2. In some embodiments, a ratio between the width W2 and the width W1 ranges from about 0.60 to 0.80. In some embodiments, if the ratio between the width W2 and the width W1 is less than the range of about 0.60 to 0.80, then the resistance of conductive lines 650 increases thereby at least reducing the speed of address setup time of memory circuit 600 compared to other approaches, and the manufacturing yield of the conductive lines 650 is thereby reduced compared to other approaches.

In some embodiments, if the ratio between the width W2 and the width W1 is greater than the range of about 0.60 to 0.80, then the resistance of conductive lines 640 increases thereby at least reducing the speed of address setup time of memory circuit 600 compared to other approaches, and the manufacturing yield of the conductive lines 650 is thereby reduced compared to other approaches.

Other widths W1 or W2, lengths or shapes for at least one of conductive lines 640 or 650 are within the scope of the present disclosure.

Conductive lines 640 is on a first metal layer. Conductive lines 640 is on a second metal layer different from the first metal layer. In some embodiments, the first metal layer corresponds to a metal 4 (M4) layer memory circuit 600, and the second metal layer corresponds to a metal 2 (M2) layer memory circuit 600 that is positioned below the M4 metal layer. In these embodiments, a ratio of between the width W2 and the width W1 ranges from about 0.75 to about 0.8.

In some embodiments, the first metal layer corresponds to a metal 6 (M6) layer memory circuit 600, and the second metal layer corresponds to an M4 layer memory circuit 600 that is positioned below the M6 metal layer. In these embodiments, a ratio of between the width W2 and the width W1 ranges from about 0.55 to about 0.65.

Other configurations, arrangements on other metal layers or quantities of conductors in at least one of conductive lines 640 or 650 are within the scope of the present disclosure.

In some embodiments, by conductive lines 640 having width W1, and conductive lines 650 having width W2 causes the resistance of conductive lines 650 to be decreased, thereby resulting in timing improvements of at least address setup time of memory circuit 600. In some embodiments, by conductive lines 640 being on the first metal layer, and conductive lines 650 being on the second metal layer, causes the capacitance of at least conductive lines 640 or conductive lines 650 to be decreased, thereby resulting in timing improvements of at least address setup time of memory circuit 600.

Other configurations of memory circuit 600 are within the scope of the present disclosure.

Address Latch and Pre-Decoder Circuit

Figure 7:
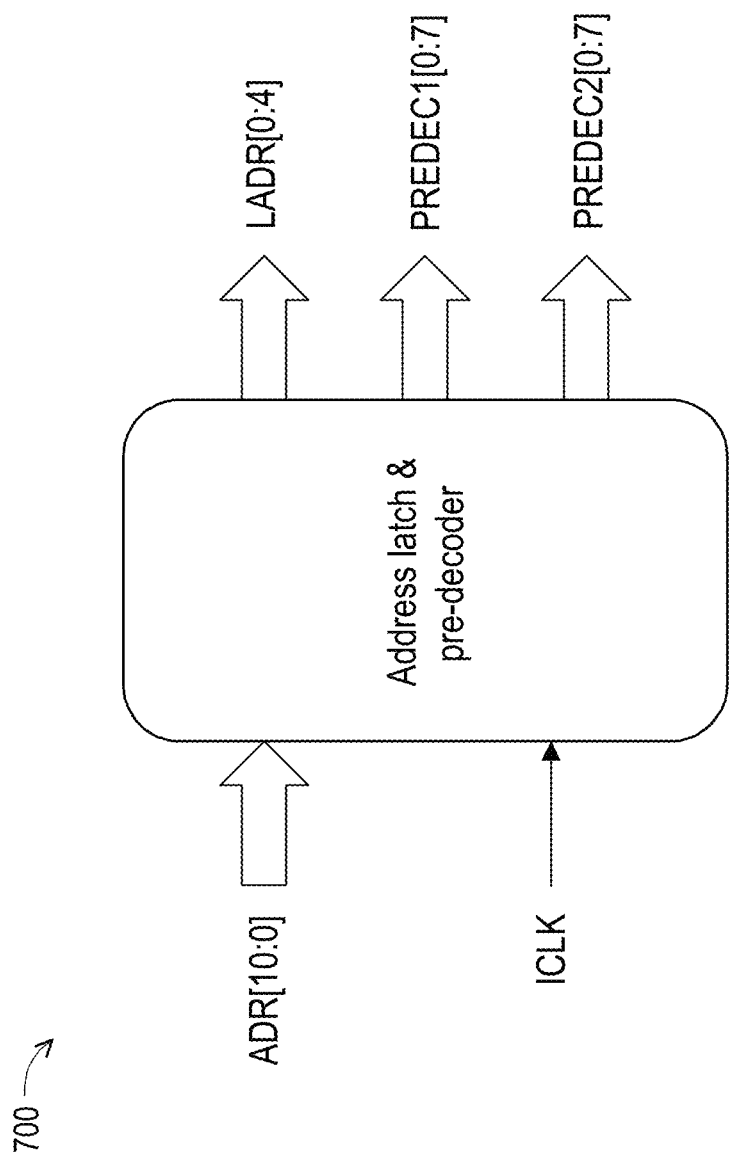
FIG. 7 is a circuit diagram of a circuit, in accordance with some embodiments.

FIG. 7 is a circuit diagram of a circuit 700, in accordance with some embodiments.

Circuit 700 is an embodiment of address latch and pre-decoder circuit 204 of FIGS. 2A-2B, and similar detailed description is therefore omitted.

Circuit 700 is configured to generate the set of address signals LADR[0:10], the set of global pre-decoder signals PREDEC1_GLOBAL and the set of global pre-decoder signals PREDEC2_GLOBAL in response to a memory address signal ADR[10:0] and clock signal ICLK.

Circuit 700 is configured to latch the memory address signal ADR[10:0] thereby generating the set of address signals LADR[0:10], and outputting the set of address signals LADR[0:4].

Circuit 700 is configured to pre-decode a portion of the set of address signals LADR[0:10] (e.g., second set of address signals LADR[5:7]) thereby generating the set of global pre-decoder signals PREDEC1_GLOBAL[0:7].

Circuit 700 is configured to pre-decode another portion of the set of address signals LADR[0:10] (e.g., third set of address signals LADR[8:10]) thereby generating the set of global pre-decoder signals PREDEC2_GLOBAL[0:7].

Other numbers of bits or bit locations for at least one of the memory address signal ADR, the set of address signals LADR[0:10], the first set of address signals LADR[0:4], the second set of address signals LADR[5:7], the third set of address signals LADR[8:10], the set of global pre-decoder signals PREDEC1_GLOBAL[0:7] or the set of global pre-decoder signals PREDEC2_GLOBAL[0:7] is within the scope of the present disclosure.

Other configurations of memory circuit 700 are within the scope of the present disclosure.

Figure 8:
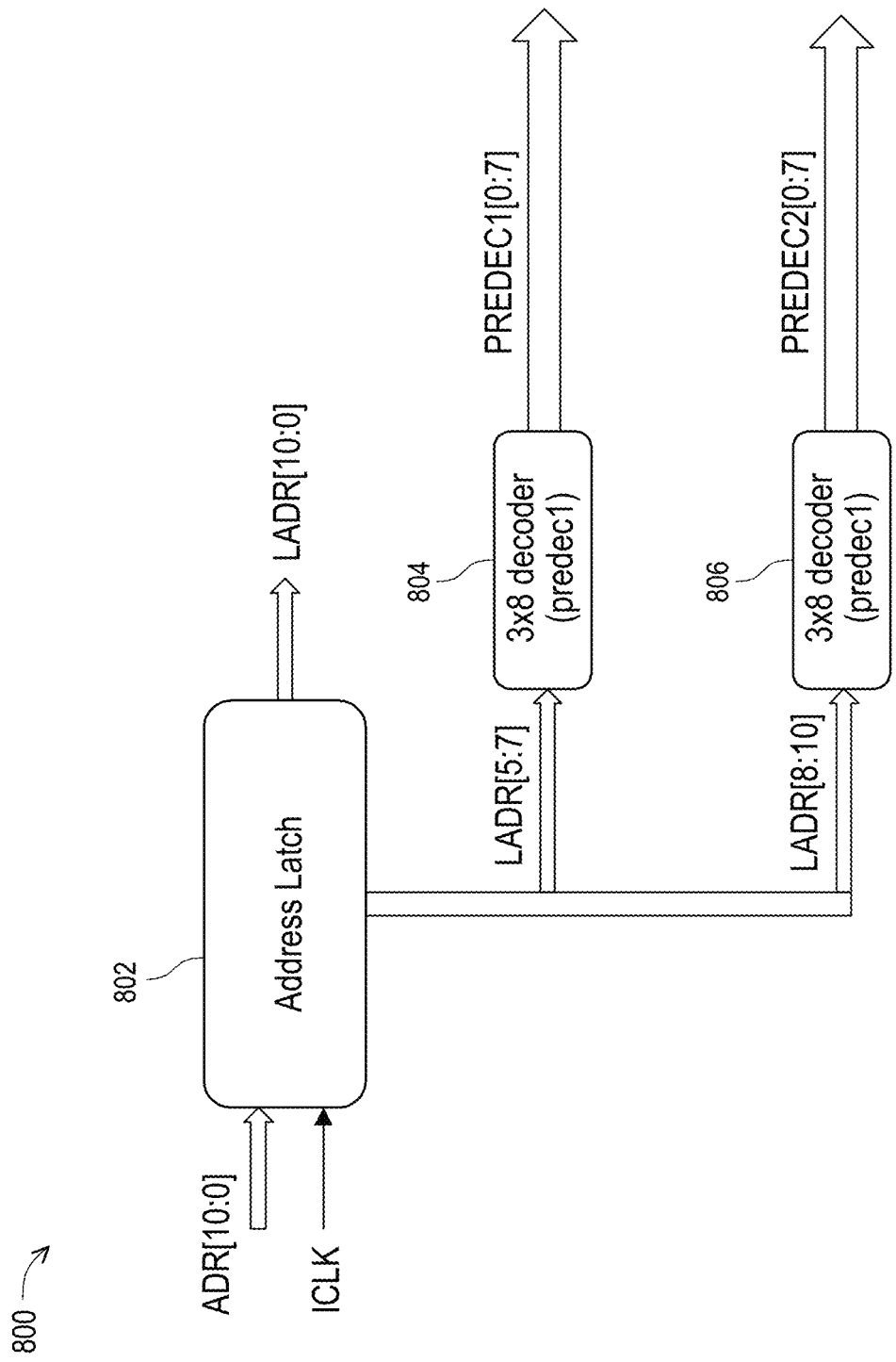
FIG. 8 is a circuit diagram of a circuit, in accordance with some embodiments.

FIG. 8 is a circuit diagram of a circuit 800, in accordance with some embodiments.

Circuit 800 is an embodiment of at least one of address latch and pre-decoder circuit 204 of FIGS. 2A-2B or circuit 700 of FIG. 7, and similar detailed description is therefore omitted.

Circuit 800 is configured to generate the set of address signals LADR[0:10], the set of global pre-decoder signals PREDEC1_GLOBAL and the set of global pre-decoder signals PREDEC2_GLOBAL in response to a memory address signal ADR[10:0] and clock signal ICLK.

Circuit 800 includes address latch circuit 802, a pre-decoder circuit 804 and a pre-decoder circuit 806.

Address latch circuit 802 is coupled to pre-decoder circuit 804 and pre-decoder circuit 806. Address latch circuit 802 is configured to generate the set of address signals LADR[0:10] in response to the memory address signal ADR[10:0] and clock signal ICLK.

Figure 10:
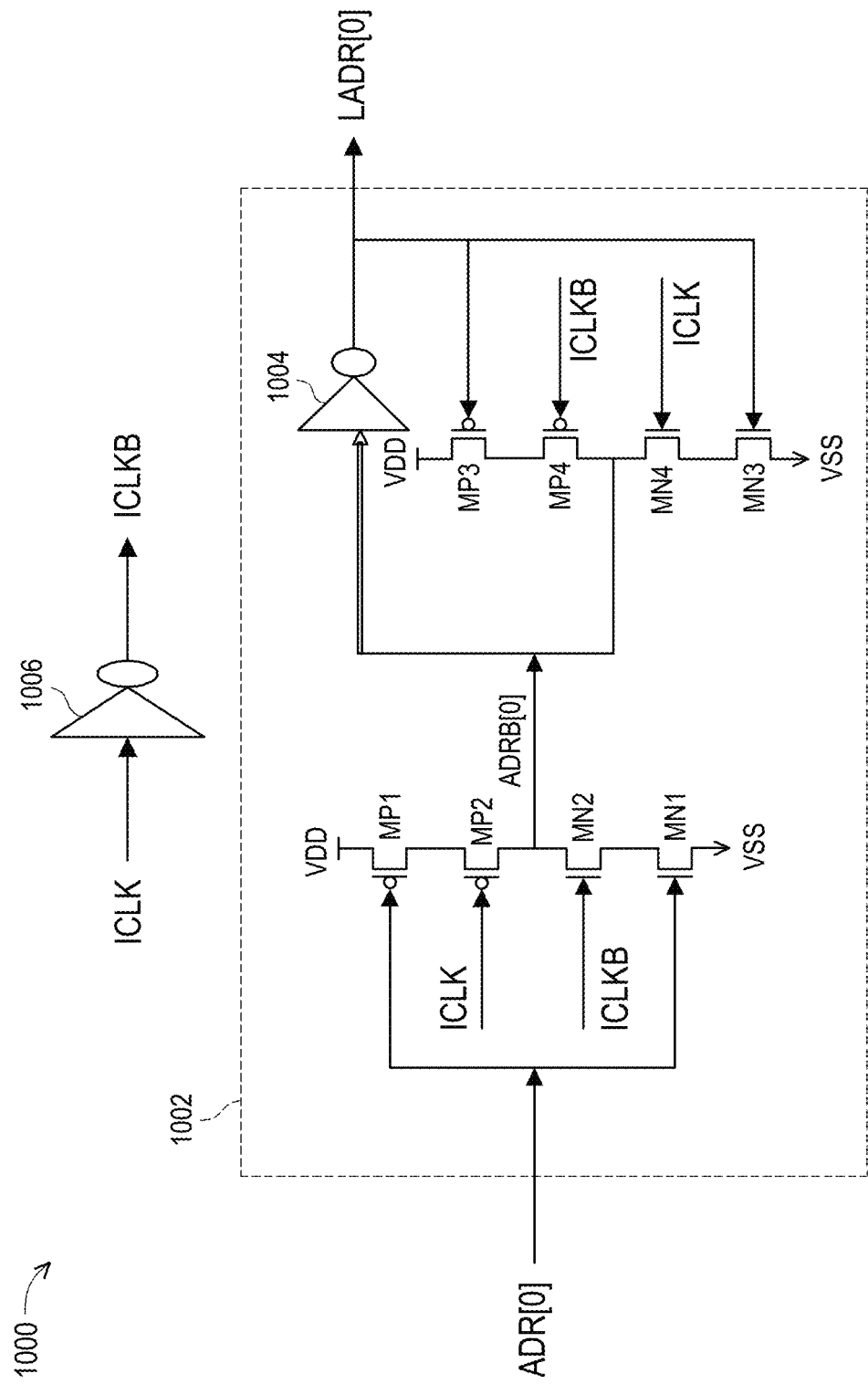
FIG. 10 is a circuit diagram of an address latch circuit, in accordance with some embodiments.

Address latch circuit 802 is coupled to and configured to output the set of address signals LADR[0:10] to a latch circuit 1002 (shown in FIG. 10). Address latch circuit 802 is configured to output the second set of address signals LADR[5:7] to pre-decoder circuit 804. Address latch circuit 802 is configured to output the third set of address signals LADR[8:10] to pre-decoder circuit 806.

Pre-decoder circuit 804 is configured to receive the second set of local address signals (LADR[5:7]). Pre-decoder circuit 804 is configured to generate the set of global pre-decoder signals PREDEC1_GLOBAL in response to at least the second set of local address signals (LADR[5:7]). In some embodiments, the pre-decoder circuit 804 is configured to generate the set of global pre-decoder signals PREDEC1_GLOBAL in response to at least the second set of local address signals (LADR[5:7]) or an inverted second set of local address signals (LADRB[5:7]).

In some embodiments, pre-decoder circuit 804 is a 3-input and an 8-output pre-decoder circuit. Other numbers of inputs or outputs for pre-decoder circuit 804 are within the scope of the present disclosure.

Pre-decoder circuit 806 is configured to receive the third set of local address signals (LADR[8:10]). Pre-decoder circuit 806 is configured to generate the set of global pre-decoder signals PREDEC2_GLOBAL in response to at least the third set of local address signals (LADR[8:10]). In some embodiments, the pre-decoder circuit 806 is configured to generate the set of global pre-decoder signals PREDEC2_GLOBAL in response to at least the third set of local address signals (LADR[8:10]) or an inverted third set of local address signals (LADRB[8:10]).

In some embodiments, pre-decoder circuit 806 is a 3-input and an 8-output pre-decoder circuit. Other numbers of inputs or outputs for pre-decoder circuit 806 are within the scope of the present disclosure.

Other configurations of memory circuit 800 are within the scope of the present disclosure.

Pre-Decoder Circuit

Figure 9A:
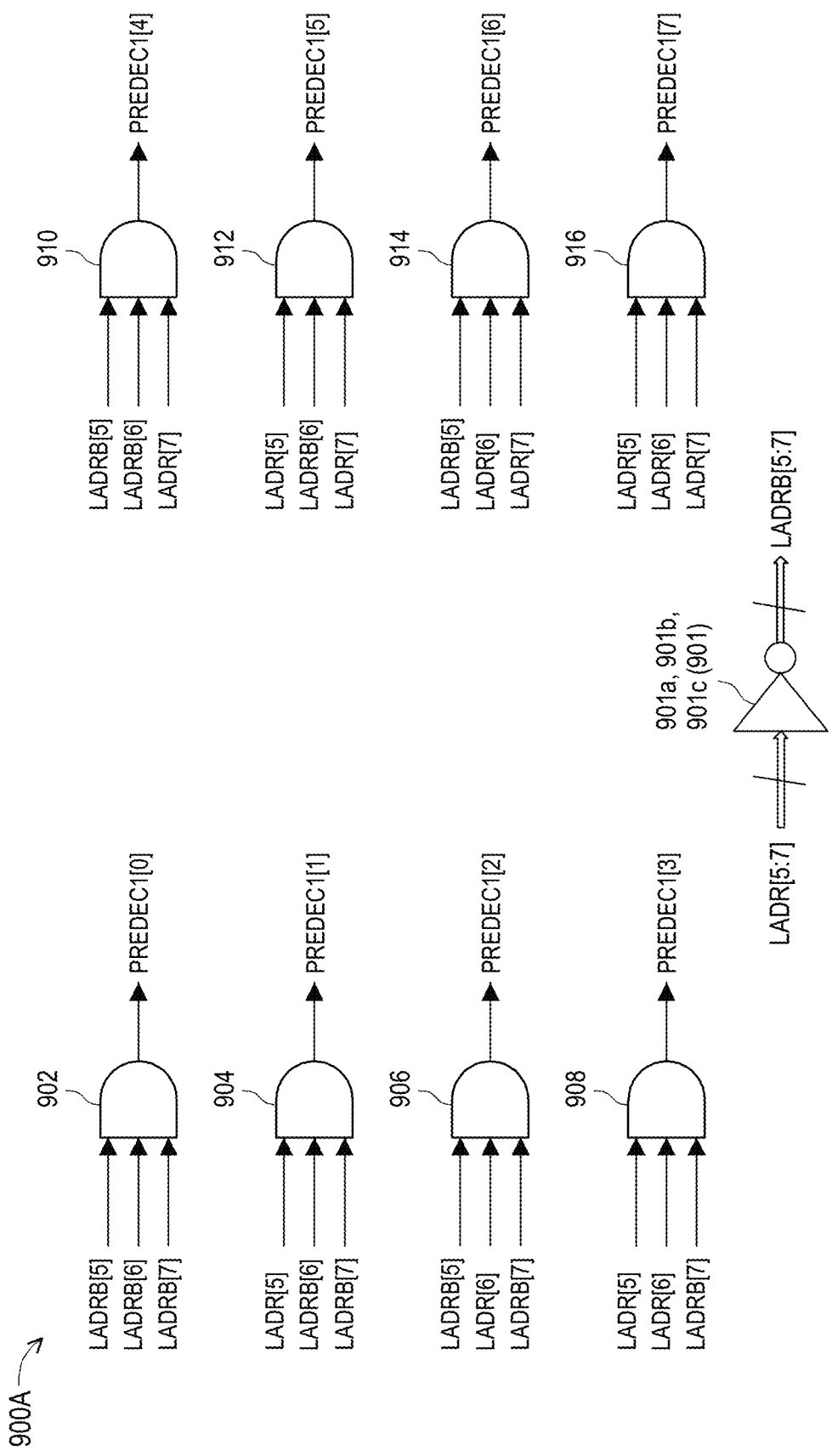
FIG. 9A is a circuit diagram of a pre-decoder circuit, in accordance with some embodiments.

FIG. 9A is a circuit diagram of a pre-decoder circuit 900A, in accordance with some embodiments.

Pre-decoder circuit 900A is an embodiment of pre-decoder circuit 804 of FIG. 8, and similar detailed description is therefore omitted.

Pre-decoder circuit 900A includes a set of inverters 901 coupled to AND logic gates 902, 904, 906, 908, 910, 912, 914 and 916. For ease of illustration, FIG. 9A does not show the set of inverters 901 as being coupled to AND logic gates 902, 904, 906, 908, 910, 912, 914, and 916.

The set of inverters 901 is configured to receive the second set of address signals LADR[5:7]. The set of inverters 901 is configured to generate an inverted second set of address signals LADRB[5:7] in response to the second set of address signals LADR[5:7]. In some embodiments, the inverted second set of address signals LADRB[5:7] is inverted from the second set of address signals LADR[5:7].

The set of inverters 901 includes at least one of inverter 901a, 901b or 901c. Each inverter 901a, 901b or 901c of the set of inverters 901 is configured to receive a corresponding address signal of the second set of address signals LADR[5:7].

Each inverter 901a, 901b or 901c of the set of inverters 901 is configured to generate a corresponding inverted address signal of the inverted second set of address signals LADRB[5:7] in response to the corresponding address signal of the second set of address signals LADR[5:7].

In some embodiments, each address signal of the second set of address signals LADR[5:7] is inverted from the corresponding inverted address signal of the inverted second set of address signals LADRB[5:7].

Each inverter 901a, 901b, or 901c of the set of inverters 901 is configured to output the corresponding inverted address signal of the inverted second set of address signals LADRB[5:7].

AND logic gate 902 is configured to generate the local pre-decoder signal PREDEC1[0] of the set of local pre-decoder signals PREDEC1_LOCAL[0:7] in response to the inverted address signal LADRB[5], the inverted address signal LADRB[6] and the inverted address signal LADRB[7].

A first input terminal of AND logic gate 902 is coupled to the output terminal of inverter 901a, a second input terminal of AND logic gate 902 is coupled to the output terminal of inverter 901b, and a third input terminal of AND logic gate 902 is coupled to the output terminal of inverter 901c.

The first input terminal of AND logic gate 902 is configured to receive the inverted address signal LADRB[5]. The second input terminal of AND logic gate 902 is configured to receive the inverted address signal LADRB[6]. The third input terminal of AND logic gate 902 is configured to receive the inverted address signal LADRB[7].

An output terminal of AND logic gate 902 is configured to output the local pre-decoder signal PREDEC1[0] of the set of local pre-decoder signals PREDEC1_LOCAL[0:7].

AND logic gate 904 is configured to generate the local pre-decoder signal PREDEC1[1] of the set of local pre-decoder signals PREDEC1_LOCAL[0:7] in response to the address signal LADR[5], the inverted address signal LADRB[6] and the inverted address signal LADRB[7].

A first input terminal of AND logic gate 904 is coupled to the input terminal of inverter 901a, a second input terminal of AND logic gate 904 is coupled to the output terminal of inverter 901b, and a third input terminal of AND logic gate 904 is coupled to the output terminal of inverter 901c.

The first input terminal of AND logic gate 904 is configured to receive the address signal LADR[5]. The second input terminal of AND logic gate 904 is configured to receive the inverted address signal LADRB[6]. The third input terminal of AND logic gate 904 is configured to receive the inverted address signal LADRB[7].

An output terminal of AND logic gate 904 is configured to output the local pre-decoder signal PREDEC1[1] of the set of local pre-decoder signals PREDEC1_LOCAL[0:7].

AND logic gate 906 is configured to generate the local pre-decoder signal PREDEC1[2] of the set of local pre-decoder signals PREDEC1_LOCAL[0:7] in response to the inverted address signal LADRB[5], the address signal LADR[6] and the inverted address signal LADRB[7].

A first input terminal of AND logic gate 906 is coupled to the output terminal of inverter 901a, a second input terminal of AND logic gate 906 is coupled to the input terminal of inverter 901b, and a third input terminal of AND logic gate 906 is coupled to the output terminal of inverter 901c.

The first input terminal of AND logic gate 906 is configured to receive the inverted address signal LADRB[5]. The second input terminal of AND logic gate 906 is configured to receive the address signal LADR[6]. The third input terminal of AND logic gate 906 is configured to receive the inverted address signal LADRB[7].

An output terminal of AND logic gate 906 is configured to output the local pre-decoder signal PREDEC1[2] of the set of local pre-decoder signals PREDEC1_LOCAL[0:7].

AND logic gate 908 is configured to generate the local pre-decoder signal PREDEC1[3] of the set of local pre-decoder signals PREDEC1_LOCAL[0:7] in response to the address signal LADR[5], the address signal LADR[6] and the inverted address signal LADRB[7].

A first input terminal of AND logic gate 908 is coupled to the input terminal of inverter 901a, a second input terminal of AND logic gate 908 is coupled to the input terminal of inverter 901b, and a third input terminal of AND logic gate 908 is coupled to the output terminal of inverter 901c.

The first input terminal of AND logic gate 908 is configured to receive the address signal LADR[5]. The second input terminal of AND logic gate 908 is configured to receive the address signal LADR[6]. The third input terminal of AND logic gate 908 is configured to receive the inverted address signal LADRB[7].

An output terminal of AND logic gate 908 is configured to output the local pre-decoder signal PREDEC1[3] of the set of local pre-decoder signals PREDEC1_LOCAL[0:7].

AND logic gate 910 is configured to generate the local pre-decoder signal PREDEC1[4] of the set of local pre-decoder signals PREDEC1_LOCAL[0:7] in response to the inverted address signal LADRB[5], the inverted address signal LADRB[6] and the address signal LADR[7].

A first input terminal of AND logic gate 910 is coupled to the output terminal of inverter 901a, a second input terminal of AND logic gate 910 is coupled to the output terminal of inverter 901b, and a third input terminal of AND logic gate 910 is coupled to the input terminal of inverter 901c.

The first input terminal of AND logic gate 910 is configured to receive the inverted address signal LADRB[5]. The second input terminal of AND logic gate 910 is configured to receive the inverted address signal LADRB[6]. The third input terminal of AND logic gate 910 is configured to receive the address signal LADR[7].

An output terminal of AND logic gate 910 is configured to output the local pre-decoder signal PREDEC1[4] of the set of local pre-decoder signals PREDEC1_LOCAL[0:7].

AND logic gate 912 is configured to generate the local pre-decoder signal PREDEC1[5] of the set of local pre-decoder signals PREDEC1_LOCAL[0:7] in response to the address signal LADR[5], the inverted address signal LADRB[6] and the address signal LADR[7].

A first input terminal of AND logic gate 912 is coupled to the input terminal of inverter 901a, a second input terminal of AND logic gate 912 is coupled to the output terminal of inverter 901b, and a third input terminal of AND logic gate 912 is coupled to the input terminal of inverter 901c.

The first input terminal of AND logic gate 912 is configured to receive the address signal LADR[5]. The second input terminal of AND logic gate 912 is configured to receive the inverted address signal LADRB[6]. The third input terminal of AND logic gate 912 is configured to receive the address signal LADR[7].

An output terminal of AND logic gate 912 is configured to output the local pre-decoder signal PREDEC1[5] of the set of local pre-decoder signals PREDEC1_LOCAL[0:7].

AND logic gate 914 is configured to generate the local pre-decoder signal PREDEC1[6] of the set of local pre-decoder signals PREDEC1_LOCAL[0:7] in response to the inverted address signal LADRB[5], the address signal LADR[6] and the address signal LADR[7].

A first input terminal of AND logic gate 914 is coupled to the output terminal of inverter 901a, a second input terminal of AND logic gate 914 is coupled to the input terminal of inverter 901b, and a third input terminal of AND logic gate 914 is coupled to the input terminal of inverter 901c.

The first input terminal of AND logic gate 914 is configured to receive the inverted address signal LADRB[5]. The second input terminal of AND logic gate 914 is configured to receive the address signal LADR[6]. The third input terminal of AND logic gate 914 is configured to receive the address signal LADR[7].

An output terminal of AND logic gate 914 is configured to output the local pre-decoder signal PREDEC1[6] of the set of local pre-decoder signals PREDEC1_LOCAL[0:7].

AND logic gate 916 is configured to generate the local pre-decoder signal PREDEC1[7] of the set of local pre-decoder signals PREDEC1_LOCAL[0:7] in response to the address signal LADRB[5], the address signal LADR[6] and the address signal LADR[7].

A first input terminal of AND logic gate 916 is coupled to the input terminal of inverter 901a, a second input terminal of AND logic gate 916 is coupled to the input terminal of inverter 901b, and a third input terminal of AND logic gate 916 is coupled to the input terminal of inverter 901c.

The first input terminal of AND logic gate 916 is configured to receive the address signal LADR[5]. The second input terminal of AND logic gate 916 is configured to receive the address signal LADR[6]. The third input terminal of AND logic gate 916 is configured to receive the address signal LADR[7].

An output terminal of AND logic gate 916 is configured to output the local pre-decoder signal PREDEC1[7] of the set of local pre-decoder signals PREDEC1_LOCAL[0:7].

Other configurations, numbers of circuit elements or types of circuit elements of pre-decoder circuit 900A are within the scope of the present disclosure.

Figure 9B:
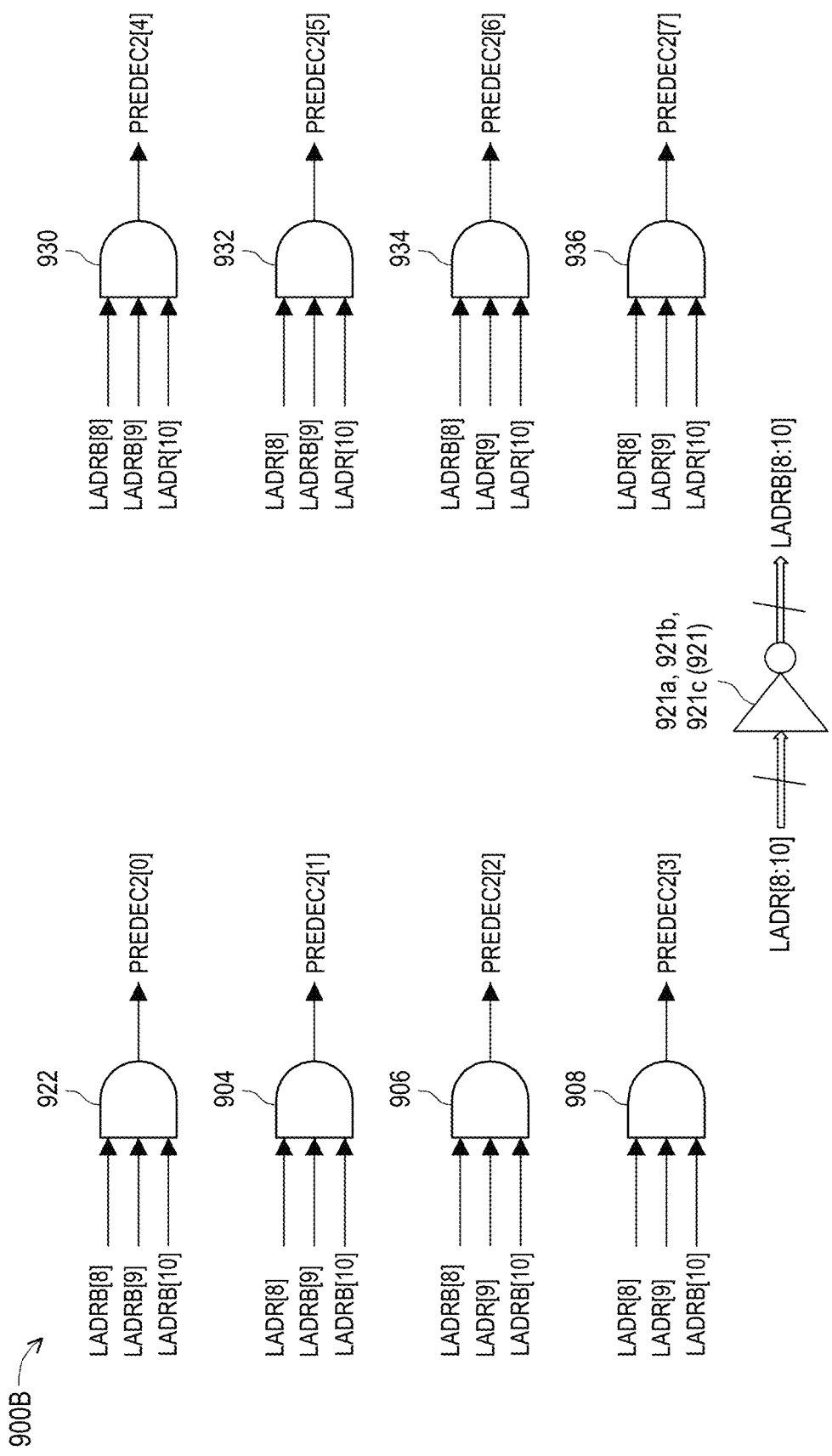
FIG. 9B is a circuit diagram of a pre-decoder circuit, in accordance with some embodiments.

FIG. 9B is a circuit diagram of a pre-decoder circuit 900B, in accordance with some embodiments.

Pre-decoder circuit 900B is an embodiment of pre-decoder circuit 806 of FIG. 8, and similar detailed description is therefore omitted.

Pre-decoder circuit 900B includes a set of inverters 921 coupled to AND logic gates 922, 924, 926, 928, 930, 932, 934 and 936. For ease of illustration, FIG. 9B does not show the set of inverters 921 as being coupled to AND logic gates 922, 924, 926, 928, 930, 932, 934, and 936.

Pre-decoder circuit 900B is a variation of pre-decoder circuit 900A, and similar detailed description is therefore omitted. In comparison with pre-decoder circuit 900A, the set of inverters 921 replaces the set of inverters 901, AND logic gates 922, 924, 926, 928, 930, 932, 934 and 936 replaces corresponding AND logic gates 902, 904, 906, 908, 910, 912, 914 and 916, and similar detailed description is therefore omitted. In comparison with pre-decoder circuit 900A, inverter 921a, 921b or 921c replaces inverter 901a, 901b or 901c, and similar detailed description is therefore omitted.

The set of inverters 921 includes at least one of inverter 921a, 921b or 921c. Each inverter 921a, 921b or 921c of the set of inverters 921 is configured to receive a corresponding address signal of the second set of address signals LADR[8:10].

Each inverter 921a, 921b or 921c of the set of inverters 921 is configured to generate a corresponding inverted address signal of the second set of address signals LADRB[8:10] in response to the corresponding address signal of the second set of address signals LADR[8:10].

In some embodiments, each address signal of the second set of address signals LADR[8:10] is inverted from the corresponding inverted address signal of the inverted second set of address signals LADRB[8:10].

Each inverter 921a, 921b, or 921c of the set of inverters 921 is configured to output the corresponding inverted address signal of the inverted second set of address signals LADRB[8:10].

The description of FIG. 9B is similar to FIG. 9A, each of the details of FIG. 9B will not be described for brevity.

For example, inverter 901a, 901b, or 901c of the set of inverters 901 of FIG. 9A can be substituted with corresponding inverter 921a, 921b, or 921c of the set of inverters 921, AND logic gates 902, 904, 906, 908, 910, 912, 914 and 916 of FIG. 9A can be substituted with corresponding AND logic gates 922, 924, 926, 928, 930, 932, 934 and 936, the set of local pre-decoder signals PREDEC1_LOCAL[0:7] of FIG. 9A can be substituted with the corresponding set of local pre-decoder signals PREDEC2_LOCAL[0:7], local pre-decoder signal PREDEC1[0] can be substituted with corresponding local pre-decoder signal PREDEC2[0], local pre-decoder signal PREDEC1[1] can be substituted with corresponding local pre-decoder signal PREDEC2[1], local pre-decoder signal PREDEC1[2] can be substituted with corresponding local pre-decoder signal PREDEC2[2], local pre-decoder signal PREDEC1[3] can be substituted with corresponding local pre-decoder signal PREDEC2[3], local pre-decoder signal PREDEC1[4] can be substituted with corresponding local pre-decoder signal PREDEC2[4], local pre-decoder signal PREDEC1[5] can be substituted with corresponding local pre-decoder signal PREDEC2[5], local pre-decoder signal PREDEC1[6] can be substituted with corresponding local pre-decoder signal PREDEC2[6], local pre-decoder signal PREDEC1[7] can be substituted with corresponding local pre-decoder signal PREDEC2[7], the address signal LADR[5], the address signal LADR[6], the address signal LADR[7], the inverted address signal LADRB[5], the inverted address signal LADRB[6] and the inverted address signal LADRB[7] can be substituted with the corresponding address signal LADR[8], the address signal LADR[9], the address signal LADR[10], the inverted address signal LADRB[8], the inverted address signal LADRB[9] and the inverted address signal LADRB[10], and similar detailed description is therefore omitted.

Other configurations, numbers of circuit elements or types of circuit elements of pre-decoder circuit 900B are within the scope of the present disclosure.

Address Latch Circuit

FIG. 10 is a circuit diagram of an address latch circuit 1000, in accordance with some embodiments.

Address latch circuit 1000 is an embodiment of address latch circuit 802 of FIG. 8, and similar detailed description is therefore omitted.

Address latch circuit 1000 includes an inverter 1002, an inverter 1004, p-type metal oxide semiconductor (PMOS) transistors MP1, MP2, MP3 and MP4, and n-type metal oxide semiconductor (NMOS) transistors MN1, MN2, MN3 and MN4.

An input terminal of inverter 1002 is configured to receive the clock signal ICLK. Inverter 1002 is configured to generate an inverted clock signal ICLKB in response to the clock signal ICLK. In some embodiments, the inverted clock signal ICLKB is inverted from the clock signal ICLK. An output terminal of inverter 1002 is configured to output the inverted clock signal ICLKB.

Inverter 1002 is coupled to NMOS transistors MN2 and MN4, and PMOS transistors MP2 and MP4. For ease of illustration, FIG. 10 does not show the inverter 1002 as being coupled to NMOS transistors MN2 and MN4, and PMOS transistors MP2 and MP4.

While address latch circuit 1000 of FIG. 10 is shown as generating an address signal (e.g., local address signal LADR[0]) of the set of address signals LADR[0:10] in response to memory address signal ADR[0] of memory address signal ADR[0:10], corresponding local address signal LADR[1], LADR[2], . . . , LADR[10] of the set of address signals LADR[0:10] can be generated, by a circuit similar to address latch circuit 1000, in response to corresponding memory address signal ADR[1], ADR[2], . . . , ADR[10] of memory address signal ADR[0:10], and similar detailed description is therefore omitted.

PMOS transistors MP1 and MP2 and NMOS transistors MN2 and MN1 are configured to generate an inverted address signal ADRB[0] in response to at least address signal ADR[0], clock signal ICLK or inverted clock signal ICLKB.

In some embodiments, if inverted clock signal ICLKB is logically high, and clock signal ICLK is logically low, then PMOS transistors MP1 and MP2 and NMOS transistors MN2 and MN1 are configured as an inverter.

A gate terminal of PMOS transistor MP1 is coupled to at least a gate terminal of NMOS transistor MN1. The gate terminal of PMOS transistor MP1 and the gate terminal of NMOS transistor MN1 are configured to receive the address signal ADR[0]. PMOS transistor MP1 and NMOS transistor MN1 are turned on or off based on address signal ADR[0]. A source terminal of PMOS transistor MP1 is coupled with voltage supply VDD. A drain terminal of PMOS transistor MP1 is coupled with a source terminal of PMOS transistor MP2.

A gate terminal of PMOS transistor MP2 is coupled to the input terminal of inverter 1002, and configured to receive clock signal ICLK. PMOS transistor MP2 is turned on or off based on clock signal ICLK.

Each of a drain terminal of PMOS transistor MP2, a drain terminal of NMOS transistor MN2, an input terminal of inverter 1004, a drain terminal of PMOS transistor MP4 and a drain terminal of NMOS transistor MN4 are coupled to each other. In some embodiments, the drain terminal of PMOS transistor MP2 and the drain terminal of NMOS transistor MN2 are configured to generate an inverted address signal ADRB[0]. In some embodiments, the drain terminal of PMOS transistor MP4 and the drain terminal of NMOS transistor MN4 are configured to generate an inverted address signal ADRB[0]. In some embodiments, address signal ADR[0] is inverted from inverted address signal ADRB[0].

A gate terminal of NMOS transistor MN2 is coupled to the output terminal of inverter 1002, and configured to receive inverted clock signal ICLKB. NMOS transistor MN2 is turned on or off based on inverted clock signal ICLKB. A source terminal of NMOS transistor MN2 and a drain terminal of NMOS transistor MN1 are coupled to each other.

A source terminal of NMOS transistor MN1 is coupled with at least the reference supply node VSS.

Inverter 1004 is configured to generate address signal LADR[0] in response to at least inverted address signal ADRB[0]. In some embodiments, the inverted address signal ADRB[0] is inverted from the address signal LADR[0]. An input terminal of inverter 1004 is configured to receive the inverted address signal ADRB[0]. An output terminal of inverter 1004 is configured to output the address signal LADR[0].

In some embodiments, if inverted clock signal ICLKB is logically low, and clock signal ICLK is logically high, then PMOS transistors MP3 and MP4 and NMOS transistors MN4 and MN3 are configured as an inverter.

Each of a gate terminal of PMOS transistor MP3, a gate terminal of NMOS transistor MN3 and an output terminal of inverter 1004 are coupled to each other. In some embodiments, the address signal LADR[0] is fed back to inverter 1004, thereby latching the address signal LADR[0]. Stated differently, the address signal LADR[0] is latched by inverter 1004, PMOS transistors MP3 and MP4 and NMOS transistors MN4 and MN3.

The gate terminal of PMOS transistor MP3 and the gate terminal of NMOS transistor MN3 are configured to receive the address signal LADR[0]. PMOS transistor MP3 and NMOS transistor MN3 are turned on or off based on address signal LADR[0]. A source terminal of PMOS transistor MP3 is coupled with voltage supply VDD. A drain terminal of PMOS transistor MP3 is coupled with a source terminal of PMOS transistor MP4.

A gate terminal of PMOS transistor MP4 is coupled to the output terminal of inverter 1002, and configured to receive inverted clock signal ICLKB. PMOS transistor MP4 is turned on or off based on inverted clock signal ICLKB.

A gate terminal of NMOS transistor MN4 is coupled to the input terminal of inverter 1002, and configured to receive clock signal ICLK. NMOS transistor MN4 is turned on or off based on clock signal ICLK. A source terminal of NMOS transistor MN4 and a drain terminal of NMOS transistor MN3 are coupled to each other.

A source terminal of NMOS transistor MN3 is coupled with at least the reference supply node VSS.

Address latch circuit 1000 is configured to operate in a standby mode and a latch mode. In some embodiments, during the standby mode, clock signal CLK (shown in FIGS. 2A-2B) is logically low, clock signal ICLK is logically low thereby turning on PMOS transistor MP2, and inverted clock signal ICLKB is logically high, thereby turning on NMOS transistor MN2. In response to PMOS transistor MP2 and NMOS transistor MN2 turning on, PMOS transistors MP1 and MP2 and NMOS transistors MN2 and MN1 are configured as an inverter, and inverted address signal ADRB[0] is inverted from address signal ADR[0], and inverter 1004 is configured to invert the inverted address signal ADRB[0], thereby generating address signal LADR[0].

In some embodiments, during the latch mode, a read/write operation of at least one of memory cell array 210a or 210b is performed, and the inverter 1004, PMOS transistors MP3 and MP4 and NMOS transistors MN4 and MN3 are configured to latch the address signal LADR[0] or inverted address signal ADRB[0]. For example, in these embodiments, clock signal CLK (shown in FIGS. 2A-2B) is logically high, clock signal ICLK is logically high thereby turning off PMOS transistor MP2, and inverted clock signal ICLKB is logically low, thereby turning off NMOS transistor MN2. In response to PMOS transistor MP2 and NMOS transistor MN2 turning off, address signal ADR[0] is not set by PMOS transistor MP2 and NMOS transistor MN2. In these embodiments, clock signal ICLK is logically high thereby turning on NMOS transistor MN4, and inverted clock signal ICLKB is logically low, thereby turning on PMOS transistor MP4. In response to PMOS transistor MP4 and NMOS transistor MN4 turning on, then PMOS transistors MP3 and MP4 and NMOS transistors MN4 and MN3 are configured as an inverter, and are configured to set or latch the inverted address signal ADRB[0] by inverting address signal LADR[0].

Other configurations, numbers of circuit elements or types of circuit elements of address latch circuit 1000 are within the scope of the present disclosure.

Clock Pre-Decoder Circuit

Figure 11:
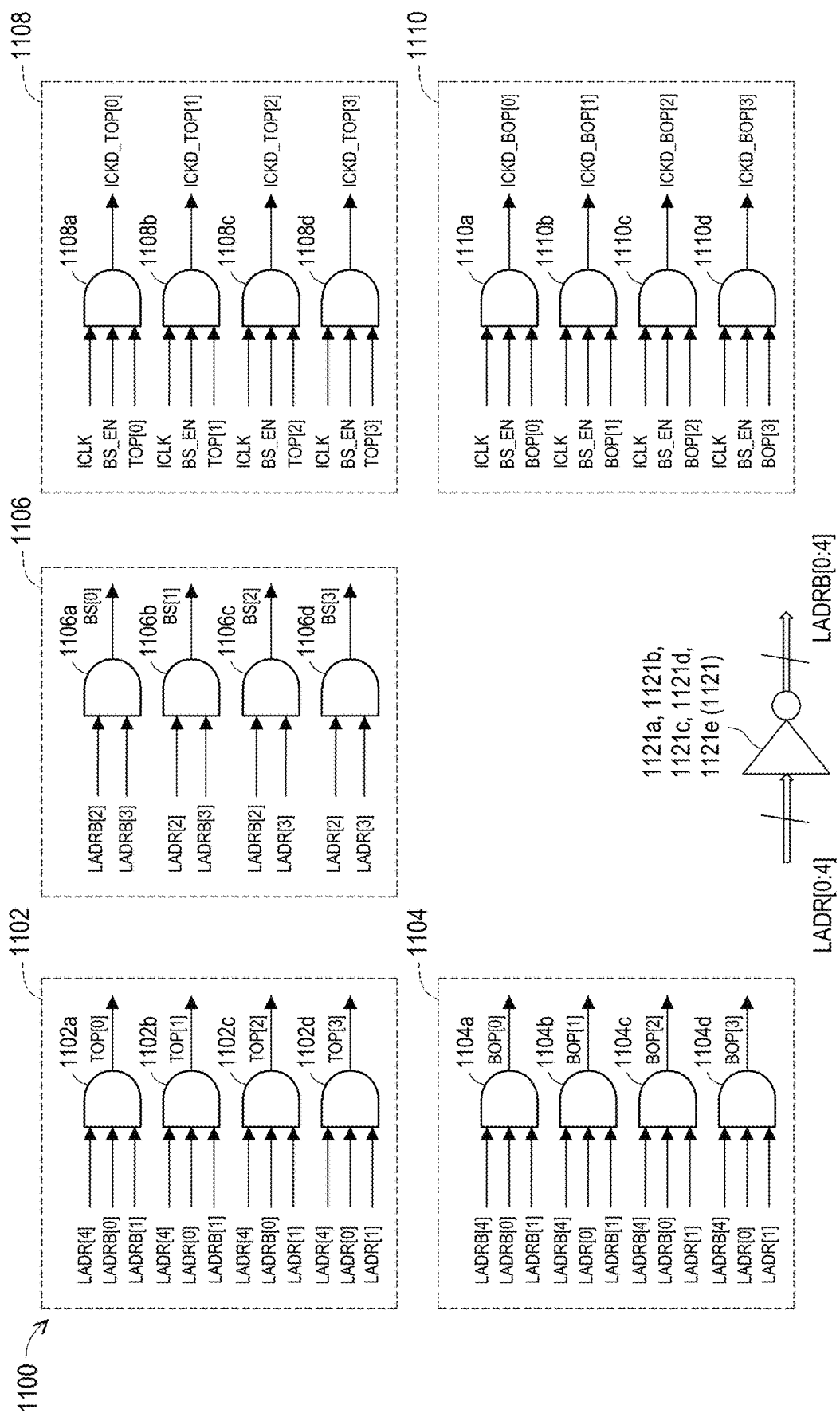
FIG. 11 is a circuit diagram of a clock pre-decoder circuit, in accordance with some embodiments.

FIG. 11 is a circuit diagram of a clock pre-decoder circuit 1100, in accordance with some embodiments.

Clock pre-decoder circuit 1100 is an embodiment of at least one clock pre-decoder circuit 220a, 220b, 220c or 220d of the set of clock pre-decoder circuits 220 of FIGS. 2A-2B, and similar detailed description is therefore omitted.

Clock pre-decoder circuit 1100 includes a set of inverters 1121, a set of AND logic gates 1102, a set of AND logic gates 1104, a set of AND logic gates 1106, a set of AND logic gates 1108 and a set of AND logic gates 1110. The set of inverters 1101 is coupled to each of the set of AND logic gates 1102, the set of AND logic gates 1104, the set of AND logic gates 1106, the set of AND logic gates 1108 and the set of AND logic gates 1110. For ease of illustration, FIG. 11 does not show the set of inverters 1121 as being coupled to each of the set of AND logic gates 1102, 1104, 1106, 1108 and 1110.

The set of inverters 1121 is configured to receive the first set of address signals LADR[0:4]. The set of inverters 1121 is configured to generate an inverted first set of address signals LADRB[0:4] in response to the first set of address signals LADR[0:4]. In some embodiments, the inverted first set of address signals LADRB[0:4] is inverted from the first set of address signals LADR[0:4].

The set of inverters 1121 includes at least one of inverter 1121a, 1121b, 1121c, 1121d or 1121e. Each inverter 1121a, 1121b, 1121c, 1121d or 1121e of the set of inverters 1121 is configured to receive a corresponding address signal of the first set of address signals LADR[0:4].

Each inverter 1121a, 1121b, 1121c, 1121d or 1121e of the set of inverters 1121 is configured to generate a corresponding inverted address signal of the first set of address signals LADRB[0:4] in response to the corresponding address signal of the first set of address signals LADR[0:4].

In some embodiments, each address signal of the first set of address signals LADR[0:4] is inverted from the corresponding inverted address signal of the inverted first set of address signals LADRB[0:4].

Each inverter 1121a, 1121b, or 1121c of the set of inverters 1121 is configured to output the corresponding inverted address signal of the inverted first set of address signals LADRB[0:4].

The set of AND logic gates 1102 is configured to generate a set of signals TOP[0:3] in response to at least a portion of the first set of address signals LADR[0:4] or a portion of the inverted first set of address signals LADRB[0:4]. The set of AND logic gates 1102 includes at least one of AND logic gate 1102a, 1102b, 1102c or 1102d.

In some embodiments, at least one of the set of signals TOP[0:3] includes 4 bits, and the 4 bits are located at bit positions 0:3 in the corresponding set of signals TOP[0:3]. Other numbers of bits or bit locations for at least one of the set of signals TOP[0:3] is within the scope of the present disclosure.

AND logic gate 1102a is configured to generate a signal TOP[0] of a set of signals TOP[0:3] in response to the address signal LADR[4], the inverted address signal LADRB[0] and the inverted address signal LADRB[1].

A first input terminal of AND logic gate 1102a is coupled to the input terminal of inverter 1121a, a second input terminal of AND logic gate 1102a is coupled to the output terminal of inverter 1121b, and a third input terminal of AND logic gate 1102a is coupled to the output terminal of inverter 1121e.

The first input terminal of AND logic gate 1102a is configured to receive the address signal LADR[4]. The second input terminal of AND logic gate 1102a is configured to receive the inverted address signal LADRB[0]. The third input terminal of AND logic gate 1102a is configured to receive the inverted address signal LADRB[1].

An output terminal of AND logic gate 1102a is configured to output the signal TOP[0] of the set of signals TOP[0:3].

AND logic gate 1102b is configured to generate the signal TOP[1] of the set of signals TOP[0:3] in response to the address signal LADR[4], the address signal LADR[0] and the inverted address signal LADRB[1].

A first input terminal of AND logic gate 1102b is coupled to the input terminal of inverter 1121a, a second input terminal of AND logic gate 1102b is coupled to the input terminal of inverter 1121b, and a third input terminal of AND logic gate 1102b is coupled to the output terminal of inverter 1121e.

The first input terminal of AND logic gate 1102b is configured to receive the address signal LADR[4]. The second input terminal of AND logic gate 1102b is configured to receive the address signal LADR[0]. The third input terminal of AND logic gate 1102b is configured to receive the inverted address signal LADRB[1].

An output terminal of AND logic gate 1102*b* is configured to output the signal TOP[1] of the set of signals TOP[0:3].

AND logic gate 1102*c* is configured to generate the signal TOP[2] of the set of signals TOP[0:3] in response to the address signal LADR[4], the inverted address signal LADRB[0] and the address signal LADR[1].

A first input terminal of AND logic gate 1102*c* is coupled to the input terminal of inverter 1121*a*, a second input terminal of AND logic gate 1102*c* is coupled to the output terminal of inverter 1121*b*, and a third input terminal of AND logic gate 1102*c* is coupled to the input terminal of inverter 1121*e*.

The first input terminal of AND logic gate 1102*c* is configured to receive the address signal LADR[4]. The second input terminal of AND logic gate 1102*c* is configured to receive the inverted address signal LADRB[0]. The third input terminal of AND logic gate 1102*c* is configured to receive the address signal LADR[1].

An output terminal of AND logic gate 1102*c* is configured to output the signal TOP[2] of the set of signals TOP[0:3].

AND logic gate 1102*d* is configured to generate the signal TOP[3] of the set of signals TOP[0:3] in response to the address signal LADR[4], the address signal LADR[0] and the address signal LADR[1].

A first input terminal of AND logic gate 1102*d* is coupled to the input terminal of inverter 1121*a*, a second input terminal of AND logic gate 1102*d* is coupled to the input terminal of inverter 1121*b*, and a third input terminal of AND logic gate 1102*d* is coupled to the input terminal of inverter 1121*e*.

The first input terminal of AND logic gate 1102*d* is configured to receive the address signal LADR[4]. The second input terminal of AND logic gate 1102*d* is configured to receive the address signal LADR[0]. The third input terminal of AND logic gate 1102*d* is configured to receive the address signal LADR[1].

An output terminal of AND logic gate 1102*d* is configured to output the signal TOP[3] of the set of signals TOP[0:3].

The set of AND logic gates 1104 is configured to generate a set of signals BOT[0:3] in response to at least a portion of the first set of address signals LADR[0:4] or a portion of the inverted first set of address signals LADRB[0:4]. The set of AND logic gates 1104 includes at least one of AND logic gate 1104*a*, 1104*b*, 1104*c* or 1104*d*.

In some embodiments, at least one of the set of signals BOT[0:3] includes 4 bits, and the 4 bits are located at bit positions 0:3 in the corresponding set of signals BOT[0:3]. Other numbers of bits or bit locations for at least one of the set of signals BOT[0:3] is within the scope of the present disclosure.

AND logic gate 1104*a* is configured to generate the signal BOT[0] of the set of signals BOT[0:3] in response to the inverted address signal LADRB[4], the inverted address signal LADRB[0] and the inverted address signal LADRB[1]

A first input terminal of AND logic gate 1104*a* is coupled to the output terminal of inverter 1121*a*, a second input terminal of AND logic gate 1104*a* is coupled to the output terminal of inverter 1121*b*, and a third input terminal of AND logic gate 1104*a* is coupled to the output terminal of inverter 1121*e*.

The first input terminal of AND logic gate 1104*a* is configured to receive the inverted address signal LADRB[4]. The second input terminal of AND logic gate 1104*a* is configured to receive the inverted address signal LADRB[0]. The third input terminal of AND logic gate 1104*a* is configured to receive the inverted address signal LADRB[1].

An output terminal of AND logic gate 1104*a* is configured to output the signal BOT[0] of the set of signals BOT[0:3].

AND logic gate 1104*b* is configured to generate the signal BOT[1] of the set of signals BOT[0:3] in response to the inverted address signal LADRB[4], the address signal LADR[0] and the inverted address signal LADRB[1].

A first input terminal of AND logic gate 1104*b* is coupled to the output terminal of inverter 1121*a*, a second input terminal of AND logic gate 1104*b* is coupled to the input terminal of inverter 1121*b*, and a third input terminal of AND logic gate 1104*b* is coupled to the output terminal of inverter 1121*e*.

The first input terminal of AND logic gate 1104*b* is configured to receive the inverted address signal LADRB[4]. The second input terminal of AND logic gate 1104*b* is configured to receive the address signal LADR[0]. The third input terminal of AND logic gate 1104*b* is configured to receive the inverted address signal LADRB[1].

An output terminal of AND logic gate 1104*b* is configured to output the signal BOT[1] of the set of signals BOT[0:3].

AND logic gate 1104*c* is configured to generate the signal BOT[2] of the set of signals BOT[0:3] in response to the inverted address signal LADRB[4], the inverted address signal LADRB[0] and the address signal LADR[1].

A first input terminal of AND logic gate 1104*c* is coupled to the output terminal of inverter 1121*a*, a second input terminal of AND logic gate 1104*c* is coupled to the output terminal of inverter 1121*b*, and a third input terminal of AND logic gate 1104*c* is coupled to the input terminal of inverter 1121*e*.

The first input terminal of AND logic gate 1104*c* is configured to receive the inverted address signal LADRB[4]. The second input terminal of AND logic gate 1104*c* is configured to receive the inverted address signal LADRB[0]. The third input terminal of AND logic gate 1104*c* is configured to receive the address signal LADR[1].

An output terminal of AND logic gate 1104*c* is configured to output the signal BOT[2] of the set of signals BOT[0:3].

AND logic gate 1104*d* is configured to generate the signal BOT[3] of the set of signals BOT[0:3] in response to the inverted address signal LADRB[4], the address signal LADR[0] and the address signal LADR[1].

A first input terminal of AND logic gate 1104*d* is coupled to the output terminal of inverter 1121*a*, a second input terminal of AND logic gate 1104*d* is coupled to the input terminal of inverter 1121*b*, and a third input terminal of AND logic gate 1104*d* is coupled to the input terminal of inverter 1121*e*.

The first input terminal of AND logic gate 1104*d* is configured to receive the inverted address signal LADRB[4]. The second input terminal of AND logic gate 1104*d* is configured to receive the address signal LADR[0]. The third input terminal of AND logic gate 1104*d* is configured to receive the address signal LADR[1].

An output terminal of AND logic gate 1104*d* is configured to output the signal BOT[3] of the set of signals BOT[0:3].

The set of AND logic gates 1106 is configured to generate a set of bank select signals BS[0:3] in response to at least a portion of the first set of address signals LADR[0:4] or a portion of the inverted first set of address signals LADRB[0:4]. The set of AND logic gates 1106 includes at least one of AND logic gate 1106*a*, 1106*b*, 1106*c* or 1106*d*.

In some embodiments, at least one of the set of bank select signals BS[0:3] includes 4 bits, and the 4 bits are located at bit positions 0:3 in the corresponding set of bank select signals BS[0:3]. Other numbers of bits or bit locations for at least one of the set of bank select signals BS[0:3] is within the scope of the present disclosure.

AND logic gate 1106a is configured to generate the bank select signal BS[0] of the set of bank select signals BS[0:3] in response to the inverted address signal LADRB[2], and the inverted address signal LADRB[3].

A first input terminal of AND logic gate 1106a is coupled to the output terminal of inverter 1121c, and a second input terminal of AND logic gate 1106a is coupled to the output terminal of inverter 1121d.

The first input terminal of AND logic gate 1106a is configured to receive the inverted address signal LADRB[2]. The second input terminal of AND logic gate 1106a is configured to receive the inverted address signal LADRB[3].

An output terminal of AND logic gate 1106a is configured to output the bank select signal BS[0] of the set of bank select signals BS[0:3].

AND logic gate 1106b is configured to generate the bank select signal BS[1] of the set of bank select signals BS[0:3] in response to the address signal LADR[2], and the inverted address signal LADRB[3].

A first input terminal of AND logic gate 1106b is coupled to the input terminal of inverter 1121c, and a second input terminal of AND logic gate 1106b is coupled to the output terminal of inverter 1121d.

The first input terminal of AND logic gate 1106b is configured to receive the address signal LADR[2]. The second input terminal of AND logic gate 1106b is configured to receive the inverted address signal LADRB[3].

An output terminal of AND logic gate 1106b is configured to output the bank select signal BS[1] of the set of bank select signals BS[0:3].

AND logic gate 1106c is configured to generate the bank select signal BS[2] of the set of bank select signals BS[0:3] in response to the inverted address signal LADRB[2], and the address signal LADR[3].

A first input terminal of AND logic gate 1106c is coupled to the output terminal of inverter 1121c, and a second input terminal of AND logic gate 1106c is coupled to the input terminal of inverter 1121d.

The first input terminal of AND logic gate 1106c is configured to receive the inverted address signal LADRB[2]. The second input terminal of AND logic gate 1106c is configured to receive the address signal LADR[3].

An output terminal of AND logic gate 1106c is configured to output the bank select signal BS[2] of the set of bank select signals BS[0:3].

AND logic gate 1106d is configured to generate the bank select signal BS[3] of the set of bank select signals BS[0:3] in response to the address signal LADR[2], and the address signal LADR[3].

A first input terminal of AND logic gate 1106d is coupled to the input terminal of inverter 1121c, and a second input terminal of AND logic gate 1106d is coupled to the input terminal of inverter 1121d.

The first input terminal of AND logic gate 1106d is configured to receive the address signal LADR[2]. The second input terminal of AND logic gate 1106d is configured to receive the address signal LADR[3].

An output terminal of AND logic gate 1106d is configured to output the bank select signal BS[3] of the set of bank select signals BS[0:3].

The set of AND logic gates 1108 is configured to generate the set of clock signals ICKD_TOP[0:3] in response to at least the clock signal ICLK, a bank select enable signal BS_EN, and the set of signals TOP[0:3]. The set of AND logic gates 1108 includes at least one of AND logic gate 1108a, 1108b, 1108c or 1108d.

In some embodiments, the bank select enable signal BS_EN corresponds to one bank select signal of the set of bank select signals BS[0:3]. For example, in some embodiments, if the bank[1] array of memory partition 102D of FIGS. 1 & 2A-2B is selected, then the bank select enable signal BS_EN corresponds to bank select signal BS[0]. In some embodiments, if the bank[2] array of memory partition 102D of FIGS. 1 & 2A-2B is selected, then the bank select enable signal BS_EN corresponds to bank select signal BS[1]. In some embodiments, if the bank[3] array of memory partition 102D of FIGS. 1 & 2A-2B is selected, then the bank select enable signal BS_EN corresponds to bank select signal BS[2]. In some embodiments, if the bank[4] array of memory partition 102D of FIGS. 1 & 2A-2B is selected, then the bank select enable signal BS_EN corresponds to bank select signal BS[3].

AND logic gate 1108a is configured to generate the clock signal ICKD_TOP[0] of the set of clock signals ICKD_TOP[0:3] in response to the clock signal ICLK, the bank select enable signal BS_EN and the signal TOP[0].

A first input terminal of AND logic gate 1108a is coupled to the output of clock gating circuit 202, a second input terminal of AND logic gate 1108a is coupled to the output terminal of at least one of AND logic gate 1106a, 1106b, 1106c or 1106d based on the bank array of memory partitions 102A-102D that is selected, and a third input terminal of AND logic gate 1108a is coupled to the output terminal of AND logic gate 1102a.

The first input terminal of AND logic gate 1108a is configured to receive the clock signal ICLK. The second input terminal of AND logic gate 1108a is configured to receive the bank select enable signal BS_EN. The third input terminal of AND logic gate 1108a is configured to receive the signal TOP[0].

An output terminal of AND logic gate 1108a is configured to output the clock signal ICKD_TOP[0] of the set of clock signals ICKD_TOP[0:3].

AND logic gate 1108b is configured to generate the clock signal ICKD_TOP[1] of the set of clock signals ICKD_TOP[0:3] in response to the clock signal ICLK, the bank select enable signal BS_EN and the signal TOP[1].

A first input terminal of AND logic gate 1108b is coupled to the output of clock gating circuit 202, a second input terminal of AND logic gate 1108b is coupled to the output terminal of at least one of AND logic gate 1106a, 1106b, 1106c or 1106d based on the bank array of memory partitions 102A-102D that is selected, and a third input terminal of AND logic gate 1108b is coupled to the output terminal of AND logic gate 1102b.

The first input terminal of AND logic gate 1108b is configured to receive the clock signal ICLK. The second input terminal of AND logic gate 1108b is configured to receive the bank select enable signal BS_EN. The third input terminal of AND logic gate 1108b is configured to receive the signal TOP[1].

An output terminal of AND logic gate 1108b is configured to output the clock signal ICKD_TOP[1] of the set of clock signals ICKD_TOP[0:3].

AND logic gate 1108c is configured to generate the clock signal ICKD_TOP[2] of the set of clock signals ICKD_TOP[0:3] in response to the clock signal ICLK, the bank select enable signal BS_EN and the signal TOP[2].

A first input terminal of AND logic gate 1108c is coupled to the output of clock gating circuit 202, a second input terminal of AND logic gate 1108c is coupled to the output terminal of at least one of AND logic gate 1106a, 1106b, 1106c or 1106d based on the bank array of memory partitions 102A-102D that is selected, and a third input terminal of AND logic gate 1108c is coupled to the output terminal of AND logic gate 1102c.

The first input terminal of AND logic gate 1108c is configured to receive the clock signal ICLK. The second input terminal of AND logic gate 1108c is configured to receive the bank select enable signal BS_EN. The third input terminal of AND logic gate 1108c is configured to receive the signal TOP[2].

An output terminal of AND logic gate 1108c is configured to output the clock signal ICKD_TOP[2] of the set of clock signals ICKD_TOP[0:3].

AND logic gate 1108d is configured to generate the clock signal ICKD_TOP[3] of the set of clock signals ICKD_TOP[0:3] in response to the clock signal ICLK, the bank select enable signal BS_EN and the signal TOP[3].

A first input terminal of AND logic gate 1108d is coupled to the output of clock gating circuit 202, a second input terminal of AND logic gate 1108d is coupled to the output terminal of at least one of AND logic gate 1106a, 1106b, 1106c or 1106d based on the bank array of memory partitions 102A-102D that is selected, and a third input terminal of AND logic gate 1108d is coupled to the output terminal of AND logic gate 1102d.

The first input terminal of AND logic gate 1108d is configured to receive the clock signal ICLK. The second input terminal of AND logic gate 1108d is configured to receive the bank select enable signal BS_EN. The third input terminal of AND logic gate 1108d is configured to receive the signal TOP[3].

An output terminal of AND logic gate 1108d is configured to output the clock signal ICKD_TOP[3] of the set of clock signals ICKD_TOP[0:3].

The set of AND logic gates 1110 is configured to generate the set of clock signals ICKD_BOT[0:3] in response to at least the clock signal ICLK, a bank select enable signal BS_EN, and the set of signals BOT[0:3]. The set of AND logic gates 1110 includes at least one of AND logic gate 1110a, 1110b, 1110c or 1110d.

AND logic gate 1110a is configured to generate the clock signal ICKD_BOT[0] of the set of clock signals ICKD_BOT[0:3] in response to the clock signal ICLK, the bank select enable signal BS_EN and the signal BOT[0].

A first input terminal of AND logic gate 1110a is coupled to the output of clock gating circuit 202, a second input terminal of AND logic gate 1110a is coupled to the output terminal of at least one of AND logic gate 1106a, 1106b, 1106c or 1106d based on the bank array of memory partitions 102A-102D that is selected, and a third input terminal of AND logic gate 1110a is coupled to the output terminal of AND logic gate 1104a.

The first input terminal of AND logic gate 1110a is configured to receive the clock signal ICLK. The second input terminal of AND logic gate 1110a is configured to receive the bank select enable signal BS_EN. The third input terminal of AND logic gate 1110a is configured to receive the signal BOT[0].

An output terminal of AND logic gate 1110a is configured to output the clock signal ICKD_BOT[0] of the set of clock signals ICKD_BOT[0:3].

AND logic gate 1110b is configured to generate the clock signal ICKD_BOT[1] of the set of clock signals ICKD_BOT[0:3] in response to the clock signal ICLK, the bank select enable signal BS_EN and the signal BOT[1].

A first input terminal of AND logic gate 1110b is coupled to the output of clock gating circuit 202, a second input terminal of AND logic gate 1110b is coupled to the output terminal of at least one of AND logic gate 1106a, 1106b, 1106c or 1106d based on the bank array of memory partitions 102A-102D that is selected, and a third input terminal of AND logic gate 1110b is coupled to the output terminal of AND logic gate 1104b.

The first input terminal of AND logic gate 1110b is configured to receive the clock signal ICLK. The second input terminal of AND logic gate 1110b is configured to receive the bank select enable signal BS_EN. The third input terminal of AND logic gate 1110b is configured to receive the signal BOT[1].

An output terminal of AND logic gate 1110b is configured to output the clock signal ICKD_BOT[1] of the set of clock signals ICKD_BOT[0:3].

AND logic gate 1110c is configured to generate the clock signal ICKD_BOT[2] of the set of clock signals ICKD_BOT[0:3] in response to the clock signal ICLK, the bank select enable signal BS_EN and the signal BOT[2].

A first input terminal of AND logic gate 1110c is coupled to the output of clock gating circuit 202, a second input terminal of AND logic gate 1110c is coupled to the output terminal of at least one of AND logic gate 1106a, 1106b, 1106c or 1106d based on the bank array of memory partitions 102A-102D that is selected, and a third input terminal of AND logic gate 1110c is coupled to the output terminal of AND logic gate 1104c.

The first input terminal of AND logic gate 1110c is configured to receive the clock signal ICLK. The second input terminal of AND logic gate 1110c is configured to receive the bank select enable signal BS_EN. The third input terminal of AND logic gate 1110c is configured to receive the signal BOT[2].

An output terminal of AND logic gate 1110c is configured to output the clock signal ICKD_BOT[2] of the set of clock signals ICKD_BOT[0:3].

AND logic gate 1110d is configured to generate the clock signal ICKD_BOT[3] of the set of clock signals ICKD_BOT[0:3] in response to the clock signal ICLK, the bank select enable signal BS_EN and the signal BOT[3].

A first input terminal of AND logic gate 1110d is coupled to the output of clock gating circuit 202, a second input terminal of AND logic gate 1110d is coupled to the output terminal of at least one of AND logic gate 1106a, 1106b, 1106c or 1106d based on the bank array of memory partitions 102A-102D that is selected, and a third input terminal of AND logic gate 1110d is coupled to the output terminal of AND logic gate 1104d.

The first input terminal of AND logic gate 1110d is configured to receive the clock signal ICLK. The second input terminal of AND logic gate 1110d is configured to receive the bank select enable signal BS_EN. The third input terminal of AND logic gate 1110d is configured to receive the signal BOT[3].

An output terminal of AND logic gate 1110d is configured to output the clock signal ICKD_BOT[3] of the set of clock signals ICKD_BOT[0:3].

Other configurations, numbers of circuit elements or types of circuit elements of clock pre-decoder circuit 1100 are within the scope of the present disclosure.

Set of Word Line Post-Decoder Circuits

Figure 12:
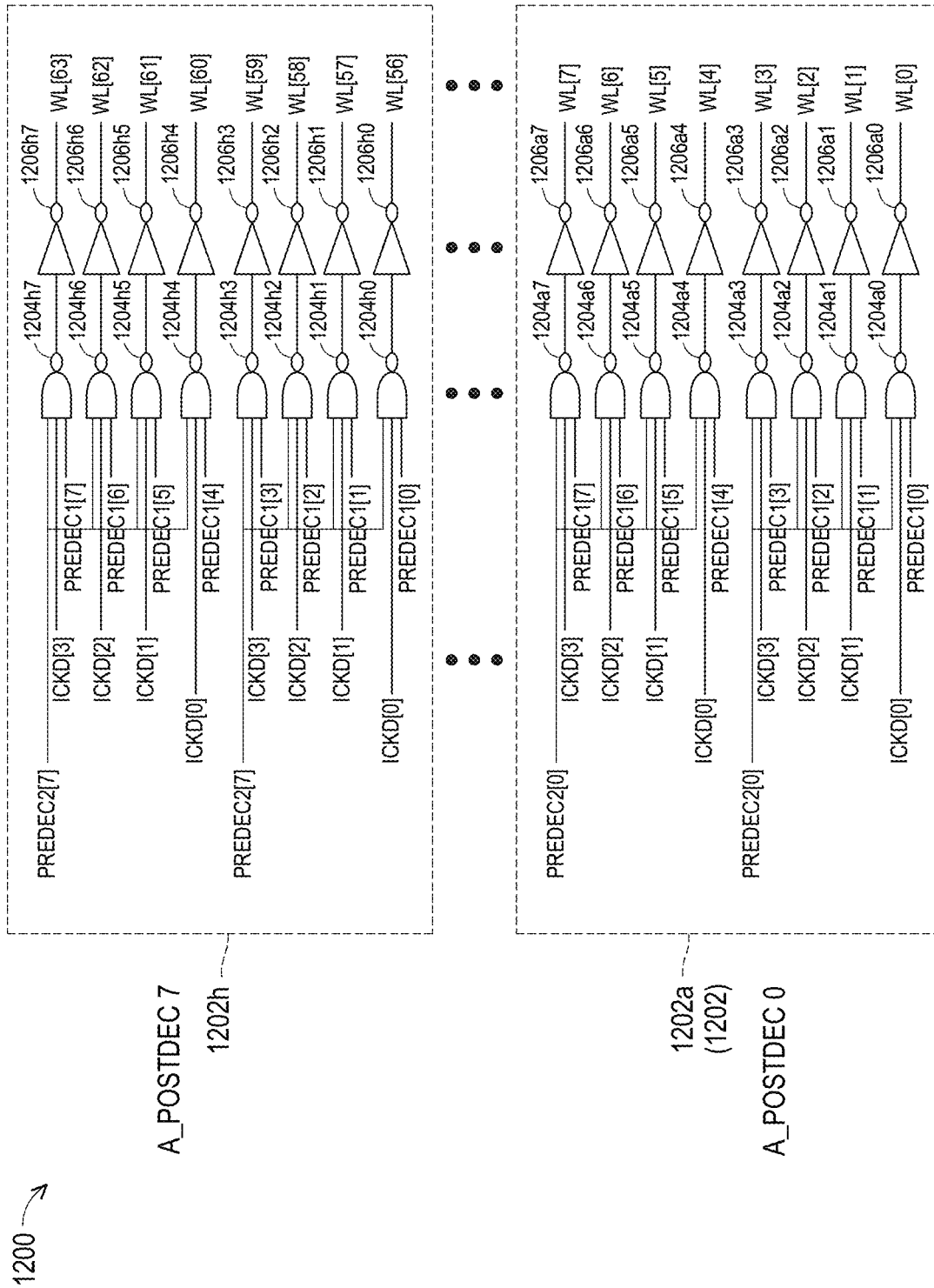
FIG. 12 is a circuit diagram of a set of word line post-decoder circuits, in accordance with some embodiments.

FIG. 12 is a circuit diagram of a set of word line post-decoder circuits 1200, in accordance with some embodiments.

Set of word line post-decoder circuits 1200 is an embodiment of at least one of the set of word line post-decoder circuits 240a, 240b, 242a, 242b, 244a, 244b, 246a or 246b of FIGS. 2A-2B, and similar detailed description is therefore omitted.

In some embodiments, the set of word line post-decoder circuits 1200 is configured to generate the set of word line signal WL[0:63]. Other numbers of bits for the set of word line signals WL[0:63] is within the scope of the present disclosure.

Set of word line post-decoder circuits 1200 includes at least one of word line post-decoder circuit 1202a, 1202b, 1202c, 1202d, 1202e, 1202f, 1202g or 1202h. In some embodiments, a number of word line post-decoder circuits in the set of word line post-decoder circuits 1202 corresponds to a number of signals in at least one of the set of local pre-decoder signals PREDEC1_LOCAL[0:7] or set of local pre-decoder signals PREDEC2_LOCAL[0:7].

The set of word line post-decoder circuits 1202a includes a set of AND logic gates 1204a coupled to a set of inverters 1206a. An output of the set of AND logic gates 1204a is coupled to a corresponding input of the set of inverters 1206a. The set of word line post-decoder circuits 1202a is configured to generate a set of word line signals WL[0]-WL[7] in response to the set of local pre-decoder signals PREDEC1[0:7], local pre-decoder signal PREDEC2[0] and the set of clock signals ICKD[0:3].

The set of AND logic gates 1204a is configured to generate a set of signals WLB in response to the set of local pre-decoder signals PREDEC1_LOCAL[0:7], one local pre-decoder signal (e.g., PREDEC2_LOCAL[0]) of the second set of local pre-decoder signals PREDEC2_LOCAL[0:7] and the set of clock signals ICKD[0:3]. For brevity, local pre-decoder signals PREDEC1_LOCAL[0]—PREDEC1_LOCAL[7] are shown in FIG. 12 as "PREDEC1[0]—PREDEC1_LOCAL[7]." For brevity, local pre-decoder signals PREDEC2_LOCAL[0]—PREDEC2_LOCAL[7] are shown in FIG. 12 as "PREDEC2[0]—PREDEC2_LOCAL[7]."

In some embodiments, the set of clock signals ICKD[0:3] corresponds to either the set of clock signals ICKD_TOP[0:3] or the set of clock signals ICKD_BOT[0:3] based on whether the set of word line post-decoder circuits 1200 corresponds to either an upper region of the set of WL driver circuit 212a of FIGS. 2A-2B (e.g., word line post-decoder circuit 240a, 242a, 244a or 246a) or a lower region of the set of WL driver circuit 212a of FIGS. 2A-2B (e.g., word line post-decoder circuit 240b, 242b, 244b or 246b of FIGS. 2A-2B).

The set of AND logic gates 1204a includes AND logic gates 1204a0, 1204a1, 1204a2, 1204a3, 1204a4, 1204a5, 1204a6 and 1204a7.

AND logic gate 1204a0 is configured to generate a signal WLB[0] in response to local pre-decoder signal PREDEC2[0], clock signal ICKD[0] and local pre-decoder signal PREDEC1[0].

Each of the first input terminals of AND logic gate 1204a0-1204h0 are coupled together and receive the local pre-decoder signal PREDEC2_LOCAL[0].

The first input terminal of AND logic gate 1204a0 is configured to receive the local pre-decoder signal PREDEC2[0]. The second input terminal of AND logic gate 1204a0 is configured to receive the clock signal ICKD[0]. The third input terminal of AND logic gate 1204a0 is configured to receive the local pre-decoder signal PREDEC1[0].

An output terminal of AND logic gate 1204a0 is configured to output the signal WLB[0] to an input terminal of corresponding inverter 1206a0.

AND logic gate 1204a1 is configured to generate a signal WLB[1] in response to local pre-decoder signal PREDEC2[0], clock signal ICKD[1] and local pre-decoder signal PREDEC1[1].

The first input terminal of AND logic gate 1204a1 is configured to receive the local pre-decoder signal PREDEC2[0]. The second input terminal of AND logic gate 1204a1 is configured to receive the clock signal ICKD[1]. The third input terminal of AND logic gate 1204a1 is configured to receive the local pre-decoder signal PREDEC1[1].

An output terminal of AND logic gate 1204a1 is configured to output the signal WLB[1] to an input terminal of corresponding inverter 1206a1.

AND logic gate 1204a2 is configured to generate a signal WLB[2] in response to local pre-decoder signal PREDEC2[0], clock signal ICKD[2] and local pre-decoder signal PREDEC1[2].

The first input terminal of AND logic gate 1204a2 is configured to receive the local pre-decoder signal PREDEC2[0]. The second input terminal of AND logic gate 1204a2 is configured to receive the clock signal ICKD[2]. The third input terminal of AND logic gate 1204a2 is configured to receive the local pre-decoder signal PREDEC1[2].

An output terminal of AND logic gate 1204a2 is configured to output the signal WLB[2] to an input terminal of corresponding inverter 1206a2.

AND logic gate 1204a3 is configured to generate a signal WLB[3] in response to local pre-decoder signal PREDEC2[0], clock signal ICKD[3] and local pre-decoder signal PREDEC1[3].

The first input terminal of AND logic gate 1204a3 is configured to receive the local pre-decoder signal PREDEC2[0]. The second input terminal of AND logic gate 1204a3 is configured to receive the clock signal ICKD[3]. The third input terminal of AND logic gate 1204a3 is configured to receive the local pre-decoder signal PREDEC1[3].

An output terminal of AND logic gate 1204a3 is configured to output the signal WLB[3] to an input terminal of corresponding inverter 1206a3.

AND logic gate 1204a4 is configured to generate a signal WLB[4] in response to local pre-decoder signal PREDEC2[0], clock signal ICKD[0] and local pre-decoder signal PREDEC1[4].

The first input terminal of AND logic gate 1204a4 is configured to receive the local pre-decoder signal PREDEC2[0]. The second input terminal of AND logic gate 1204a4 is configured to receive the clock signal ICKD[0]. The third input terminal of AND logic gate 1204a4 is configured to receive the local pre-decoder signal PREDEC1[4].

An output terminal of AND logic gate 1204a4 is configured to output the signal WLB[4] to an input terminal of corresponding inverter 1206a4.

AND logic gate 1204a5 is configured to generate a signal WLB[5] in response to local pre-decoder signal PREDEC2[0], clock signal ICKD[1] and local pre-decoder signal PREDEC1[5].

The first input terminal of AND logic gate 1204a5 is configured to receive the local pre-decoder signal PREDEC2[0]. The second input terminal of AND logic gate 1204a5 is configured to receive the clock signal ICKD[1]. The third input terminal of AND logic gate 1204a5 is configured to receive the local pre-decoder signal PREDEC1[5].

An output terminal of AND logic gate 1204a5 is configured to output the signal WLB[5] to an input terminal of corresponding inverter 1206a5.

AND logic gate 1204a6 is configured to generate a signal WLB[6] in response to local pre-decoder signal PREDEC2[0], clock signal ICKD[2] and local pre-decoder signal PREDEC1[6].

The first input terminal of AND logic gate 1204a6 is configured to receive the local pre-decoder signal PREDEC2[0]. The second input terminal of AND logic gate 1204a6 is configured to receive the clock signal ICKD[2]. The third input terminal of AND logic gate 1204a6 is configured to receive the local pre-decoder signal PREDEC1[6].

An output terminal of AND logic gate 1204a6 is configured to output the signal WLB[6] to an input terminal of corresponding inverter 1206a6.

AND logic gate 1204a7 is configured to generate a signal WLB[7] in response to local pre-decoder signal PREDEC2[0], clock signal ICKD[3] and local pre-decoder signal PREDEC1[7].

The first input terminal of AND logic gate 1204a7 is configured to receive the local pre-decoder signal PREDEC2[0]. The second input terminal of AND logic gate 1204a7 is configured to receive the clock signal ICKD[3]. The third input terminal of AND logic gate 1204a7 is configured to receive the local pre-decoder signal PREDEC1[7].

An output terminal of AND logic gate 1204a7 is configured to output the signal WLB[7] to an input terminal of corresponding inverter 1206a7.

The set of inverters 1206a is configured to generate the set of word line signals WL in response to the set of signals WLB. In some embodiments, the set of signals WLB are inverted from the set of word line signals WL.

The set of inverters 1206a includes inverters 1206a0, 1206a1, 1206a2, 1206a3, 1206a4, 1206a5, 1206a6 and 1206a7.

Each inverter 1206a0, 1206a1, 1206a2, 1206a3, 1206a4, 1206a5, 1206a6 and 1206a7 of the set of inverters 1206 is configured to generate a corresponding word line signal WL[0], WL[1], WL[2], WL[3], WL[4], WL[5], WL[6] and WL[7] in response to the corresponding signal WLB[0], WLB[1], WLB[2], WLB[3], WLB[4], WLB[5], WLB[6] and WLB[7].

Each inverter 1206a0, 1206a1, 1206a2, 1206a3, 1206a4, 1206a5, 1206a6 and 1206a7 of the set of inverters 1206 is configured to output the corresponding word line signal WL[0], WL[1], WL[2], WL[3], WL[4], WL[5], WL[6] and WL[7].

The description of each of the set of word line post-decoder circuits 1202b, 1202c, 1202d, 1202e, 1202f, 1202g or 1202h is similar to the description of the set of word line post-decoder circuits 1202a, and the details will be omitted for brevity. However, local pre-decoder signal PREDEC2[0] of the word line post-decoder circuit 1202a and the set of AND logic gates 1204a is substituted with local pre-decoder signal PREDEC2[1], PREDEC2[2], PREDEC2[3], PREDEC2[4], PREDEC2[5], PREDEC2[6] or PREDEC2[7] for corresponding word line post-decoder circuit 1202b, 1202c, 1202d, 1202e, 1202f, 1202g or 1202h and the corresponding set of AND logic gates 1204b, 1204c, 1204d, 1204e, 1204f, 1204g or 1204h.

The set of word line post-decoder circuits 1202b includes a set of AND logic gates 1204b coupled to a set of inverters 1206b. An output of the set of AND logic gates 1204b is coupled to a corresponding input of the set of inverters 1206b. The set of word line post-decoder circuits 1202b is configured to generate a set of word line signals WL[8]-WL[15] in response to the set of local pre-decoder signals PREDEC1[0:7], local pre-decoder signal PREDEC2[1] and the set of clock signals ICKD[0:3].

The set of AND logic gates 1204b includes AND logic gates 1204b0, 1204b1, 1204b2, 1204b3, 1204b4, 1204b5, 1204b6 and 1204b7.

The set of inverters 1206b includes inverters 1206b0, 1206b1, 1206b2, 1206b3, 1206b4, 1206b5, 1206b6 and 1206b7.

Each inverter 1206b0, 1206b1, 1206b2, 1206b3, 1206b4, 1206b5, 1206b6 and 1206b7 of the set of inverters 1206 is configured to generate a corresponding word line signal WL[8], WL[9], WL[10], WL[11], WL[12], WL[13], WL[14] and WL[15] in response to the corresponding signal WLB[8], WLB[9], WLB[10], WLB[11], WLB[12], WLB[13], WLB[14] and WLB[15].

Each inverter 1206b0, 1206b1, 1206b2, 1206b3, 1206b4, 1206b5, 1206b6 and 1206b7 of the set of inverters 1206 is configured to output the corresponding word line signal WL[8], WL[9], WL[10], WL[11], WL[12], WL[13], WL[14] and WL[15].

The set of word line post-decoder circuits 1202c includes a set of AND logic gates 1204c coupled to a set of inverters 1206c. An output of the set of AND logic gates 1204c is coupled to a corresponding input of the set of inverters 1206c. The set of word line post-decoder circuits 1202c is configured to generate a set of word line signals WL[16]-WL[23] in response to the set of local pre-decoder signals PREDEC1[0:7], local pre-decoder signal PREDEC2[2] and the set of clock signals ICKD[0:3].

The set of AND logic gates 1204c includes AND logic gates 1204c0, 1204c1, 1204c2, 1204c3, 1204c4, 1204c5, 1204c6 and 1204c7.

The set of inverters 1206c includes inverters 1206c0, 1206c1, 1206c2, 1206c3, 1206c4, 1206c5, 1206c6 and 1206c7.

Each inverter 1206c0, 1206c1, 1206c2, 1206c3, 1206c4, 1206c5, 1206c6 and 1206c7 of the set of inverters 1206 is configured to generate a corresponding word line signal WL[16], WL[17], WL[18], WL[19], WL[20], WL[21], WL[22] and WL[23] in response to the corresponding signal WLB[16], WLB[17], WLB[18], WLB[19], WLB[20], WLB[21], WLB[22] and WLB[23].

Each inverter 1206c0, 1206c1, 1206c2, 1206c3, 1206c4, 1206c5, 1206c6 and 1206c7 of the set of inverters 1206 is configured to output the corresponding word line signal WL[16], WL[17], WL[18], WL[19], WL[20], WL[21], WL[22] and WL[23].

The set of word line post-decoder circuits 1202d includes a set of AND logic gates 1204d coupled to a set of inverters 1206d. An output of the set of AND logic gates 1204d is coupled to a corresponding input of the set of inverters 1206d. The set of word line post-decoder circuits 1202d is configured to generate a set of word line signals WL[24]-WL[31] in response to the set of local pre-decoder signals PREDEC1[0:7], local pre-decoder signal PREDEC2[3] and the set of clock signals ICKD[0:3].

The set of AND logic gates 1204d includes AND logic gates 1204d0, 1204d1, 1204d2, 1204d3, 1204d4, 1204d5, 1204d6 and 1204d7.

The set of inverters 1206d includes inverters 1206d0, 1206d1, 1206d2, 1206d3, 1206d4, 1206d5, 1206d6 and 1206d7.

Each inverter 1206d0, 1206d1, 1206d2, 1206d3, 1206d4, 1206d5, 1206d6 and 1206d7 of the set of inverters 1206 is configured to generate a corresponding word line signal WL[24], WL[25], WL[26], WL[27], WL[28], WL[29], WL[30] and WL[31] in response to the corresponding signal WLB[24], WLB[25], WLB[26], WLB[27], WLB[28], WLB[29], WLB[30] and WLB[31].

Each inverter 1206d0, 1206d1, 1206d2, 1206d3, 1206d4, 1206d5, 1206d6 and 1206d7 of the set of inverters 1206 is configured to output the corresponding word line signal WL[24], WL[25], WL[26], WL[27], WL[28], WL[29], WL[30] and WL[31].

The set of word line post-decoder circuits 1202e includes a set of AND logic gates 1204e coupled to a set of inverters 1206e. An output of the set of AND logic gates 1204e is coupled to a corresponding input of the set of inverters 1206e. The set of word line post-decoder circuits 1202e is configured to generate a set of word line signals WL[32]-WL[39] in response to the set of local pre-decoder signals PREDEC1[0:7], local pre-decoder signal PREDEC2[4] and the set of clock signals ICKD[0:3].

The set of AND logic gates 1204e includes AND logic gates 1204e0, 1204e1, 1204e2, 1204e3, 1204e4, 1204e5, 1204e6 and 1204e7.

The set of inverters 1206e includes inverters 1206e0, 1206e1, 1206e2, 1206e3, 1206e4, 1206e5, 1206e6 and 1206e7.

Each inverter 1206e0, 1206e1, 1206e2, 1206e3, 1206e4, 1206e5, 1206e6 and 1206e7 of the set of inverters 1206 is configured to generate a corresponding word line signal WL[32], WL[33], WL[34], WL[35], WL[36], WL[37], WL[38] and WL[39] in response to the corresponding signal WLB[32], WLB[33], WLB[34], WLB[35], WLB[36], WLB[37], WLB[38] and WLB[39].

Each inverter 1206e0, 1206e1, 1206e2, 1206e3, 1206e4, 1206e5, 1206e6 and 1206e7 of the set of inverters 1206 is configured to output the corresponding word line signal WL[32], WL[33], WL[34], WL[35], WL[36], WL[37], WL[38] and WL[39].

The set of word line post-decoder circuits 1202f includes a set of AND logic gates 1204f coupled to a set of inverters 1206f. An output of the set of AND logic gates 1204f is coupled to a corresponding input of the set of inverters 1206f. The set of word line post-decoder circuits 1202f is configured to generate a set of word line signals WL[40]-WL[47] in response to the set of local pre-decoder signals PREDEC1[0:7], local pre-decoder signal PREDEC2[5] and the set of clock signals ICKD[0:3].

The set of AND logic gates 1204f includes AND logic gates 1204f0, 1204f1, 1204f2, 1204f3, 1204f4, 1204f5, 1204f6 and 1204f7.

The set of inverters 1206f includes inverters 1206f0, 1206f1, 1206f2, 1206f3, 1206f4, 1206f5, 1206f6 and 1206f7.

Each inverter 1206f0, 1206f1, 1206f2, 1206f3, 1206f4, 1206f5, 1206f6 and 1206f7 of the set of inverters 1206 is configured to generate a corresponding word line signal WL[40], WL[41], WL[42], WL[43], WL[44], WL[45], WL[46] and WL[47] in response to the corresponding signal WLB[40], WLB[41], WLB[42], WLB[43], WLB[44], WLB[45], WLB[46] and WLB[47].

Each inverter 1206f0, 1206f1, 1206f2, 1206f3, 1206f4, 1206f5, 1206f6 and 1206f7 of the set of inverters 1206 is configured to output the corresponding word line signal WL[40], WL[41], WL[42], WL[43], WL[44], WL[45], WL[46] and WL[47].

The set of word line post-decoder circuits 1202g includes a set of AND logic gates 1204g coupled to a set of inverters 1206g. An output of the set of AND logic gates 1204g is coupled to a corresponding input of the set of inverters 1206g. The set of word line post-decoder circuits 1202g is configured to generate a set of word line signals WL[48]-WL[55] in response to the set of local pre-decoder signals PREDEC1[0:7], local pre-decoder signal PREDEC2[6] and the set of clock signals ICKD[0:3].

The set of AND logic gates 1204g includes AND logic gates 1204g0, 1204g1, 1204g2, 1204g3, 1204g4, 1204g5, 1204g6 and 1204g7.

The set of inverters 1206g includes inverters 1206g0, 1206g1, 1206g2, 1206g3, 1206g4, 1206g5, 1206g6 and 1206g7.

Each inverter 1206g0, 1206g1, 1206g2, 1206g3, 1206g4, 1206g5, 1206g6 and 1206g7 of the set of inverters 1206 is configured to generate a corresponding word line signal WL[48], WL[49], WL[50], WL[51], WL[52], WL[53], WL[54] and WL[55] in response to the corresponding signal WLB[48], WLB[49], WLB[50], WLB[51], WLB[52], WLB[53], WLB[54] and WLB[55].

Each inverter 1206g0, 1206g1, 1206g2, 1206g3, 1206g4, 1206g5, 1206g6 and 1206g7 of the set of inverters 1206 is configured to output the corresponding word line signal WL[48], WL[49], WL[50], WL[51], WL[52], WL[53], WL[54] and WL[55].

The set of word line post-decoder circuits 1202h includes a set of AND logic gates 1204h coupled to a set of inverters 1206h. An output of the set of AND logic gates 1204h is coupled to a corresponding input of the set of inverters 1206h. The set of word line post-decoder circuits 1202h is configured to generate a set of word line signals WL[56]-WL[63] in response to the set of local pre-decoder signals PREDEC1[0:7], local pre-decoder signal PREDEC2[7] and the set of clock signals ICKD[0:3].

The set of AND logic gates 1204h includes AND logic gates 1204h0, 1204h1, 1204h2, 1204h3, 1204h4, 1204h5, 1204h6 and 1204h7.

The set of inverters 1206h includes inverters 1206h0, 1206h1, 1206h2, 1206h3, 1206h4, 1206h5, 1206h6 and 1206h7.

Each inverter 1206h0, 1206h1, 1206h2, 1206h3, 1206h4, 1206h5, 1206h6 and 1206h7 of the set of inverters 1206 is configured to generate a corresponding word line signal WL[56], WL[57], WL[58], WL[59], WL[60], WL[61], WL[62] and WL[63] in response to the corresponding signal WLB[56], WLB[57], WLB[58], WLB[59], WLB[60], WLB[61], WLB[62] and WLB[63].

Each inverter 1206h0, 1206h1, 1206h2, 1206h3, 1206h4, 1206h5, 1206h6 and 1206h7 of the set of inverters 1206 is configured to output the corresponding word line signal WL[56], WL[57], WL[58], WL[59], WL[60], WL[61], WL[62] and WL[63].

Other configurations, numbers of circuit elements or types of circuit elements of set of word line post-decoder circuits 1200 are within the scope of the present disclosure.

Memory Cell

Figure 13:
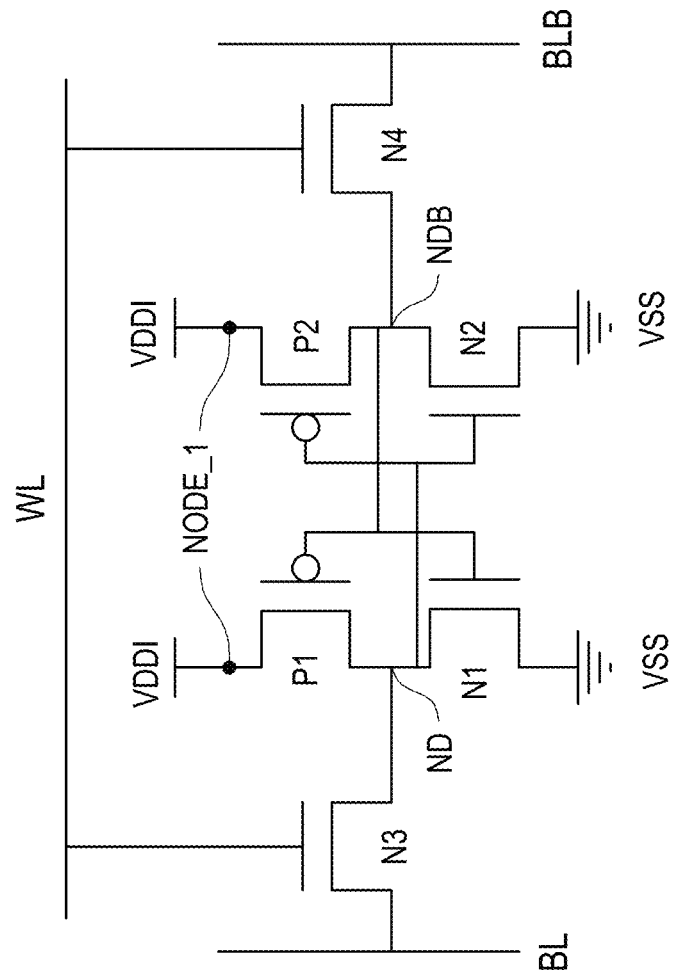
FIG. 13 is a circuit diagram of a memory cell usable in FIGS. 1 and 2A-2B, in accordance with some embodiments.

FIG. 13 is a circuit diagram of a memory cell 1300 usable in FIGS. 1 and 2A-2B, in accordance with some embodiments.

Memory cell 1300 is usable as one or more memory cells MCB in at least one of memory cell array 110AR of FIG. 1, memory device 112 of FIG. 1, memory cell array 210a of FIG. 2A or memory cell array 210b of FIG. 2A.

Memory cell 1300 is a six transistor (6T) single port (SP) SRAM memory cell used for illustration. In some embodiments, memory cell 1300 employs a number of transistors other than six. Other types of memory are within the scope of various embodiments.

Memory cell 1300 comprises two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and a source terminal of NMOS transistor N3, and is configured as a storage node ND.

A drain terminal of PMOS transistor P2 is coupled with a drain terminal of NMOS transistor N2, a gate terminal of PMOS transistor P1, a gate terminal of NMOS transistor N1, and a source terminal of NMOS transistor N4, and is configured as a storage node NDB. A source terminal of each of NMOS transistors N1 and N2 is configured as a supply reference voltage node (not labelled) having a supply reference voltage VSS. The source terminal of each of NMOS transistors N1 and N2 is also coupled to supply reference voltage VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 1300. In some embodiments, in a write operation, applying a logical value to a first bit line BL and the opposite logical value to the other bit line BLB enables writing the logical values on the bit lines to memory cell 1300. Each of bit lines BL and BLB is called a data line because the data carried on bit lines BL and BLB are written to and read from corresponding nodes ND and NDB.

Word line WL corresponds to one or more word lines WL in FIG. 2A. Bit line BL corresponds to one or more bit lines BL in FIG. 2A. Bit line bar BLB corresponds to one or more bit line bars BLB in FIG. 2A.

Other configurations of memory cell 1300 are within the scope of the present disclosure.

Method

Figure 14:
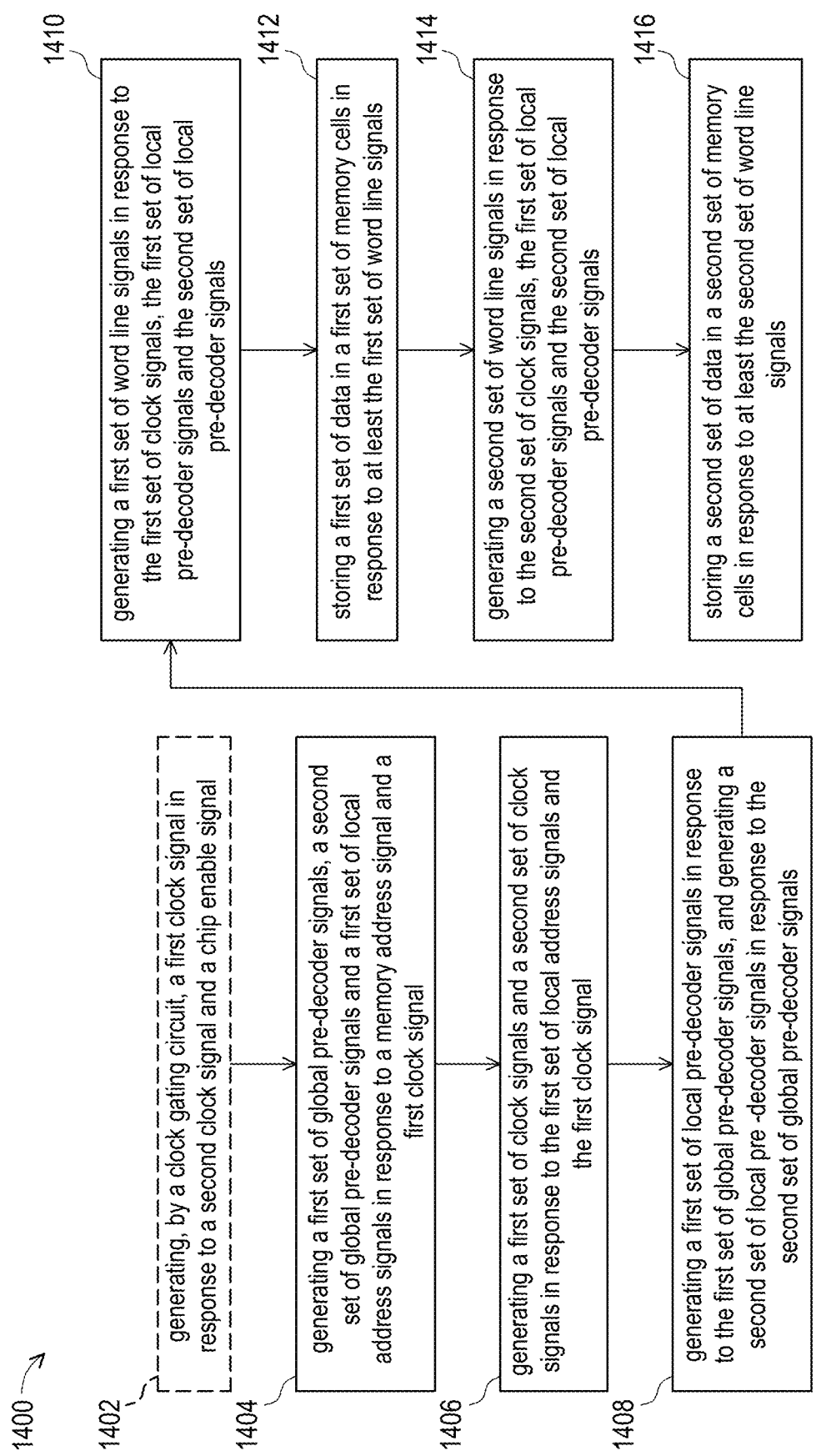
FIG. 14 is a flowchart of a method of operating a circuit, in accordance with some embodiments.

FIG. 14 is a flowchart of a method 1400 of operating a circuit, in accordance with some embodiments.

In some embodiments, FIG. 14 is a flowchart of a method of operating at least one of memory circuit 100 of FIG. 1, memory circuit 200 of FIGS. 2A-2B, circuit 300, 400 500, 600, 700 or 800 of corresponding FIGS. 3-8, pre-decoder circuit 900A-900B of corresponding FIGS. 9A-9B, address latch circuit 1000 of FIG. 10, clock pre-decoder circuit 1100 of FIG. 11, set of word line post-decoder circuits 1200 of FIG. 12 or memory cell 1300 of FIG. 13.

It is understood that additional operations may be performed before, during, and/or after the method 1400 depicted in FIG. 14, and that some other operations may only be briefly described herein. It is understood that method 1400 utilizes features of one or more of memory circuit 100-200, circuit 300-800, pre-decoder circuit 900A-900B, address latch circuit 1000, clock pre-decoder circuit 1100, set of word line post-decoder circuits 1200 or memory cell 1300, and similar detailed description is omitted for brevity.

In some embodiments, other order of operations of method 1400 is within the scope of the present disclosure. Method 1400 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1400 is not performed.

In operation 1402 of method 1400, a first clock signal is generated by a clock gating circuit 202 in response to a second clock signal (CLK) and a chip enable signal (CE).

In some embodiments, the first clock signal of method 1400 includes clock signal ICLK. In some embodiments, the second clock signal of method 1400 includes clock signal CLK. In some embodiments, the chip enable signal of method 1400 includes chip enable signal CEB.

In operation 1404 of method 1400, a first set of global pre-decoder signals, a second set of global pre-decoder signals and a first set of local address signals are generated in response to a memory address signal and the first clock signal. In some embodiments, the first set of global pre-decoder signals, a second set of global pre-decoder signals and the first set of local address signals are generated by a global control circuit 201.

In some embodiments, the first set of global pre-decoder signals of method 1400 includes the set of global pre-decoder signals PREDEC1_GLOBAL. In some embodiments, the second set of global pre-decoder signals of method 1400 includes the set of global pre-decoder signals PREDEC2_GLOBAL. In some embodiments, the first set of local address signals of method 1400 includes the first set of address signals LADR[0:4]. In some embodiments, the memory address signal of method 1400 includes memory address signal ADR.

In operation 1406 of method 1400, a first set of clock signals and a second set of clock signals are generated in response to the first set of local address signals and the first clock signal. In some embodiments, the first set of clock signals and a second set of clock signals of method 1400 are generated by a first clock pre-decoder circuit. In some embodiments, the first clock pre-decoder circuit is coupled to the global control circuit. In some embodiments, the first clock pre-decoder circuit of method 1400 includes at least one of clock pre-decoder circuit 220a, 220b, 220c or 220d of the set of clock pre-decoder circuits 220 or clock pre-decoder circuit 1100.

In some embodiments, the first set of clock signals of method 1400 includes the set of clock signals ICKD_TOP. In some embodiments, the second set of clock signals of method 1400 includes the set of clock signals ICKD_BOT.

In operation 1408 of method 1400, a first set of local pre-decoder signals is generated in response to the first set of global pre-decoder signals, and a second set of local pre-decoder signals is generated in response to the second set of global pre-decoder signals.

In some embodiments, the first set of local pre-decoder signals of method 1400 includes the set of local pre-decoder signals PREDEC1_LOCAL[0:7]. In some embodiments, the second set of local pre-decoder signals of method 1400 includes the set of local pre-decoder signals PREDEC2_LOCAL[0:7].

In some embodiments, the first set of local pre-decoder signals and the second set of local pre-decoder signals of method 1400 are generated by a first set of repeater circuits (e.g., at least one of set of repeaters 230*a*, 230*b*, 230*c* or 230*d*). In some embodiments, the first set of local pre-decoder signals of method 1400 is generated by at least one of the set of inverters 330, 430, 440, 442, 450, 452, 540, 550 or 630. In some embodiments, the second set of local pre-decoder signals of method 1400 is generated by at least one of the set of inverters 332, 432, 444, 446, 454, 456, 542, 552 or 630.

In operation 1410 of method 1400, a first set of word line signals is generated in response to the first set of clock signals, the first set of local pre-decoder signals and the second set of local pre-decoder signals.

In some embodiments, the first set of word line signals of method 1400 is generated by a first set of word line post-decoder circuits. In some embodiments, the first set of word line post-decoder circuits is coupled to the first clock pre-decoder circuit and the first set of repeater circuits.

In some embodiments, the first set of word line post-decoder circuits of method 1400 includes at least one of the set of word line post-decoder circuits 240*a*, 242*a*, 244*a* or 246*a* or the set of word line post-decoder circuits 1200. In some embodiments, the first set of word line signals of method 1400 includes set of word lines WL.

In operation 1412 of method 1400, a first set of data is stored in a first set of memory cells in response to at least the first set of word line signals. In some embodiments, the first set of memory cells of method 1400 includes memory cell array 210*a*. In some embodiments, the first set of memory cells is coupled to the first set of word line decoder circuits. In some embodiments, the first set of data of method 1400 includes a series of data including at least one of a logical low or a logical high.

In operation 1414 of method 1400, a second set of word line signals (WL2) is generated in response to the second set of clock signals, the first set of local pre-decoder signals and the second set of local pre-decoder signals.

In some embodiments, the second set of word line signals of method 1400 is generated by a second set of word line post-decoder circuits. In some embodiments, the second set of word line post-decoder circuits is coupled to the first clock pre-decoder circuit and the first set of repeater circuits.

In some embodiments, the second set of word line post-decoder circuits of method 1400 includes at least one of the set of word line post-decoder circuits 240*b*, 242*b*, 244*b* or 246*b* or the set of word line post-decoder circuits 1200. In some embodiments, the second set of word line signals of method 1400 includes set of word lines WL.

In operation 1416 of method 1400, a second set of data is stored in a second set of memory cells in response to at least the second set of word line signals. In some embodiments, the second set of memory cells of method 1400 includes memory cell array 210*b*. In some embodiments, the second set of memory cells is coupled to the second set of word line decoder circuits. In some embodiments, the second set of data of method 1400 includes another series of data including at least one of a logical low or a logical high.

By operating method 1400, the circuit operates to achieve the benefits discussed above with respect to at least one of memory circuit 100 of FIG. 1, memory circuit 200 of FIGS. 2A-2B, circuit 300, 400 500, 600, 700 or 800 of corresponding FIGS. 3-8, pre-decoder circuit 900A-900B of corresponding FIGS. 9A-9B, address latch circuit 1000 of FIG. 10, clock pre-decoder circuit 1100 of FIG. 11, set of word line post-decoder circuits 1200 of FIG. 12 or memory cell 1300 of FIG. 13.

In some embodiments, one or more of the operations of method 1400 is not performed. Furthermore, various PMOS or NMOS transistors shown in FIGS. 10 and 13 are of a particular dopant type (e.g., N-type or P-type) are for illustration purposes. Embodiments of the disclosure are not limited to a particular transistor type, and one or more of the PMOS or NMOS transistors shown in FIGS. 10 and 13 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 3-12 is within the scope of various embodiments. Selecting different numbers of transistors in FIGS. 10 and 13 is within the scope of various embodiments. Selecting different numbers of AND logic gates in FIG. 3-12 is within the scope of various embodiments. Selecting different types of logic gates in FIG. 3-12 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a global control circuit configured to generate a first set of global pre-decoder signals, a second set of global pre-decoder signals and a first set of local address signals in response to a memory address signal and a first clock signal. In some embodiments, the memory circuit further includes a first local control circuit coupled to the global control circuit. In some embodiments, the first local control circuit includes a first set of repeater circuits configured to generate a first set of local pre-decoder signals in response to the first set of global pre-decoder signals, and to generate a second set of local pre-decoder signals in response to the second set of global pre-decoder signals. In some embodiments, the first local control circuit further includes a first clock pre-decoder circuit coupled to the global control circuit, and configured to generate a first set of clock signals and a second set of clock signals in response to the first set of local address signals and the first clock signal. In some embodiments, the memory circuit further includes a first set of word line post-decoder circuits coupled to the first clock pre-decoder circuit and the first set of repeater circuits, and configured to generate a first set of word line signals in response to the first set of clock signals, the first set of local pre-decoder signals and the second set of local pre-decoder signals. In some embodiments, the memory circuit further includes a first set of memory cells coupled to the first set of word line post-decoder circuits, and configured to store a first set of data in response to at least the first set of word line signals. In some embodiments, the memory circuit further includes a second set of word line post-decoder circuits coupled to the first clock pre-decoder circuit and the first set of repeater circuits, and configured to generate a second set of word line signals in response to the first set of clock signals, the first set of local pre-decoder signals and the second set of local pre-decoder signals. In some embodiments, the memory circuit further includes a second set of memory cells coupled to the second set of word line post-decoder circuits, and configured to store a second set of data in response to at least the second set of word line signals. In some embodiments, the memory circuit further includes a first word line driver circuit including the first set of word line post-decoder circuits; and a second set of repeater circuits coupled between an output of the first set of repeater circuits and the first set of word line post-decoder circuits. In some embodiments, the memory circuit further includes a second word line driver circuit including the second set of word line post-decoder circuits; and a third set of repeater circuits coupled between the output of the first set of repeater circuits and the second set of word line post-decoder circuits. In some embodiments, the first set of repeater circuits includes a first set of buffers, each buffer of the first set of buffers is configured to generate a corresponding signal of the first set of local pre-decoder signals in response to a corresponding signal of the first set of global pre-decoder signals; and a second set of buffers, each buffer of the second set of buffers is configured to generate a corresponding signal of the second set of local pre-decoder signals in response to a corresponding signal of the second set of global pre-decoder signals. In some embodiments, the first set of repeater circuits includes a first set of inverters, each inverter of the first set of inverters is configured to generate a corresponding signal of the first set of local pre-decoder signals in response to a corresponding signal of the first set of global pre-decoder signals; and a second set of inverters, each inverter of the second set of inverters is configured to generate a corresponding signal of the second set of local pre-decoder signals in response to a corresponding signal of the second set of global pre-decoder signals. In some embodiments, the memory circuit further includes a first global pre-decoder line extending in at least a first direction, overlapping at least the first local control circuit, being coupled to the global control circuit and the first set of repeater circuits, and being configured to supply the first set of global pre-decoder signals; a second global pre-decoder line extending in at least the first direction, overlapping at least the first local control circuit, being coupled to the global control circuit and the first set of repeater circuits, and being configured to supply the second set of global pre-decoder signals; a first local pre-decoder line extending in at least the first direction, overlapping at least the first local control circuit, being coupled to the first set of repeater circuits, and being configured to supply the first set of local pre-decoder signals, and a second local pre-decoder line extending in at least the first direction, overlapping at least the first local control circuit, being coupled to the first set of repeater circuits, and being configured to supply the second set of local pre-decoder signals. In some embodiments, the first global pre-decoder line is located on a first metal layer, the second global pre-decoder line is located on the first metal layer, the first local pre-decoder line is located on a second metal layer different from the first metal layer, and the second local pre-decoder line is located on the second metal layer. In some embodiments, the first metal layer corresponds to a metal two layer, and the second metal layer corresponds to a metal four layer. In some embodiments, the first global pre-decoder line has a first width in a second direction different from the first direction, the second global pre-decoder line has the first width in the second direction, the first local pre-decoder line has a second width in the second direction, the second width being less than the first width, and the second local pre-decoder line has the second width in the second direction.

Another aspect of this description relates to a memory circuit. The memory circuit includes a global control circuit configured to generate a first set of global pre-decoder signals, a second set of global pre-decoder signals and a first set of local address signals in response to a memory address signal and a first clock signal. In some embodiments, the memory circuit further includes a first local control circuit coupled to the global control circuit. In some embodiments, the first local control circuit includes a first clock pre-decoder circuit coupled to the global control circuit, and configured to generate a first set of clock signals and a second set of clock signals in response to the first set of local address signals and the first clock signal. In some embodiments, the memory circuit further includes a first word line driver circuit. In some embodiments, the first word line driver circuit includes a first set of repeater circuits configured to generate a first set of local pre-decoder signals in response to the first set of global pre-decoder signals, and to generate a second set of local pre-decoder signals in response to the second set of global pre-decoder signals. In some embodiments, the a first word line driver circuit further includes a first set of word line post-decoder circuits coupled to the first clock pre-decoder circuit and the first set of repeater circuits, and configured to generate a first set of word line signals in response to the first set of clock signals, the first set of local pre-decoder signals and the second set of local pre-decoder signals. In some embodiments, the memory circuit further includes a first set of memory cells coupled to the first set of word line post-decoder circuits, and configured to store a first set of data in response to at least the first set of word line signals. In some embodiments, the memory circuit further includes a second word line driver circuit that includes a second set of repeater circuits configured to generate the first set of local pre-decoder signals in response to the first set of global pre-decoder signals, and to generate the second set of local pre-decoder signals in response to the second set of global pre-decoder signals; and a second set of word line post-decoder circuits coupled to the first clock pre-decoder circuit and the second set of repeater circuits, and configured to generate a second set of word line signals in response to the second set of clock signals, the first set of local pre-decoder signals and the second set of local pre-decoder signals. In some embodiments, the memory circuit further includes a second set of memory cells coupled to the second set of word line post-decoder circuits, and configured to store a second set of data in response to at least the second set of word line signals. In some embodiments, at least one of the first set of repeater circuits or the second set of repeater circuits includes a first set of buffers, each buffer of the first set of buffers is configured to generate a corresponding signal of the first set of local pre-decoder signals in response to a corresponding signal of the first set of global pre-decoder signals; and a second set of buffers, each buffer of the second set of buffers is configured to generate a corresponding signal of the second set of local pre-decoder signals in response to a corresponding signal of the second set of global pre-decoder signals. In some embodiments, at least one of the first set of repeater circuits or the second set of repeater circuits includes a first set of inverters, each inverter of the first set of inverters is configured to generate a corresponding signal of the first set of local pre-decoder signals in response to a corresponding signal of the first set of global pre-decoder signals; and a second set of inverters, each inverter of the second set of inverters is configured to generate a corresponding signal of the second set of local pre-decoder signals in response to a corresponding signal of the second set of global pre-decoder signals. In some embodiments, the global control circuit includes a clock gating circuit configured to generate the first clock signal in response to a second clock signal and a chip enable signal; an address latch circuit configured to generate the first set of local address signals, a second set of local address signals, and a third set of local address signals in response to the memory address signal; a first pre-decoder circuit coupled to the address latch circuit, and configured to generate the first set of global pre-decoder signals in response to at least the second set of local address signals or an inverted second set of local address signals; and a second pre-decoder circuit coupled to the address latch circuit, and configured to generate the second set of global pre-decoder signals in response to at least the third set of local address signals or an inverted third set of local address signals. In some embodiments, the first clock pre-decoder circuit includes a first set of AND logic gates configured to generate a first set of signals in response to the first set of local address signals and an inverted first set of local address signals; a second set of AND logic gates configured to generate a second set of signals in response to the first set of local address signals and the inverted first set of local address signals; a third set of AND logic gates configured to generate a first set of bank select signals in response to the first set of local address signals and the inverted first set of local address signals; a fourth set of AND logic gates coupled to the first set of AND logic gates and the third set of AND logic gates, and configured to generate the first set of clock signals in response to the first set of signals and the first set of bank select signals; and a fifth set of AND logic gates coupled to the second set of AND logic gates and the third set of AND logic gates, and configured to generate the second set of clock signals in response to the second set of signals and the first set of bank select signals. In some embodiments, each word line post-decoder circuit of the first set of word line post-decoder circuits includes a first set of AND logic gates configured to generate a first set of signals in response to the first set of local pre-decoder signals, one local pre-decoder signal of the second set of local pre-decoder signals and one of the first set of clock signals or the second set of clock signals; and a first set of inverters coupled to the first set of AND logic gates, and configured to generate the first set of word line signals in response to the first set of signals, the first set of signals being inverted from the first set of word line signals.

Still another aspect of this description relates to a method of operating a memory circuit. The method includes generating, by a global control circuit, a first set of global pre-decoder signals, a second set of global pre-decoder signals and a first set of local address signals in response to a memory address signal and a first clock signal. In some embodiments, the method further includes generating, by a first clock pre-decoder circuit, a first set of clock signals and a second set of clock signals in response to the first set of local address signals and the first clock signal, the first clock pre-decoder circuit being coupled to the global control circuit. In some embodiments, the method further includes generating, by a first set of repeater circuits, a first set of local pre-decoder signals in response to the first set of global pre-decoder signals, and generating a second set of local pre-decoder signals in response to the second set of global pre-decoder signals. In some embodiments, the method further includes generating, by a first set of word line post-decoder circuits, a first set of word line signals in response to the first set of clock signals, the first set of local pre-decoder signals and the second set of local pre-decoder signals, the first set of word line post-decoder circuits being coupled to the first clock pre-decoder circuit and the first set of repeater circuits. In some embodiments, the method further includes storing a first set of data in a first set of memory cells in response to at least the first set of word line signals, the first set of memory cells being coupled to the first set of word line post-decoder circuits. In some embodiments, the method further includes generating, by a second set of word line post-decoder circuits, a second set of word line signals in response to the second set of clock signals, the first set of local pre-decoder signals and the second set of local pre-decoder signals, the second set of word line post-decoder circuits being coupled to the first clock pre-decoder circuit and the first set of repeater circuits; and storing a second set of data in a second set of memory cells in response to at least the second set of word line signals, the second set of memory cells being coupled to the second set of word line post-decoder circuits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a global control circuit configured to generate a first set of global pre-decoder signals, a second set of global pre-decoder signals and a first set of local address signals in response to a memory address signal and a first clock signal;
a first local control circuit coupled to the global control circuit, the first local control circuit comprising:
a first set of repeater circuits configured to generate a first set of local pre-decoder signals in response to the first set of global pre-decoder signals, and to generate a second set of local pre-decoder signals in response to the second set of global pre-decoder signals; and
a first clock pre-decoder circuit coupled to the global control circuit, and configured to generate a first set of clock signals and a second set of clock signals in response to the first set of local address signals and the first clock signal; and
a first set of word line post-decoder circuits coupled to the first clock pre-decoder circuit and the first set of repeater circuits, and configured to generate a first set of word line signals in response to the first set of clock signals, the first set of local pre-decoder signals and the second set of local pre-decoder signals; and
a first set of memory cells coupled to the first set of word line post-decoder circuits, and configured to store a first set of data in response to at least the first set of word line signals.

2. The memory circuit of claim 1, further comprising:
a second set of word line post-decoder circuits coupled to the first clock pre-decoder circuit and the first set of repeater circuits, and configured to generate a second set of word line signals in response to the first set of clock signals, the first set of local pre-decoder signals and the second set of local pre-decoder signals.

3. The memory circuit of claim 2, further comprising:
a second set of memory cells coupled to the second set of word line post-decoder circuits, and configured to store a second set of data in response to at least the second set of word line signals.

4. The memory circuit of claim 3, further comprising:
a first word line driver circuit comprising:
the first set of word line post-decoder circuits; and
a second set of repeater circuits coupled between an output of the first set of repeater circuits and the first set of word line post-decoder circuits; and
a second word line driver circuit comprising:
the second set of word line post-decoder circuits; and
a third set of repeater circuits coupled between the output of the first set of repeater circuits and the second set of word line post-decoder circuits.

5. The memory circuit of claim 1, wherein the first set of repeater circuits comprises:
a first set of buffers, each buffer of the first set of buffers is configured to generate a corresponding signal of the first set of local pre-decoder signals in response to a corresponding signal of the first set of global pre-decoder signals; and
a second set of buffers, each buffer of the second set of buffers is configured to generate a corresponding signal of the second set of local pre-decoder signals in response to a corresponding signal of the second set of global pre-decoder signals.

6. The memory circuit of claim 1, wherein the first set of repeater circuits comprises:
a first set of inverters, each inverter of the first set of inverters is configured to generate a corresponding signal of the first set of local pre-decoder signals in response to a corresponding signal of the first set of global pre-decoder signals; and
a second set of inverters, each inverter of the second set of inverters is configured to generate a corresponding signal of the second set of local pre-decoder signals in response to a corresponding signal of the second set of global pre-decoder signals.

7. The memory circuit of claim 1, further comprising:
a first global pre-decoder line extending in at least a first direction, overlapping at least the first local control circuit, being coupled to the global control circuit and the first set of repeater circuits, and being configured to supply the first set of global pre-decoder signals;
a second global pre-decoder line extending in at least the first direction, overlapping at least the first local control circuit, being coupled to the global control circuit and the first set of repeater circuits, and being configured to supply the second set of global pre-decoder signals;
a first local pre-decoder line extending in at least the first direction, overlapping at least the first local control circuit, being coupled to the first set of repeater circuits, and being configured to supply the first set of local pre-decoder signals; and
a second local pre-decoder line extending in at least the first direction, overlapping at least the first local control circuit, being coupled to the first set of repeater circuits, and being configured to supply the second set of local pre-decoder signals.

8. The memory circuit of claim 7, wherein
the first global pre-decoder line is located on a first metal layer;
the second global pre-decoder line is located on the first metal layer;
the first local pre-decoder line is located on a second metal layer different from the first metal layer; and
the second local pre-decoder line is located on the second metal layer.

9. The memory circuit of claim 8, wherein
the first metal layer corresponds to a metal two layer; and
the second metal layer corresponds to a metal four layer.

10. The memory circuit of claim 7, wherein
the first global pre-decoder line has a first width in a second direction different from the first direction;
the second global pre-decoder line has the first width in the second direction;
the first local pre-decoder line has a second width in the second direction, the second width being less than the first width; and
the second local pre-decoder line has the second width in the second direction.

11. A memory circuit comprising:
a global control circuit configured to generate a first set of global pre-decoder signals, a second set of global pre-decoder signals and a first set of local address signals in response to a memory address signal and a first clock signal;
a first local control circuit coupled to the global control circuit, the first local control circuit comprising:
a first clock pre-decoder circuit coupled to the global control circuit, and configured to generate a first set of clock signals and a second set of clock signals in response to the first set of local address signals and the first clock signal; and
a first word line driver circuit comprising:
a first set of repeater circuits configured to generate a first set of local pre-decoder signals in response to the first set of global pre-decoder signals, and to generate a second set of local pre-decoder signals in response to the second set of global pre-decoder signals; and
a first set of word line post-decoder circuits coupled to the first clock pre-decoder circuit and the first set of repeater circuits, and configured to generate a first set of word line signals in response to the first set of clock signals, the first set of local pre-decoder signals and the second set of local pre-decoder signals; and
a first set of memory cells coupled to the first set of word line post-decoder circuits, and configured to store a first set of data in response to at least the first set of word line signals.

12. The memory circuit of claim 11, further comprising:
a second word line driver circuit comprising:
a second set of repeater circuits configured to generate the first set of local pre-decoder signals in response to the first set of global pre-decoder signals, and to generate the second set of local pre-decoder signals in response to the second set of global pre-decoder signals; and
a second set of word line post-decoder circuits coupled to the first clock pre-decoder circuit and the second set of repeater circuits, and configured to generate a second set of word line signals in response to the second set of clock signals, the first set of local pre-decoder signals and the second set of local pre-decoder signals.

13. The memory circuit of claim 12, further comprising:
a second set of memory cells coupled to the second set of word line post-decoder circuits, and configured to store a second set of data in response to at least the second set of word line signals.

14. The memory circuit of claim 12, wherein at least one of the first set of repeater circuits or the second set of repeater circuits comprises:
a first set of buffers, each buffer of the first set of buffers is configured to generate a corresponding signal of the first set of local pre-decoder signals in response to a corresponding signal of the first set of global pre-decoder signals; and
a second set of buffers, each buffer of the second set of buffers is configured to generate a corresponding signal of the second set of local pre-decoder signals in response to a corresponding signal of the second set of global pre-decoder signals.

15. The memory circuit of claim 12, wherein at least one of the first set of repeater circuits or the second set of repeater circuits comprises:
a first set of inverters, each inverter of the first set of inverters is configured to generate a corresponding signal of the first set of local pre-decoder signals in response to a corresponding signal of the first set of global pre-decoder signals; and
a second set of inverters, each inverter of the second set of inverters is configured to generate a corresponding signal of the second set of local pre-decoder signals in response to a corresponding signal of the second set of global pre-decoder signals.

16. The memory circuit of claim 11, wherein the global control circuit comprises:
a clock gating circuit configured to generate the first clock signal in response to a second clock signal and a chip enable signal;
an address latch circuit configured to generate the first set of local address signals, a second set of local address signals, and a third set of local address signals in response to the memory address signal;
a first pre-decoder circuit coupled to the address latch circuit, and configured to generate the first set of global pre-decoder signals in response to at least the second set of local address signals or an inverted second set of local address signals; and
a second pre-decoder circuit coupled to the address latch circuit, and configured to generate the second set of global pre-decoder signals in response to at least the third set of local address signals or an inverted third set of local address signals.

17. The memory circuit of claim 16, wherein the first clock pre-decoder circuit comprises:
a first set of AND logic gates configured to generate a first set of signals in response to the first set of local address signals and an inverted first set of local address signals;
a second set of AND logic gates configured to generate a second set of signals in response to the first set of local address signals and the inverted first set of local address signals;
a third set of AND logic gates configured to generate a first set of bank select signals in response to the first set of local address signals and the inverted first set of local address signals;
a fourth set of AND logic gates coupled to the first set of AND logic gates and the third set of AND logic gates, and configured to generate the first set of clock signals in response to the first set of signals and the first set of bank select signals; and
a fifth set of AND logic gates coupled to the second set of AND logic gates and the third set of AND logic gates, and configured to generate the second set of clock signals in response to the second set of signals and the first set of bank select signals.

18. The memory circuit of claim 16, wherein each word line post-decoder circuit of the first set of word line post-decoder circuits comprises:
a first set of AND logic gates configured to generate a first set of signals in response to the first set of local pre-decoder signals, one local pre-decoder signal of the second set of local pre-decoder signals and one of the first set of clock signals or the second set of clock signals; and
a first set of inverters coupled to the first set of AND logic gates, and configured to generate the first set of word line signals in response to the first set of signals, the first set of signals being inverted from the first set of word line signals.

19. A method of operating a memory circuit, the method comprising:
generating, by a global control circuit, a first set of global pre-decoder signals, a second set of global pre-decoder signals and a first set of local address signals in response to a memory address signal and a first clock signal;
generating, by a first clock pre-decoder circuit, a first set of clock signals and a second set of clock signals in response to the first set of local address signals and the first clock signal, the first clock pre-decoder circuit being coupled to the global control circuit;
generating, by a first set of repeater circuits, a first set of local pre-decoder signals in response to the first set of global pre-decoder signals, and generating a second set of local pre-decoder signals in response to the second set of global pre-decoder signals;
generating, by a first set of word line post-decoder circuits, a first set of word line signals in response to the first set of clock signals, the first set of local pre-decoder signals and the second set of local pre-decoder signals, the first set of word line post-decoder circuits being coupled to the first clock pre-decoder circuit and the first set of repeater circuits; and
storing a first set of data in a first set of memory cells in response to at least the first set of word line signals, the first set of memory cells being coupled to the first set of word line post-decoder circuits.

20. The method of claim 19, further comprising:
generating, by a second set of word line post-decoder circuits, a second set of word line signals in response to the second set of clock signals, the first set of local pre-decoder signals and the second set of local pre-decoder signals, the second set of word line post-decoder circuits being coupled to the first clock pre-decoder circuit and the first set of repeater circuits; and
storing a second set of data in a second set of memory cells in response to at least the second set of word line signals, the second set of memory cells being coupled to the second set of word line post-decoder circuits.

* * * * *